(12) United States Patent
Kim et al.

(10) Patent No.: US 9,905,778 B2
(45) Date of Patent: Feb. 27, 2018

(54) ORGANIC LIGHT EMITTING DEVICE

(71) Applicant: SAMSUNG DISPLAY CO., LTD., Yongin, Gyeonggi-do (KR)

(72) Inventors: Myeongsuk Kim, Yongin (KR); Taekyung Kim, Yongin (KR); Jaeyong Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 313 days.

(21) Appl. No.: 14/706,218

(22) Filed: May 7, 2015

(65) Prior Publication Data
US 2016/0087225 A1    Mar. 24, 2016

(30) Foreign Application Priority Data
Sep. 18, 2014    (KR) .................. 10-2014-0124627

(51) Int. Cl.
*H01L 51/00*    (2006.01)
*H01L 51/50*    (2006.01)

(52) U.S. Cl.
CPC ...... *H01L 51/0072* (2013.01); *H01L 51/0067* (2013.01); *H01L 51/506* (2013.01); *H01L 51/006* (2013.01); *H01L 51/0052* (2013.01); *H01L 51/0058* (2013.01); *H01L 51/0061* (2013.01); *H01L 2251/308* (2013.01)

(58) Field of Classification Search
CPC ............ H01L 51/006; H01L 51/0052; H01L 51/0061; H01L 51/0072; H01L 51/0067; H01L 51/0058; H01L 51/308; H01L 51/506; H01L 51/0073; H01L 51/0054; H01L 51/5012
See application file for complete search history.

(56) References Cited

U.S. PATENT DOCUMENTS

| | | | |
|---|---|---|---|
| 8,367,850 B2 | 2/2013 | Ma et al. | |
| 8,847,218 B2 * | 9/2014 | Nishimura | C09B 57/00 257/40 |
| 2011/0001130 A1 | 1/2011 | Nishimura et al. | |
| 2011/0037062 A1 | 2/2011 | Fukumatsu et al. | |
| 2011/0260138 A1 | 10/2011 | Xia et al. | |
| 2012/0001158 A1 | 1/2012 | Asari et al. | |
| 2012/0138915 A1 | 6/2012 | Nishimura et al. | |
| 2012/0305903 A1 | 12/2012 | Kai et al. | |
| 2013/0112952 A1 | 5/2013 | Adamovich et al. | |

FOREIGN PATENT DOCUMENTS

| | | | |
|---|---|---|---|
| KR | 10-2010-0093085 A | 8/2010 | |
| KR | 10-2011-0007124 A | 1/2011 | |
| KR | 10-2011-0134885 A | 12/2011 | |
| KR | 10-2012-0057611 A | 6/2012 | |
| KR | 10-2012-0125368 A | 11/2012 | |
| KR | 10-2013-0073023 A | 7/2013 | |
| KR | 10-2013-0094222 A | 8/2013 | |
| KR | 10-2013-0100236 A | 9/2013 | |
| WO | WO 2011-162162 A1 | 12/2011 | |
| WO | WO-2012099241 A1 * | 7/2012 | ............ C09B 57/00 |

* cited by examiner

Primary Examiner — Christopher M Rodd
(74) Attorney, Agent, or Firm — Lee & Morse, P.C.

(57) ABSTRACT

An organic light-emitting device, including a first electrode; a second electrode facing the first electrode; an emission layer between the first electrode and the second electrode; a hole transport region between the first electrode and the emission layer; and an electron transport region between the second electrode and the emission layer, the hole transport region including a compound represented by Formula 1 below and a compound represented by Formula 2 below:

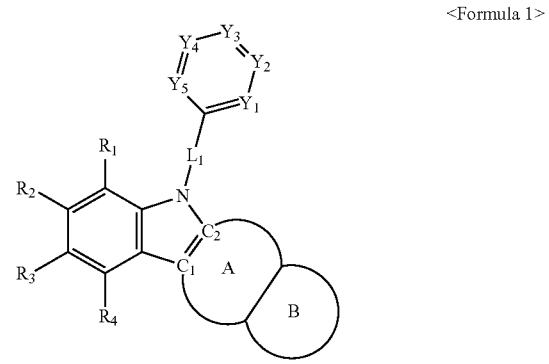

<Formula 1>

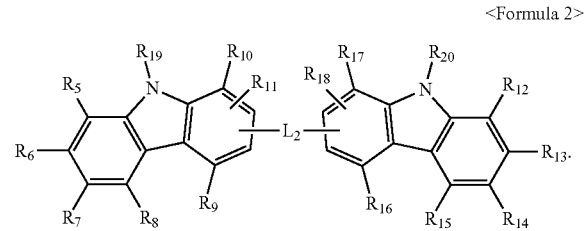

<Formula 2>

20 Claims, 1 Drawing Sheet

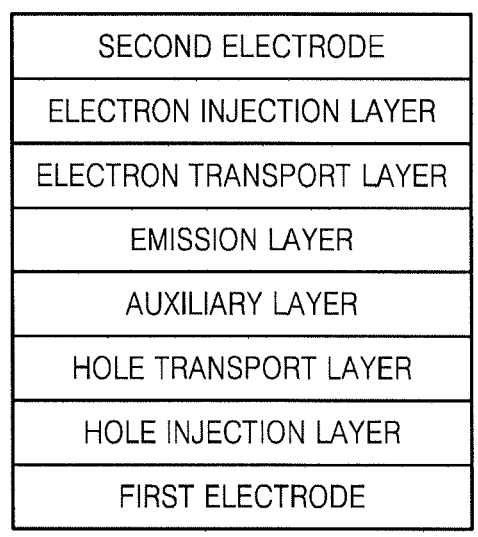

ORGANIC LIGHT EMITTING DEVICE

CROSS-REFERENCE TO RELATED APPLICATION

Korean Patent Application No. 10-2014-0124627, filed on Sep. 18, 2014, in the Korean Intellectual Property Office, and entitled: "Organic Light Emitting Device," is incorporated by reference herein in its entirety.

BACKGROUND

1. Field

One or more exemplary embodiments relate to an organic light-emitting device, and for example, to an organic light-emitting device including a hole transport region.

2. Description of the Related Art

Organic light-emitting devices are self-light emitting devices that may emit light when a voltage is applied to the device. Organic light-emitting devices may provide high luminance, high contrast, multi-color reproduction, a large viewing angle, quick response rate, and low driving voltage.

SUMMARY

Embodiments may be realized by providing an organic light-emitting device, including a first electrode; a second electrode facing the first electrode; an emission layer between the first electrode and the second electrode; a hole transport region between the first electrode and the emission layer; and an electron transport region between the second electrode and the emission layer, the hole transport region including a compound represented by Formula 1 below and a compound represented by Formula 2 below:

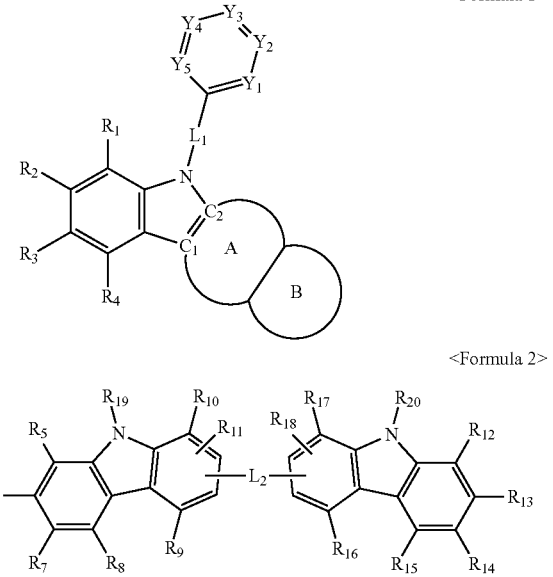

<Formula 1>

<Formula 2> wherein in Formula 1, $Y_1$ to $Y_5$ are each independently a nitrogen (N) atom or $-CR_{21}$, and each $R_{21}$ is the same or different from each other;

$C_1$ and $C_2$ are each a carbon (C) atom;

Ring A is an aromatic ring represented by Formula 1a below, and Ring B is an aromatic ring represented by Formula 1b below and condensed with Ring A;

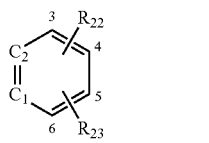

<Formula 1a>

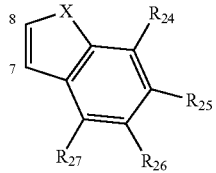

<Formula 1b> wherein the bond between 7 and 8 in Ring B represented by Formula 1b is condensed with the bond between 3 and 4, the bond between 4 and 5, or the bond between 5 and 6 in Ring A represented by Formula 1a, X in Formula 1b is selected from $-CR_{28}R_{29}$, $-NR_{30}$, and an $-O-$ atom, wherein in Formula 1, Formula 2, Formula 1a, and Formula 1b, $L_1$ and $L_2$ are each independently selected from a direct bond, a $C_6$-$C_{40}$ arylene group, and a $C_2$-$C_{40}$ heteroarylene group; and a $C_6$-$C_{40}$ arylene group and a $C_2$-$C_{40}$ heteroarylene group, each substituted with one or more of a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

$R_1$ to $R_{30}$ are each independently selected from a hydrogen, a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, and a $C_6$-$C_{40}$ arylthio group;

a $C_1$-$C_{40}$ alkyl group, a $C_2$-$C_{40}$ alkenyl group, a $C_2$-$C_{40}$ alkynyl group, and a $C_1$-$C_{40}$ alkoxy group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, and $C_6$-$C_{40}$ arylthio group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group, wherein respective portions of $R_1$ to $R_4$ may be bound to one other so as to be condensed to the ring to which the substituents $R_1$ to $R_4$ are attached.

Embodiments may be realized by providing an organic light-emitting device, including a first electrode; a second electrode facing the first electrode; an emission layer between the first electrode and the second electrode; a hole transport region that is between the first electrode and the emission layer and includes one or more of a hole injection layer or a hole transport layer, and includes an auxiliary layer; and an electron transport region that is between the second electrode and the emission layer, and includes one or more of an electron transport layer or an electron injection layer; the auxiliary layer including a compound represented by one of Formulae 1-1 to 1-11 below and a compound represented by Formula 2-1 below:

<Formula 1-1>

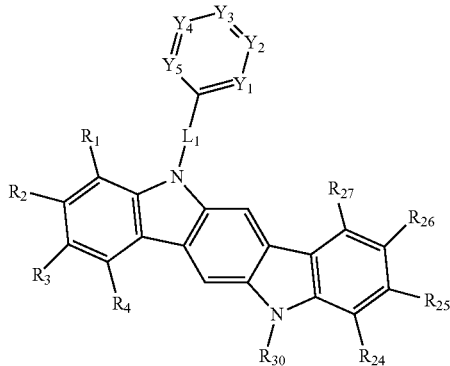

<Formula 1-2>

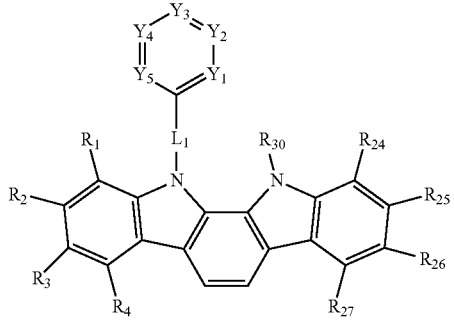

<Formula 1-3>

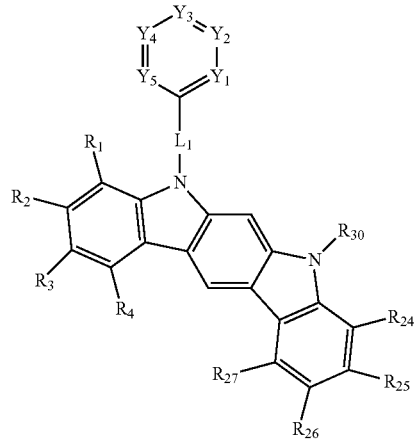

<Formula 1-4>

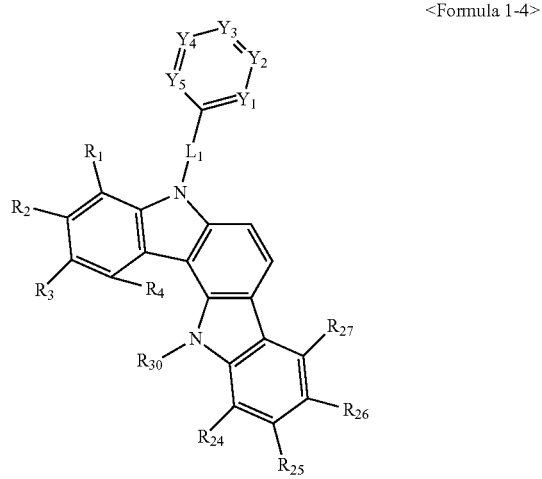

<Formula 1-5>

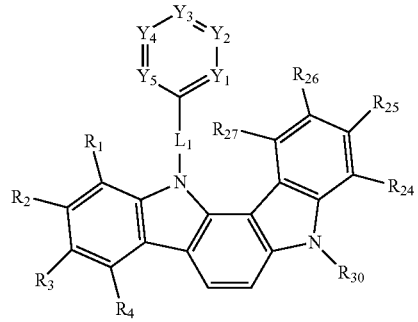

<Formula 1-6>

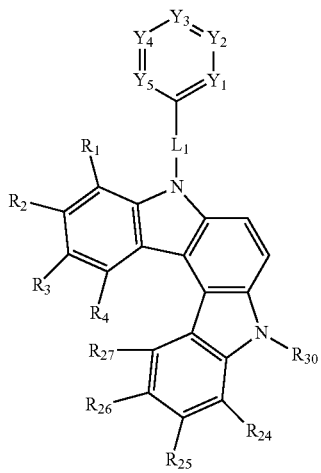

<Formula 1-7>

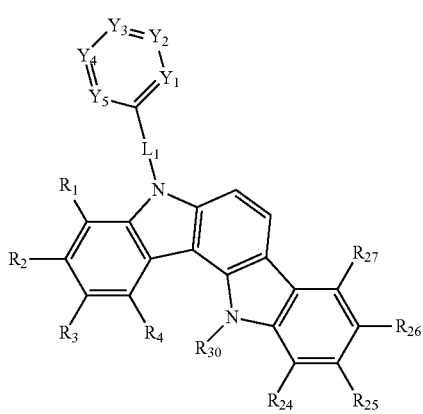

<Formula 1-8>

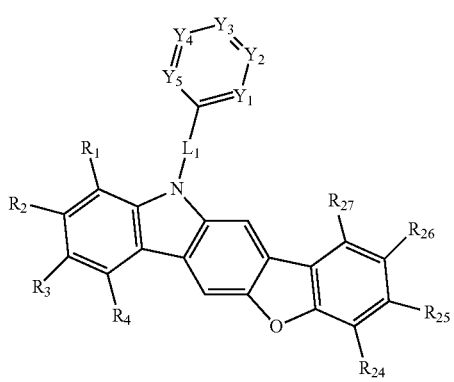

<Formula 1-9>

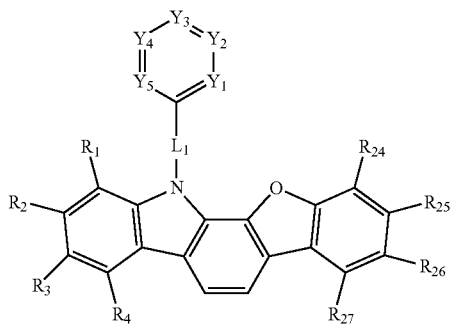

<Formula 1-10>

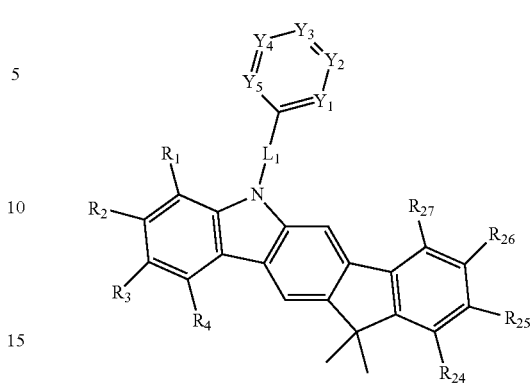

<Formula 1-11>

<Formula 2-1> wherein in Formulae 1-1 to 1-11 and 2-1, $Y_1$ to $Y_5$ are each independently a nitrogen (N) atom or —$CR_{21}$, and each $R_{21}$ is the same or different from each other;

$L_1$ and $L_2$ are selected from a direct bond and a $C_6$-$C_{40}$ arylene group;

$R_1$ to $R_{10}$, $R_{12}$ to $R_{17}$, $R_{19}$ to $R_{21}$, $R_{24}$ to $R_{27}$, and $R_{30}$ are each independently selected from a hydrogen, a $C_6$-$C_{40}$ aryl group, and a $C_2$-$C_{40}$ heteroaryl group; and a $C_6$-$C_{40}$ aryl group and a $C_2$-$C_{40}$ heteroaryl group, each substituted with one or more of a $C_1$-$C_{20}$ alkyl group, a $C_6$-$C_{40}$ aryl group, or a $C_2$-$C_{40}$ heteroaryl group.

BRIEF DESCRIPTION OF THE DRAWING

Features will become apparent to those of skill in the art by describing in detail exemplary embodiments with reference to the attached drawing in which:

FIG. 1 illustrates a schematic view of an organic light-emitting device according to an exemplary embodiment.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

Expressions such as "at least one of," when preceding a list of elements, modify the entire list of elements and do not modify the individual elements of the list.

FIG. 1 illustrates a schematic view of an organic light-emitting device according to an exemplary embodiment.

Referring to FIG. 1, the organic light-emitting device may have a stack structure in which a first electrode, a hole injection layer, a hole transport layer, an auxiliary layer, an emission layer, an electron transport layer, an electron injection layer, and a second electrode are sequentially stacked upon one another.

In the organic light-emitting device of FIG. 1, the first electrode may be an anode for hole injection, and the second electrode may be a cathode for electron injection.

Although not illustrated in FIG. 1, the organic light-emitting device may further include a substrate that may be disposed under the first electrode or above the second electrode. The substrate may be above the second electrode, and the organic light-emitting device may be an inverted organic light-emitting device.

The substrate may be a substrate used in organic light emitting devices. In some embodiments the substrate may be a glass substrate or a transparent plastic substrate with strong mechanical strength, thermal stability, transparency, surface smoothness, ease of handling, and water resistance.

The substrate may be disposed under the first electrode, and the first electrode may be formed by depositing or sputtering a first electrode-forming material on the substrate. A material having a high work function may be selected as a material for the first electrode to facilitate hole injection.

The first electrode may be a reflective electrode, a semi-transmissive electrode, or a transmissive electrode. The substrate may be disposed under the first electrode, the first electrode may be a reflective electrode, and the organic light-emitting device of FIG. 1 may be a top-emission organic light-emitting device. The substrate may be disposed under the first electrode, the first electrode may be a semi-transmissive electrode, and the organic light-emitting device of FIG. 1 may be a bottom-emission or double-sided-emission organic light-emitting device.

A material for the first electrode may be a transparent and highly conductive material, and examples of such a material are indium tin oxide (ITO), indium zinc oxide (IZO), tin oxide ($SnO_2$), and zinc oxide (ZnO). In an embodiment, a metal such as, for example, magnesium (Mg), aluminum (Al), aluminum-lithium (Al—Li), calcium (Ca), magnesium-indium (Mg—In), and magnesium-silver (Mg—Ag) may be used for the first electrode material.

The first electrode may have a single-layer structure or a multi-layer structure. For example, the first electrode may have a triple-layer structure of ITO/Ag/ITO.

The second electrode may be disposed opposite to the first electrode. A material for the second electrode may be a material having a low work function, such as a metal, an alloy, an electrically conductive compound, and a combination thereof. In an embodiment, a metal such as, for example, lithium (Li), magnesium (Mg), aluminum (Al), aluminum-lithium (Al—Li), calcium (Ca), magnesium-indium (Mg—In), and magnesium-silver (Mg—Ag) may be used for the second electrode material. In some embodiments, to manufacture a top-emission organic light-emitting device, the second electrode may be a transmissive electrode formed using, for example, ITO or IZO, and such a variation may be possible.

A hole transport region may be between the first electrode and the emission layer. In this embodiment, the organic light-emitting device may include an auxiliary layer in the hole transport region. The hole transport region may further include one or more of a hole injection layer (HIL), a hole transport layer (HIL), a hole injection transport layer (HITL) able to inject and transport holes, a buffer layer, or an electron blocking layer (EBL). In the organic light-emitting device of FIG. 1, the hole injection layer, the hole transport layer, and the auxiliary layer are stacked on the first electrode in the stated order.

The auxiliary layer may include a compound represented by Formula 1 and a compound represented by Formula 2.

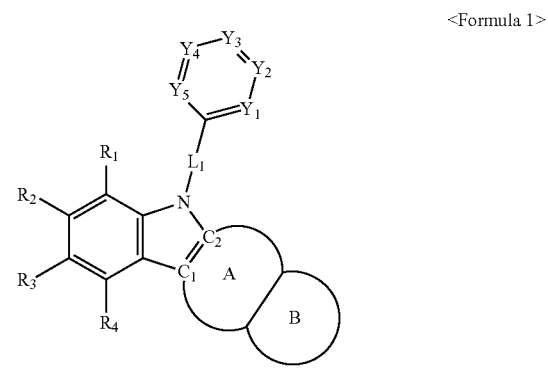

<Formula 1>

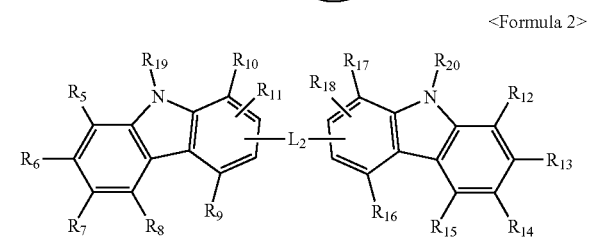

<Formula 2> wherein in Formula 1, $Y_1$ to $Y_5$ may each independently be a nitrogen (N) atom or $-CR_{21}$, each $R_{21}$ may be the same or different from each other, and $C_1$ and $C_2$ may each be a carbon (C) atom.

Ring A may be an aromatic ring represented by Formula 1a below, Ring B may be an aromatic ring represented by Formula 1b below and condensed with Ring A.

<Formula 1a>

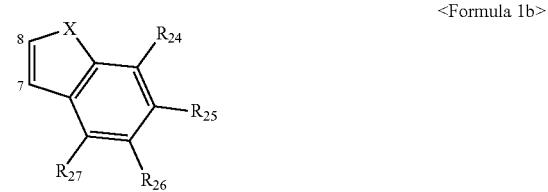

<Formula 1b>

The bond between 7 and 8 in Ring B represented by Formula 1b is condensed with the bond between 3 and 4, the bond between 4 and 5, or the bond between 5 and 6 in Ring A represented by Formula 1a. In some embodiments, 7 in Formula 1b may be linked to 3 in Formula 1a, and 8 in Formula 1b may be linked to 4 in Formula 1a, and thus Ring B may be condensed with Ring A. In an embodiment, 7 in Formula 1b may be linked to 4 in Formula 1a, and 8 in Formula 1b may be linked to 3 in Formula 1a, and thus Ring B may be condensed with Ring A. In an embodiment, 7 in Formula 1b may be linked to 4 in Formula 1a, and 8 in Formula 1b may be linked to 5 in Formula 1a, and In an embodiment, 7 in Formula 1b may be linked to 5 in Formula 1a, and 8 in Formula 1b may be linked to 4 in Formula 1a, and thus Ring B may be condensed with Ring A. In an embodiment, 7 in Formula 1b may be linked to 5 in Formula 1a, and 8 in Formula 1b may be linked to 6 in Formula 1a. In an embodiment, 7 in Formula 1b may be linked to 6 in Formula 1a, and 8 in Formula 1b may be linked to 5 in Formula 1a, and thus Ring B may be condensed with Ring A.

X in Formula 1b may be selected from —$CR_{28}R_{29}$—, —$NR_{30}$—, and an —O— atom.

wherein in Formulae 1 and 2, $L_1$ and $L_2$ may be selected from a direct bond, a $C_6$-$C_{40}$ arylene group, and a $C_2$-$C_{40}$ heteroarylene group; and a $C_6$-$C_{40}$ arylene group and a $C_2$-$C_{40}$ heteroarylene group, each substituted with one or more of a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

$R_1$ to $R_{30}$ may each independently be selected from a hydrogen, a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, and a $C_6$-$C_{40}$ arylthio group;

a $C_1$-$C_{40}$ alkyl group, a $C_2$-$C_{40}$ alkenyl group, a $C_2$-$C_{40}$ alkynyl group, and a $C_1$-$C_{40}$ alkoxy group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, and $C_6$-$C_{40}$ arylthio group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group. Respective portions of $R_1$ to $R_4$ may be bound to one other so as to be condensed to the ring to which the substituents $R_1$ to $R_4$ are attached.

$L_1$ and $L_2$ may each independently be selected from a direct bond, a phenylene group, a pentalenylene group, an indenylene group, a naphthylene group, an azulenylene group, an indacenylene group, an acenaphthylene group, a phenalenylene group, a fluorenylene group, a phenanthrenylene group, an anthrylene group, a fluoranthenylene group, a pyrenylene group, a naphthacenylene group, a chrysenylene group, a triphenylenylene group, a pyrrolylene group, an imidazolylene group, a pyrazolylene group, a pyridylene group, a pyrazinylene group, a pyrimidinylene group, a pyridazinylene group, an isoindolylene group, an indolylene group, an indazolylene group, a purinylene group, a quinolylene group, a quinazolinylene group, a carbazolylene group, a dibenzofuranylene group, and a dibenzothiophenylene group; and a phenylene group, a pentalenylene group, an indenylene group, a naphthylene group, an azulenylene group, an indacenylene group, an acenaphthylene group, a biphenylene group, a phenalenylene group, a fluorenylene group, a phenanthrenylene group, an anthrylene group, a fluoranthenylene group, a pyrenylene group, a benzofluorenylene group, a naphthacenylene group, a chrysenylene group, a triphenylenyl group, a pyrrolylene group, an imidazolylene group, a pyrazolylene group, a pyridylene group, a pyrazinylene group, a pyrimidinylene group, a pyridazinylene group, an isoindolylene group, an indolylene group, an indazolylene group, a purinylene group, a quinolylene group, a carbazolylene group, a dibenzofuranylene group, and a dibenzothiophenylene group, each substituted with one or more of a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

In some embodiments, $L_1$ and $L_2$ may each independently be selected from a direct bond, a phenylene group, a naphthylene group, a fluorenylene group, and a pyridylene group; and a phenylene group, a naphthylene group, a fluorenylene group, and a pyridylene group, each substituted with one or more of a methyl group, an ethyl group, a butyl group, a phenyl group, or a carbazolyl group.

$L_1$ and $L_2$ may each independently be selected from a direct bond and groups represented by Formulae 3A and 3B:

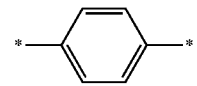

3A

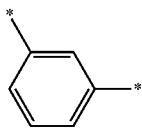

\* indicates a binding site.

$R_1$ to $R_{30}$ may each independently be selected from a hydrogen, a methyl group, an ethyl group, a propyl group, a butyl group, a pentyl group, a hexyl group, a methoxy group, an ethoxy group, a propoxy group, a butoxy group, a pentoxy group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, an indolyl group, an isoindolyl group, an indolizinyl group, a benzofuryl group, an isobenzofuryl group, an indazolyl group, a benzimidazolyl group, a quinolyl group, an isoquinolyl group, a quinazolinyl group, a carbazolyl group, a benzocarbazolyl group, and a pyridoindolyl group; and a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, an indolyl group, an isoindolyl group, an indolizinyl group, a benzofuryl group, an isobenzofuryl group, an indazolyl group, a benzimidazolyl group, a quinolyl group, an isoquinolyl group, a quinazolinyl group, a carbazolyl group, a benzocarbazolyl group, and a pyridoindolyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

$R_1$ to $R_{30}$ may each independently be selected from a hydrogen atom, a methyl group, a phenyl group, a pyridyl group, a pyrimidinyl group, a pyrazinyl group, a pyridazinyl group, a triazinyl group, and a quinazolinyl group; and a phenyl group, a pyridyl group, a pyrimidinyl group, a pyrazinyl group, a pyridazinyl group, a triazinyl group, and a quinazolinyl group, each substituted with one or more of a methyl group, an ethyl group, a butyl group, a phenyl group, a biphenyl group, a pyridyl group, a quinolyl group, or a carbazolyl group. Optionally, respective portions of $R_1$ to $R_4$ may be bound to one other so as to form an aromatic ring condensed with the ring to which the substituents $R_1$ to $R_4$ are attached.

In some embodiments, $R_1$ to $R_{30}$ may each independently be selected from a hydrogen atom and groups represented by Formulae 4A to 4F below.

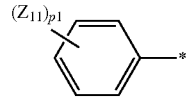   <4A>

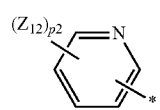   <4B>

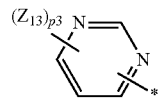   <4C>

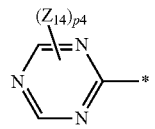   <4D>

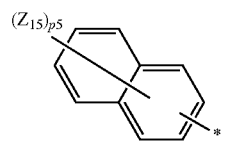   <4E>

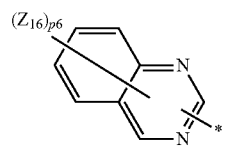   <4F> wherein in Formulae 4A to 4F, $Z_{11}$ to $Z_{16}$ may each independently be selected from a deuterium atom, a halogen atom, a $C_1$-$C_{20}$ alkyl group, a $C_1$-$C_{20}$ alkoxy group, a $C_6$-$C_{40}$ aryl group, and a $C_2$-$C_{40}$ heteroaryl group;

a $C_1$-$C_{20}$ alkyl group and a $C_1$-$C_{20}$ alkoxy group, each substituted with one or more of a deuterium atom or a halogen atom; and a $C_6$-$C_{40}$ aryl group and a $C_2$-$C_{40}$ heteroaryl group, each substituted with one or more of a deuterium atom, a halogen atom, a $C_1$-$C_{20}$ alkyl group, a $C_1$-$C_{20}$ alkoxy group, a $C_6$-$C_{20}$ aryl group, or a $C_2$-$C_{20}$ heteroaryl group.

p1 may be an integer selected from 1 to 5,
p2 may be an integer selected from 1 to 4,
p3 may be an integer selected from 1 to 3,
p4 may be an integer selected from 1 and 2,
p5 may be an integer selected from 1 to 6, and
p6 may be an integer selected from 1 to 5.

\* indicates a binding site.

$Z_{11}$ to $Z_{16}$ may each independently be selected from groups represented by Formulae 5A to 5D

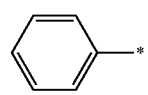   <5A>

-continued

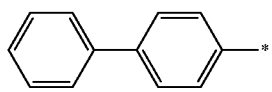
<5B>

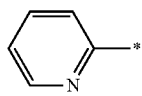
<5C>

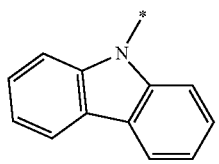
<5D> wherein in Formulae 5A to 5D, * indicates a binding site.

In some embodiments, $R_1$ to $R_{30}$ may each independently be selected from groups represented by Formulae 6A to 6L.

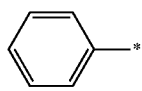
<6A>

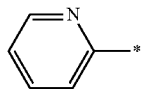
<6B>

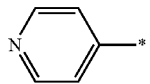
<6C>

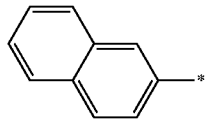
<6D>

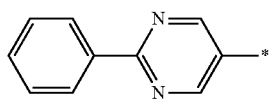
<6E>

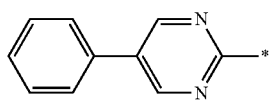
<6F>

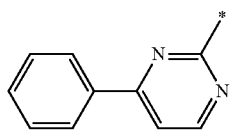
<6G>

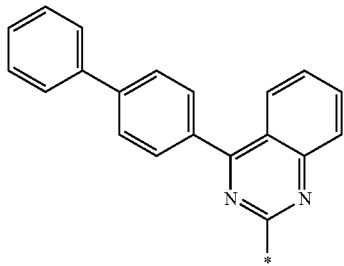
<6H>

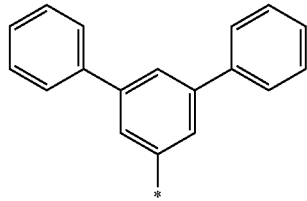
<6I>

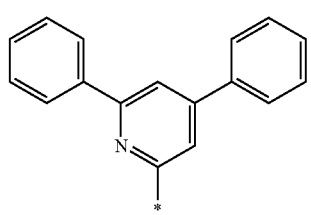
<6J>

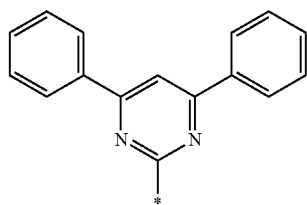
<6K>

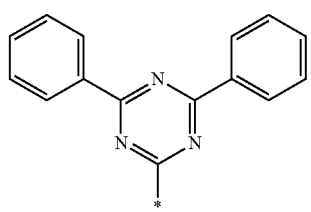
<6L>

Optionally, respective portions of $R_1$ to $R_4$ may be bound to one other so as to form a benzene ring condensed with the ring to which the substituents $R_1$ to $R_4$ are attached.

In some embodiments, the auxiliary layer includes a compound represented by one of Formulae 1-1 to 1-11 below and a compound represented by Formula 2-1 below.

<Formula 1-1>

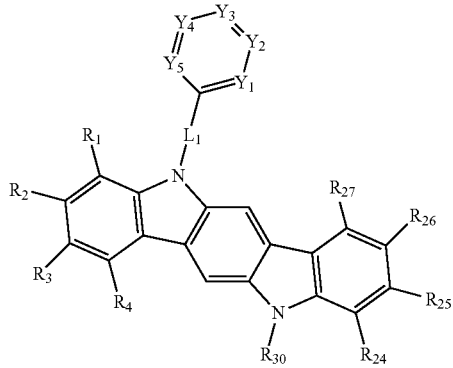

<Formula 1-2>
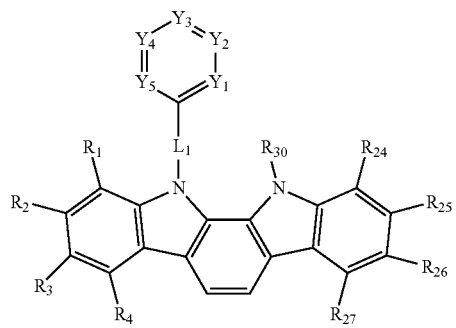
<Formula 1-3>
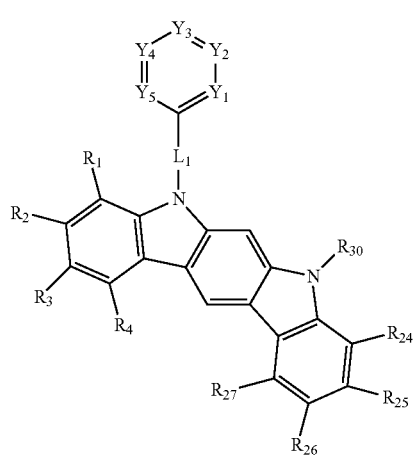
<Formula 1-4>
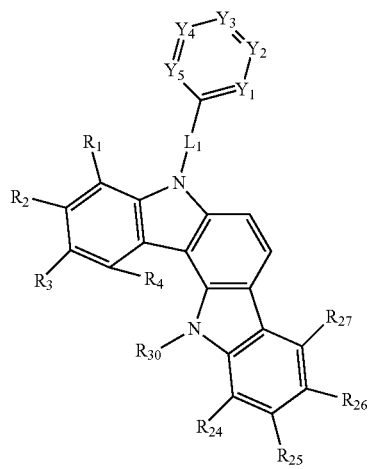
<Formula 1-5>
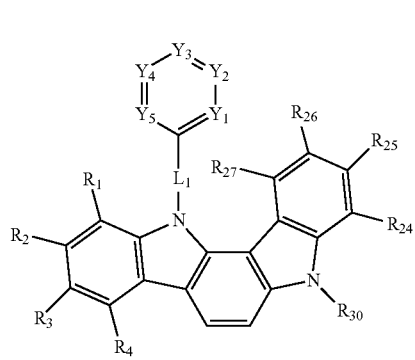
<Formula 1-6>
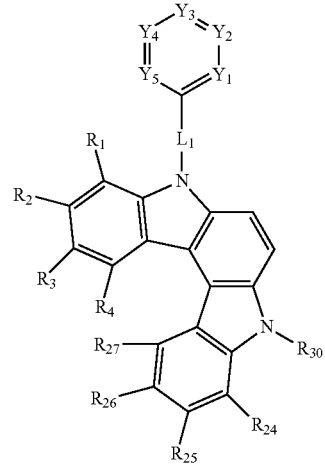
<Formula 1-7>
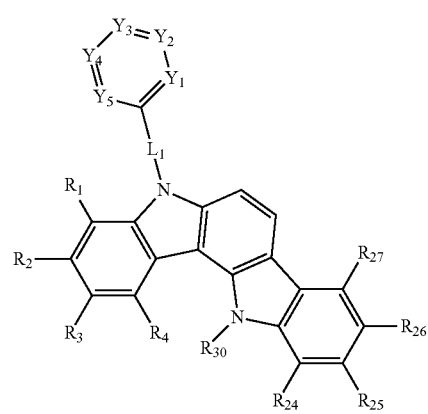
<Formula 1-8>
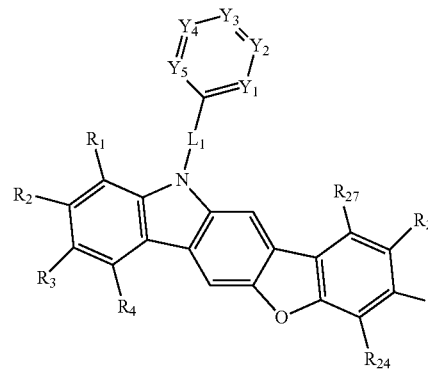
<Formula 1-9>
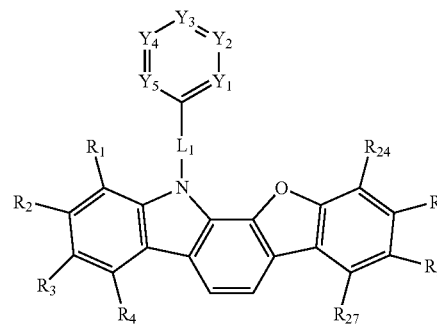

<Formula 1-10>

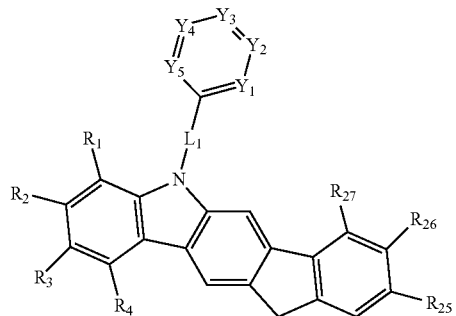

<Formula 1-11>

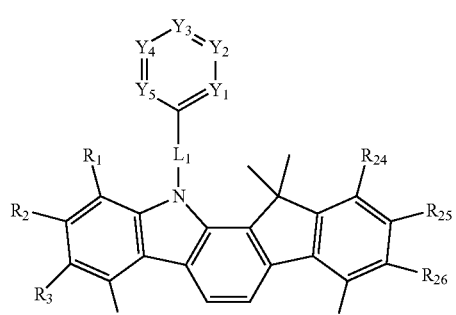

<Formula 2-1>

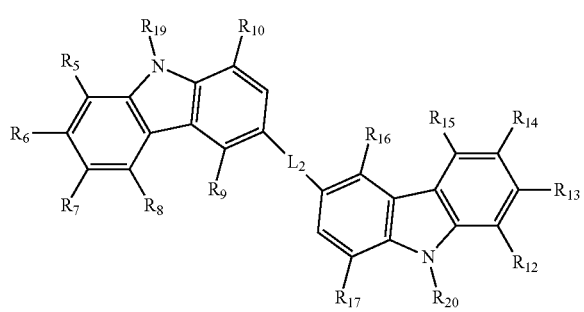

wherein in Formulae 1-1 to 1-11 and 2-1, $Y_1$ to may each independently be a nitrogen (N) atom or —$CR_{21}$, and each $R_{21}$ may be the same or different from each other;

$L_1$ and $L_2$ may be selected from a direct bond and a $C_6$-$C_{40}$ arylene group;

$R_1$ to $R_{10}$, $R_{12}$ to $R_{17}$, $R_{19}$ to $R_{21}$, $R_{24}$ to $R_{27}$, and $R_{30}$ may each independently be selected from a hydrogen, a $C_6$-$C_{40}$ aryl group, and a $C_2$-$C_{40}$ heteroaryl group; and a $C_6$-$C_{40}$ aryl group and a $C_2$-$C_{40}$ heteroaryl group, each substituted with one or more of a $C_1$-$C_{20}$ alkyl group, a $C_6$-$C_{40}$ aryl group, or a $C_2$-$C_{40}$ heteroaryl group.

In some embodiments, $L_1$ and $L_2$ may each independently be selected from a direct bond and groups represented by Formulae 3A and 3B.

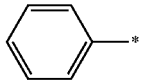

3A

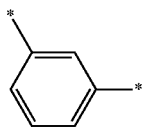

3B $R_1$ to $R_{10}$, $R_{12}$ to $R_{17}$, $R_{19}$ to $R_{21}$, $R_{24}$ to $R_{27}$, and $R_{30}$ may each independently be selected from a hydrogen atom and groups represented by Formulae 4A to 4F below.

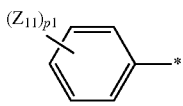
<4A>

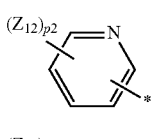
<4B>

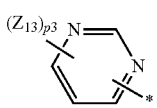
<4C>

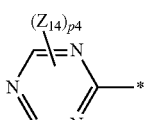
<4D>

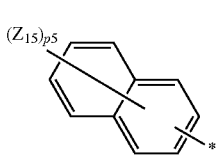
<4E>

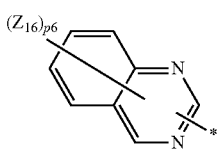
<4F>

$Z_{11}$ to $Z_{16}$ may each independently be selected from a $C_1$-$C_{20}$ alkyl group, a $C_6$-$C_{40}$ aryl group, and a $C_2$-$C_{40}$ heteroaryl group.

p1 may be an integer selected from 1 to 5, p2 may be an integer selected from 1 to 4, p3 may be an integer selected from 1 to 3, p4 may be an integer selected from 1 and 2, p5 may be an integer selected from 1 to 6, p6 may be an integer selected from 1 to 5, and

* indicates a binding site.

$Z_{11}$ to $Z_{16}$ may each independently be selected from groups represented by Formulae 5A to 5D

<5A>

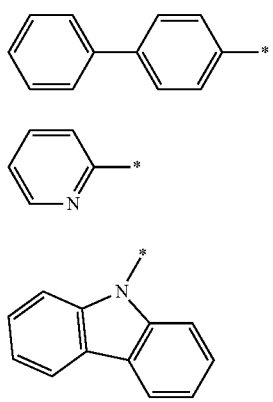
wherein in Formulae 5A to 5D, * indicates a binding site.
$R_1$ to $R_{10}$, $R_{12}$ to $R_{17}$, $R_{19}$ to $R_{21}$, $R_{24}$ to $R_{27}$, and $R_{30}$ may each independently be selected from groups represented by Formulae 6A to 6L below.
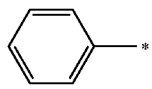
<6A>
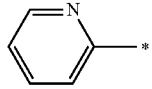
<6B>
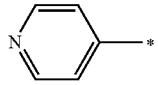
<6C>
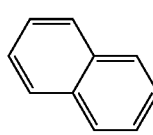
<6D>
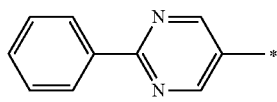
<6E>
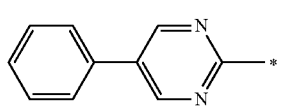
<6F>
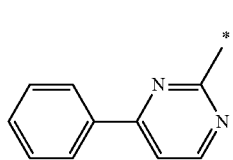
<6G>
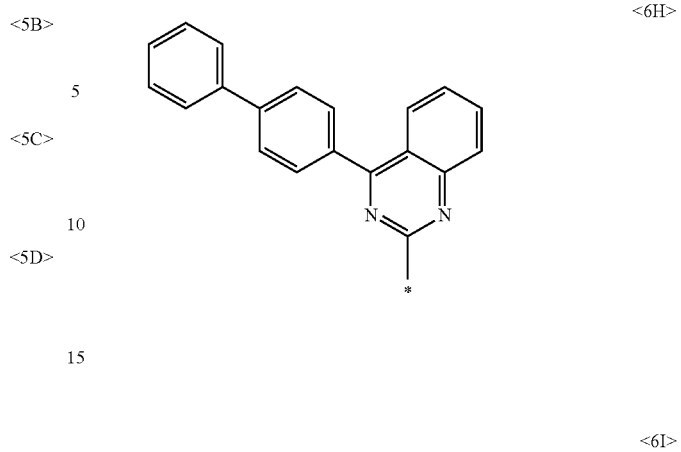

The compound represented by Formula 1 may include one or more of the compounds below.
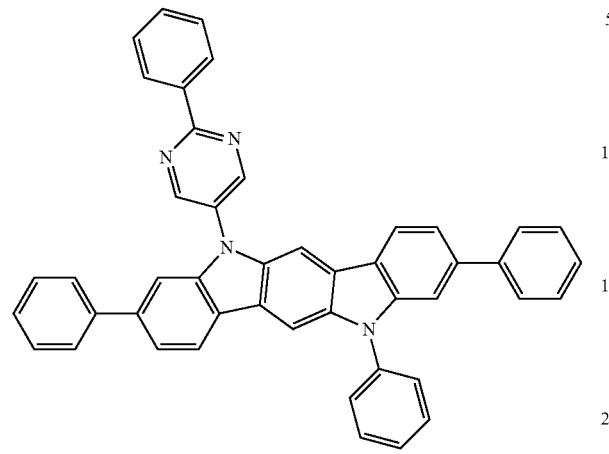
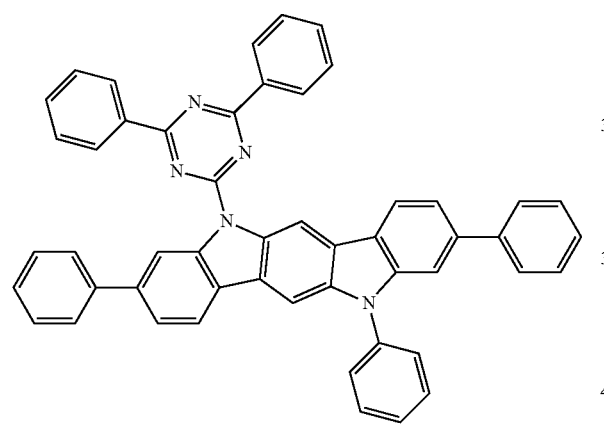
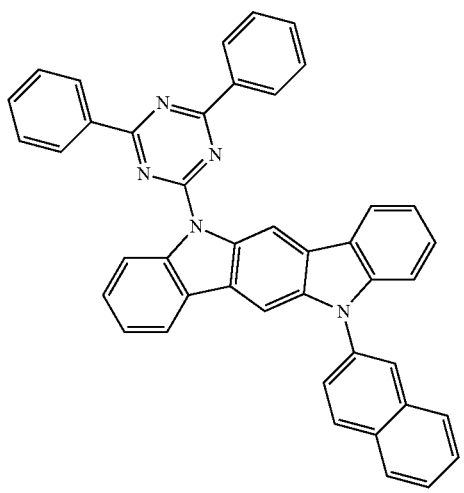
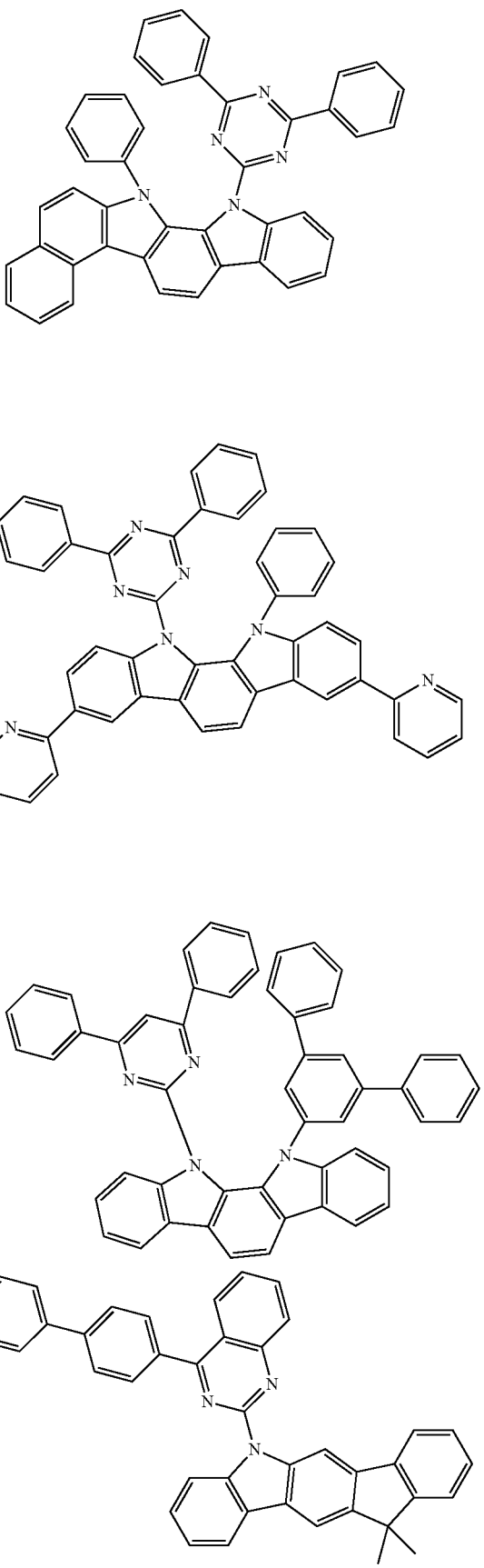

-continued
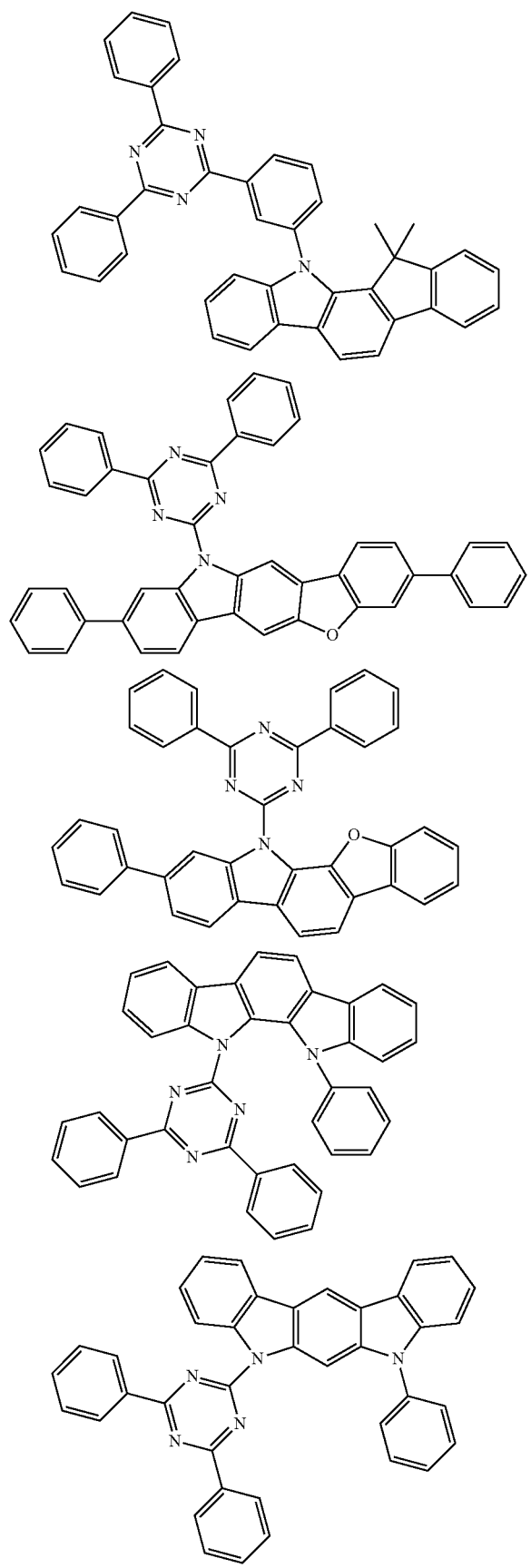
-continued
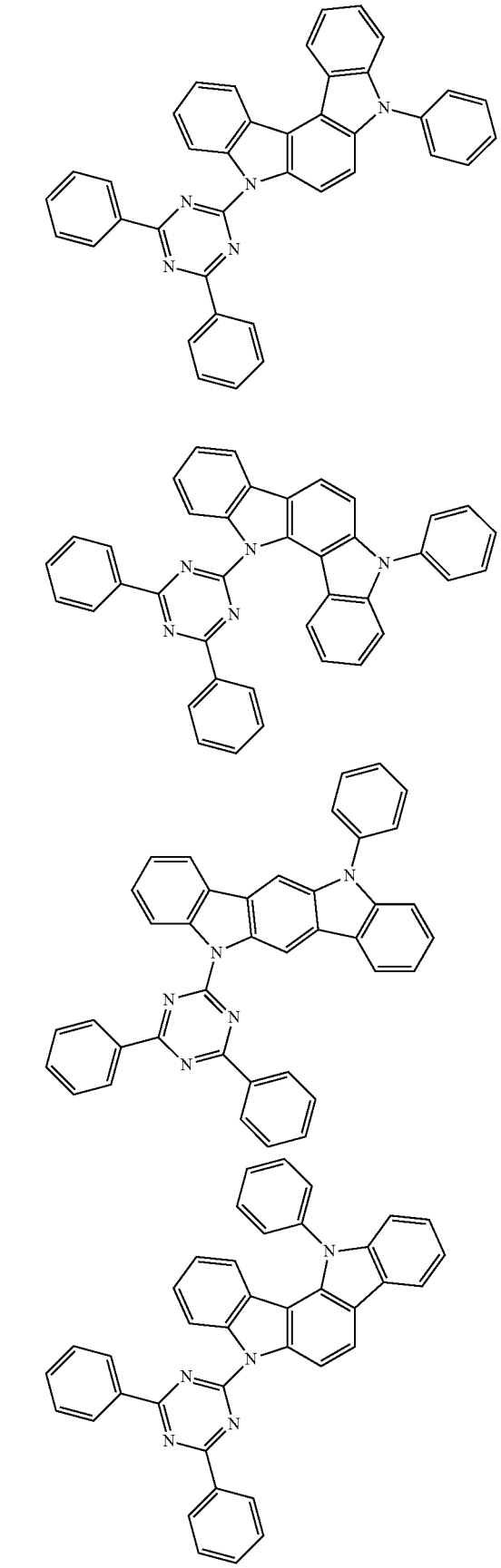

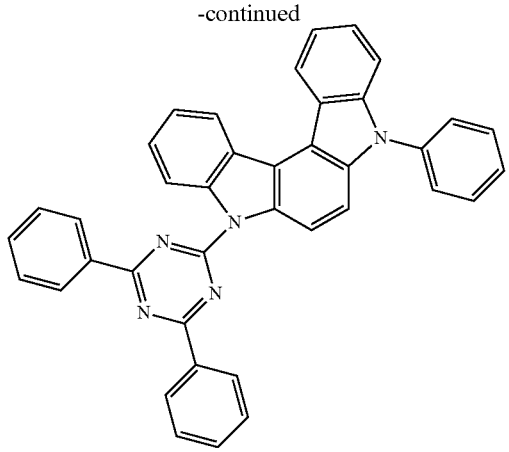
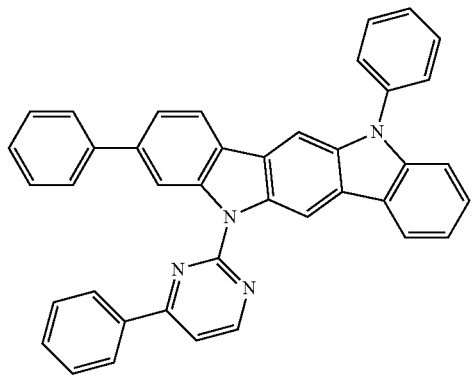
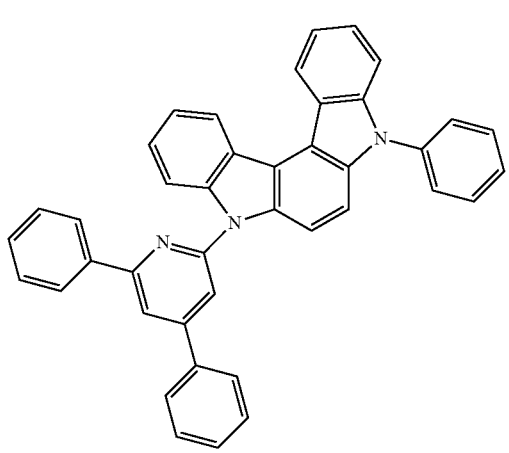
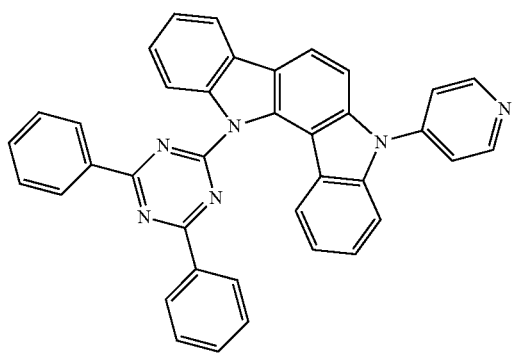
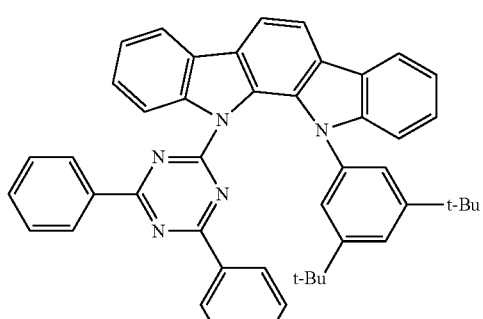
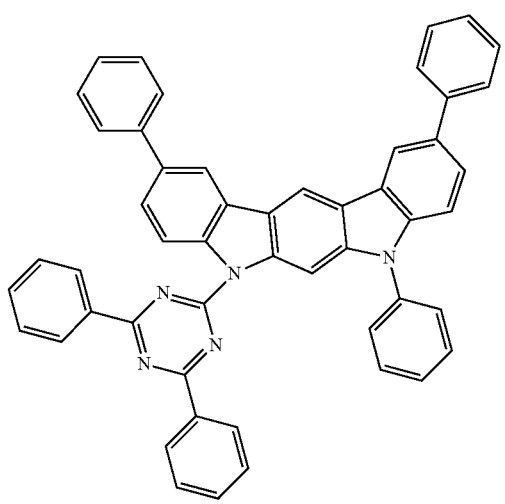
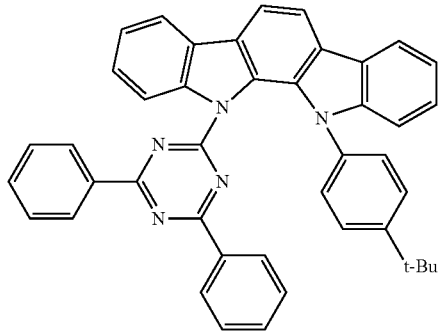
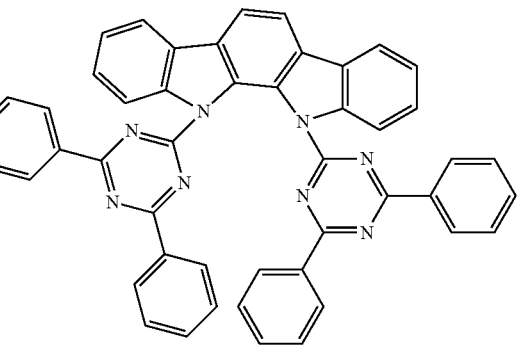

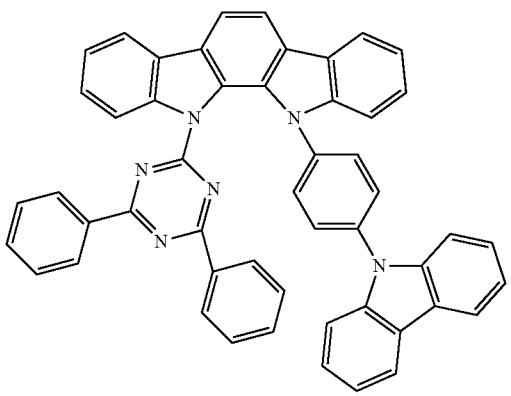

The compound represented by Formula 2 may include one or more of the compounds below.

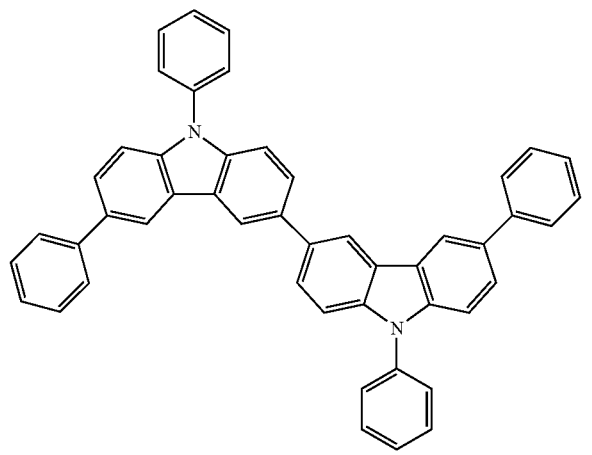

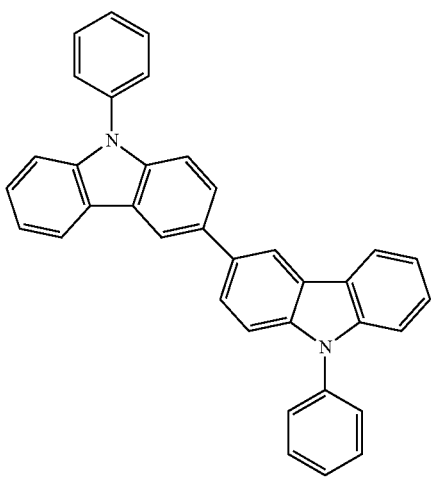

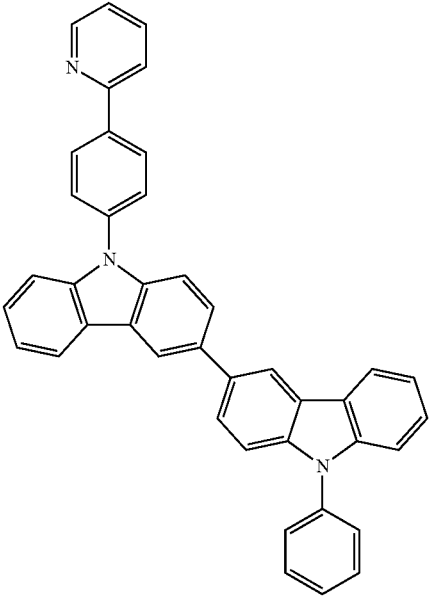

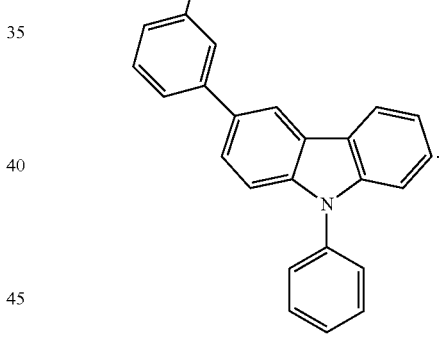

By using the compound represented by Formula 1 and the compound represented by Formula 2 simultaneously in the auxiliary layer, hole transport characteristics may be maintained in the hole transport region, hole extinction caused by electrons migrating towards the hole transport region may be prevented, and the lifetime characteristics and efficiency of the organic light-emitting device may be improved.

A thickness of the auxiliary layer may be in a range of from about 50 Å to about 150 Å. Maintaining the thickness of the auxiliary layer within these ranges may help control the balance of charges, and the efficiency and lifetime may be improved.

Referring to FIG. 1, an exemplary location of the auxiliary layer is between the emission layer and the hole transport layer. In an embodiment, the auxiliary layer may be in any location within the hole transport region. For example, the hole transport region may include a structure of layers sequentially stacked on the substrate, the layers including, for example, hole transport layer/auxiliary layer, hole transport layer/auxiliary layer/buffer layer, hole transport layer/buffer layer/auxiliary layer, hole injection layer/auxiliary layer/hole transport layer, hole injection layer/auxiliary layer/hole transport layer/buffer layer, hole injection layer/hole transport layer/auxiliary layer, hole injection layer/hole transport layer/buffer layer/auxiliary layer, and hole transport layer/auxiliary layer/electron blocking layer. The auxiliary layer may be formed, for example, by vacuum deposition, or co-deposition.

The hole injection layer may be formed on the first electrode using a variety of methods, for example, vacuum deposition, spin coating, casting, Langmuir-Blodgett (LB) deposition, inkjet printing, laser printing, or laser induced thermal imaging (LITI).

When the hole injection layer is formed by vacuum deposition, for example, the vacuum deposition may be performed at a temperature of a deposition temperature of about 100° C. to about 500° C., at a vacuum degree of about $10^{-8}$ Torr to about $10^{-3}$ Torr, and at a deposition rate in a range of about 0.01 Å/sec to about 100 Å/sec in consideration of a compound for the hole injection layer to be deposited, and the structure of the hole injection layer to be formed.

When the hole injection layer is formed by spin coating, for example, the spin coating may be performed at a coating rate of about 2,000 rpm to about 5,000 rpm, and at a temperature of about 80° C. to 200° C. in consideration of a compound for a hole injection layer to be deposited, and the structure of the hole injection layer to be formed.

The hole transport layer may be formed on the first electrode or the hole injection layer using a variety of methods, for example, vacuum deposition, spin coating, casting, LB deposition, inkjet printing, laser printing, or LITI. When the hole transport layer is formed by vacuum deposition or spin coating, conditions for vacuum deposition and coating may be similar to the above-described vacuum deposition and coating conditions for forming the hole injection layer.

The hole injection layer or the hole transport layer may include one or more of m-MTDATA, TDATA, 2-TNATA, NPB, β-NPB, TPD, Spiro-TPD, Spiro-NPB, α-NPB, TAPC, HMTPD, 4,4',4''-tris(N-carbazolyl)triphenylamine (TCTA), polyaniline/dodecylbenzene sulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, or a compound represented by Formula 202:

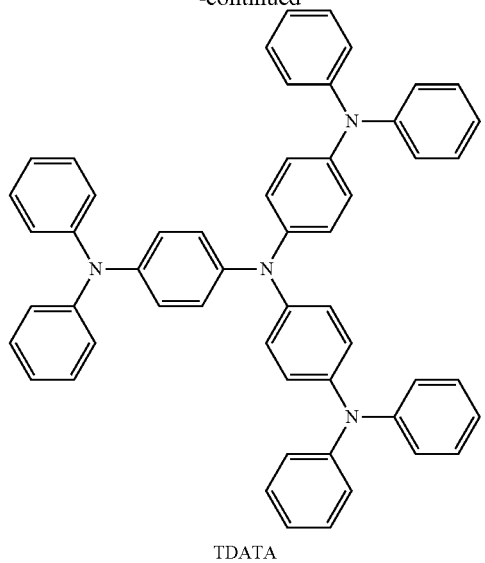

TDATA

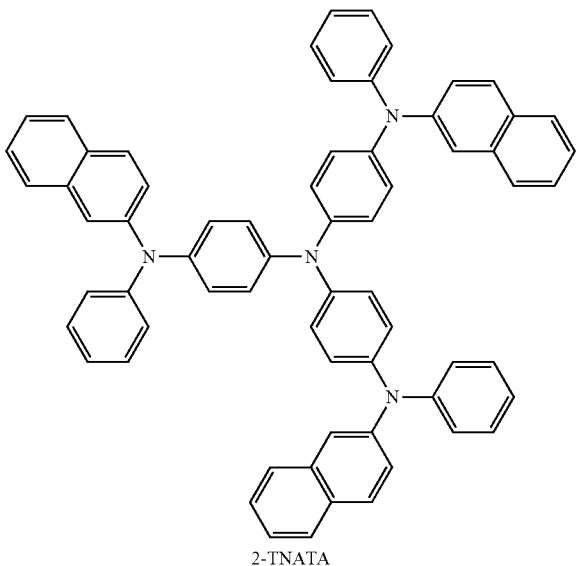

2-TNATA

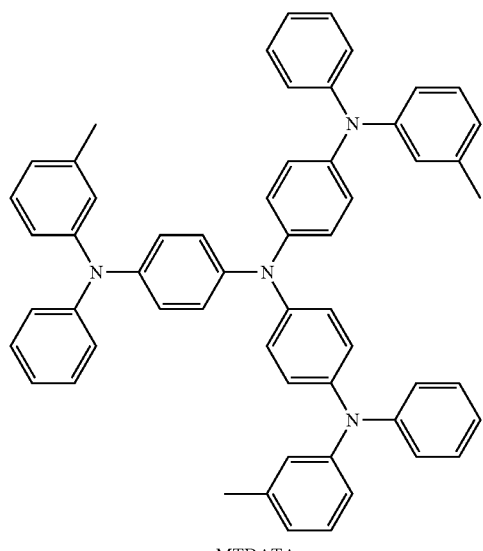

m-MTDATA

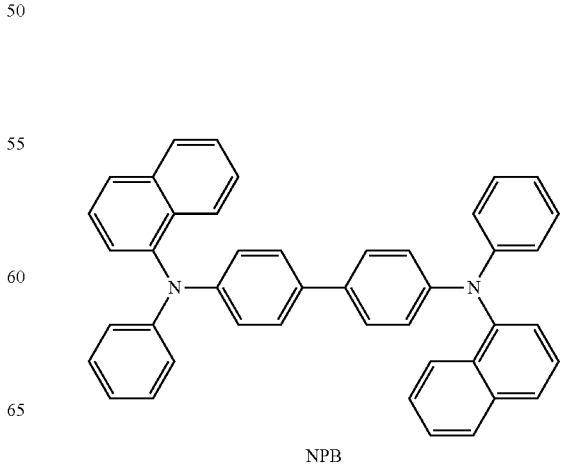

NPB

-continued
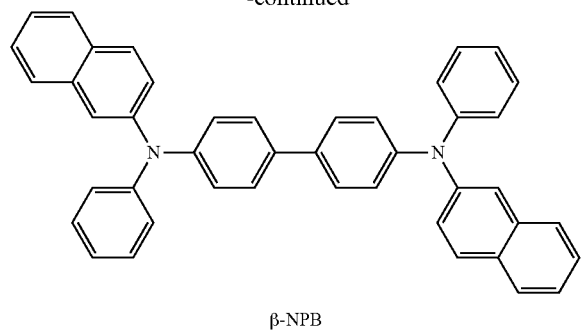
β-NPB
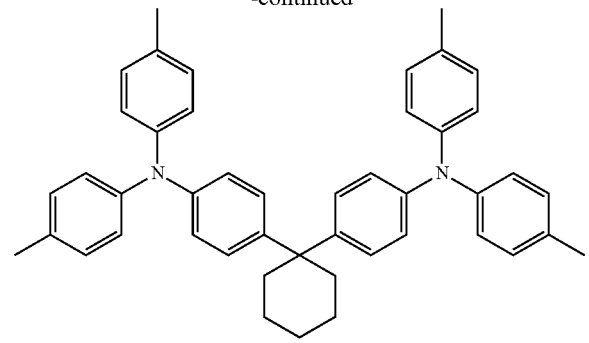
TAPC
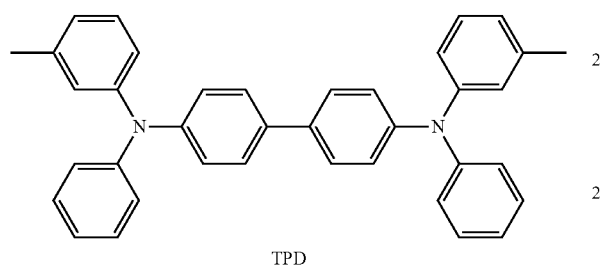
TPD
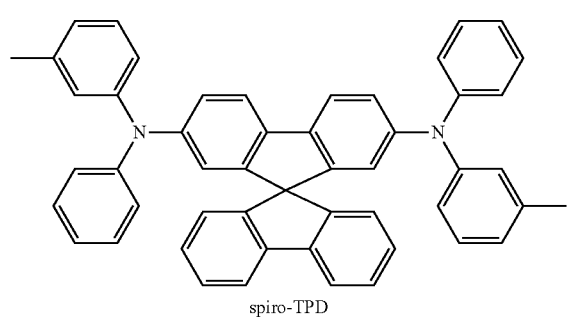
spiro-TPD
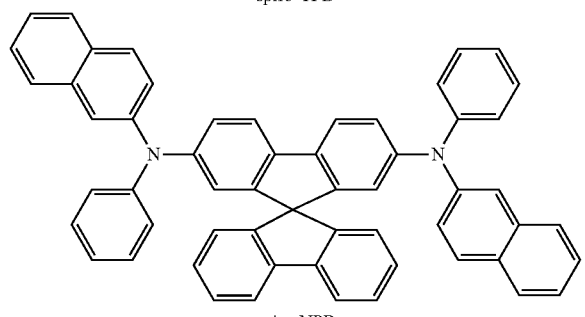
spiro-NPB
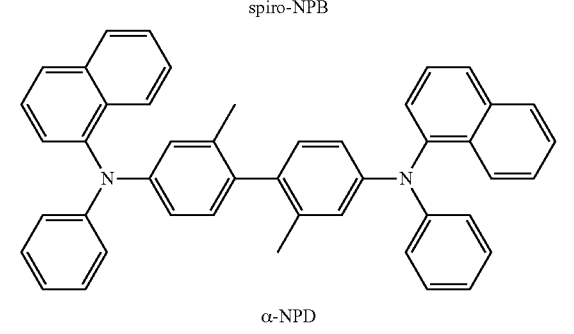
α-NPD
HMTPD
TCTA
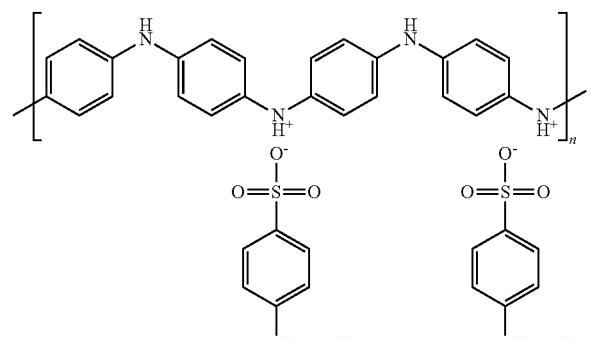
PANI/DBSA

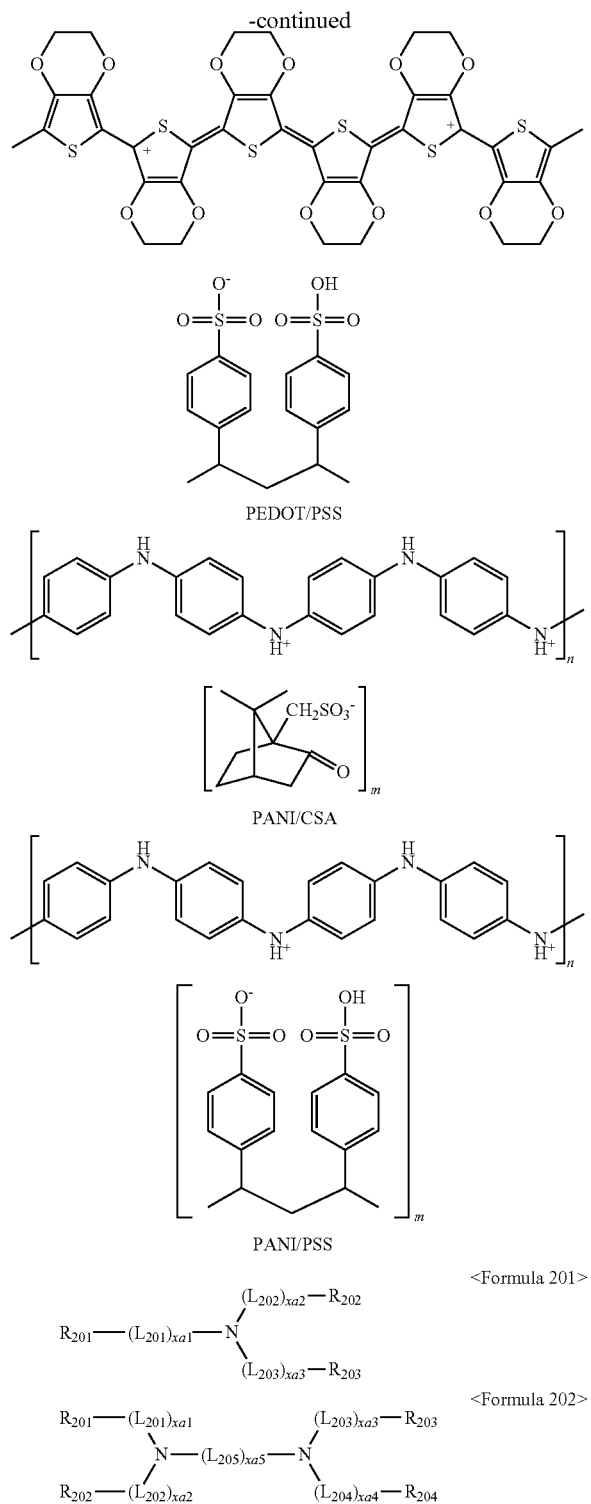

heteroarylene group, and a substituted or unsubstituted divalent $C_6$-$C_{60}$ non-aromatic condensed polycyclic group;

xa1 to xa4 may each independently be selected from 0, 1, 2, and 3;

xa5 may be selected from 1, 2, 3, 4, and 5;

$R_{201}$ to $R_{205}$ may each independently be selected from a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_2$-$C_{60}$ heteroaryl group, and a substituted or unsubstituted monovalent $C_6$-$C_{30}$ non-aromatic condensed polycyclic group.

In some embodiments, in Formulae 201 and 202, $L_{201}$ to $L_{205}$ may each independently be selected from a phenylene group, a naphthylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, or a triazinyl group.

xa1 to xa4 may each independently be selected from 0, 1, and 2;

xa5 may be selected from 1, 2, and 3;

$R_{201}$ to $R_{205}$ may each independently be selected from, for example, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with one or more of a deuterium, —F, —Cl, —Br, -I, a hydroxyl group, a cyano group, a nitro group, an amino group, an amidino group, a hydrazine group, a hydrazone group, a carboxylic acid or a salt thereof a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group.

In some embodiments, the compound represented by Formula 201 may be represented by Formula 201A below:

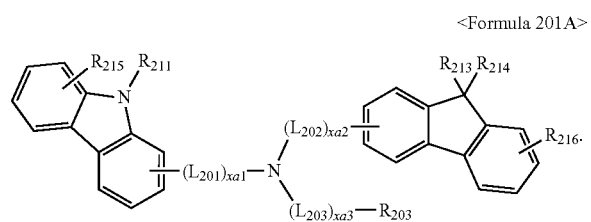

<Formula 201A>

In some embodiments, the compound represented by Formula 201 may be represented, for example, by Formula 201A-1:

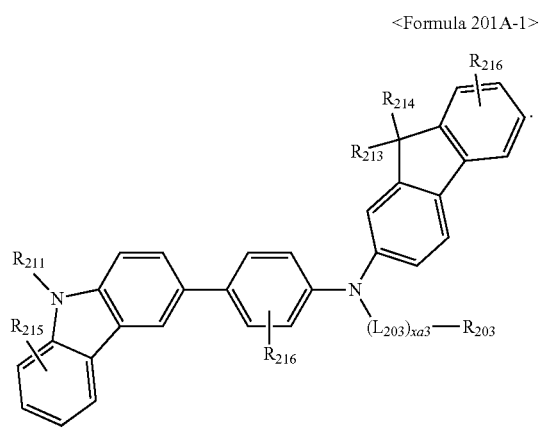

<Formula 201A-1>

In some embodiments, the compound represented by Formula 202 may be represented, for example, by Formula 202A:

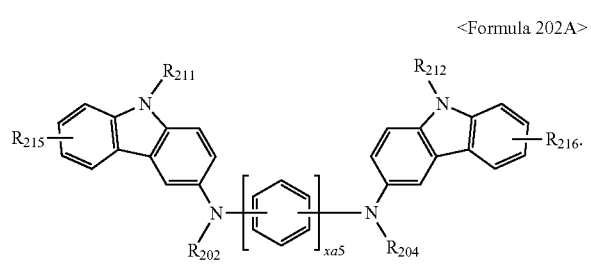

<Formula 202A>

In Formulae 201A, 201A-1, and 202A, $L_{201}$ to $L_{203}$, xa1 to xa3, xa5, and $R_{202}$ to $R_{204}$ may be understood by referring to the description provided herein, and the descriptions for $R_{211}$ and $R_{212}$ may be the same as $R_{203}$ as defined herein, $R_{213}$ to $R_{216}$ may each independently be selected from a hydrogen, a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a $C_6$-$C_{60}$ non-aromatic condensed polycyclic group.

In some embodiments, in Formulae 201A, 201A-1 and 202A, $L_{201}$ to $L_{203}$ may each independently be selected from a phenylene group, a naphthylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

xa1 to xa3 may each independently be selected from 0 and 1;

$R_{203}$, $R_{211}$ and $R_{212}$ may each independently be selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

$R_{213}$ and $R_{214}$ may each independently be selected from
a $C_1$-$C_{10}$ alkyl group and a $C_1$-$C_{20}$ alkoxy group;
a $C_1$-$C_{20}$ alkyl group and a $C_1$-$C_{20}$ alkoxy group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

$R_{215}$ and $R_{216}$ may each independently be selected from
a hydrogen, a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof,
a $C_1$-$C_{20}$ alkyl group and a $C_1$-$C_{20}$ alkoxy group;
a $C_1$-$C_{20}$ alkyl group and a $C_1$-$C_{20}$ alkoxy group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

xa5 may be 1 or 2.

In Formula 201A and 201A-1, $R_{213}$ and $R_{214}$ may be bound to each other so as to form a saturated ring or an unsaturated ring.

The compound represented by Formula 201 and the compound represented by Formula 202 may include, for example, Compounds HT1 to HT20.

HT1

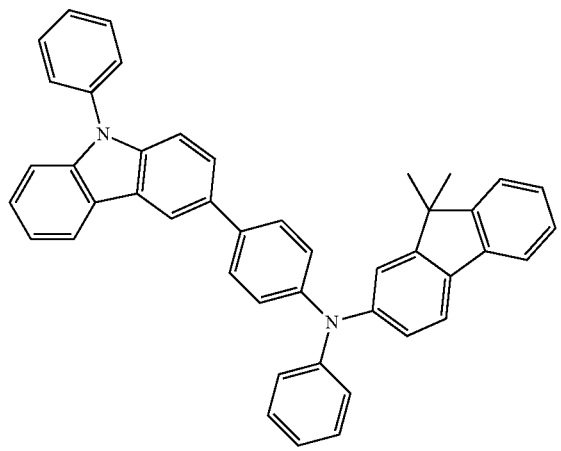

HT2
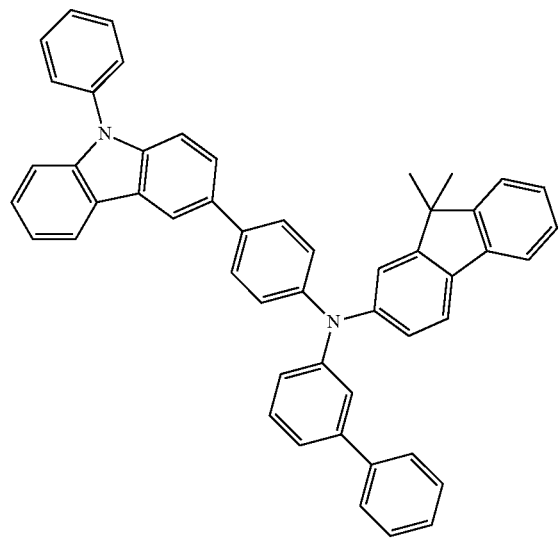
HT3
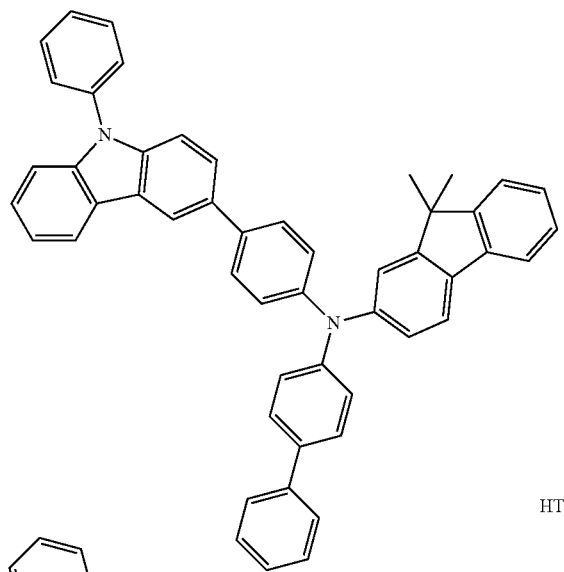
HT4
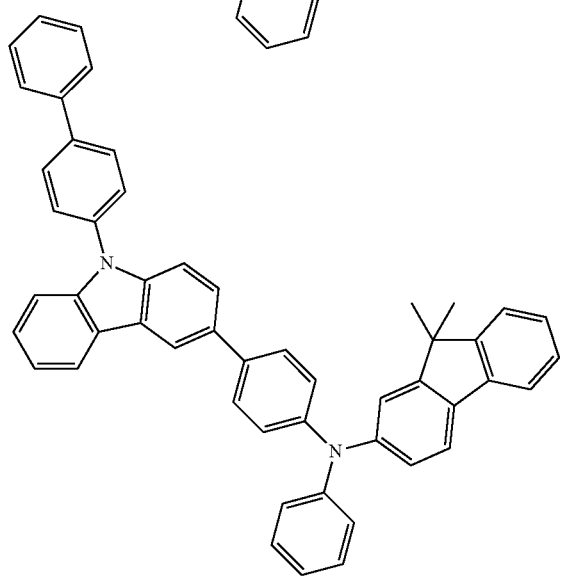
HT5
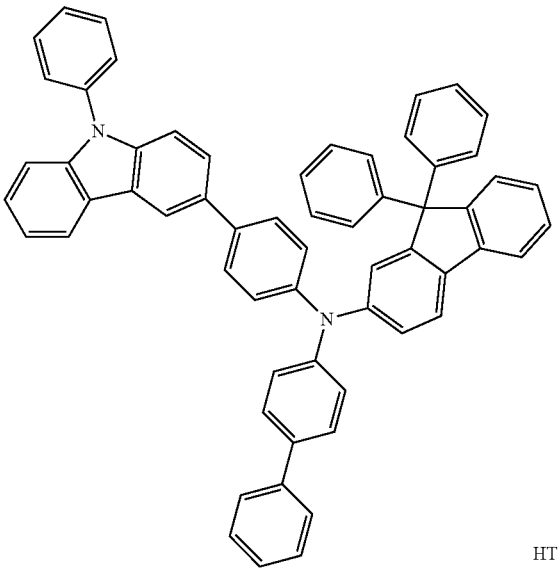
HT6
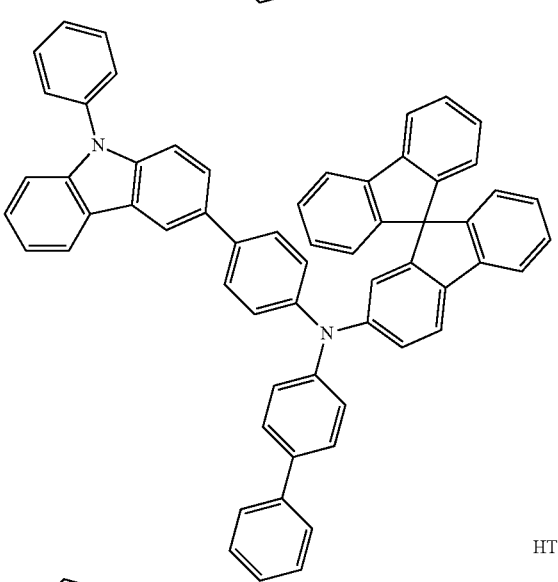
HT7
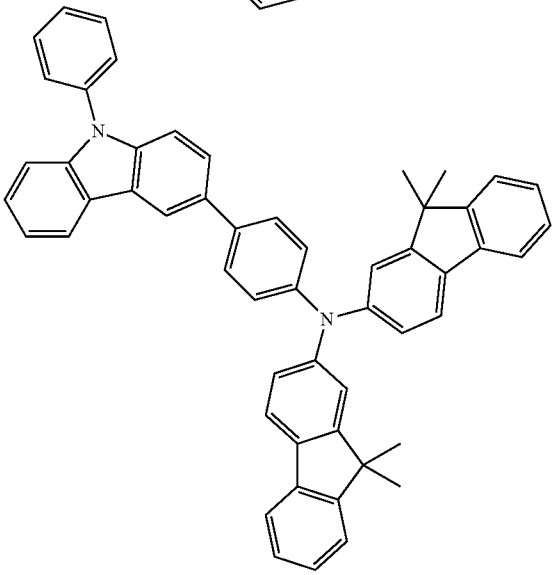

HT8
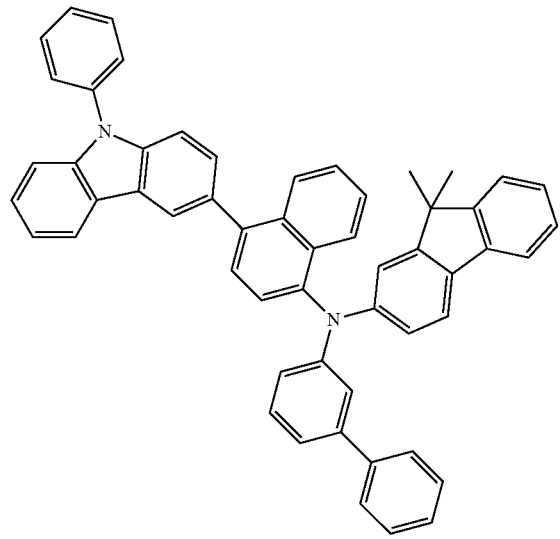
HT9
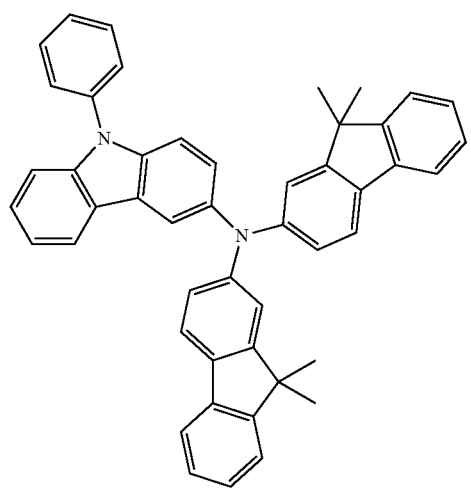
HT10
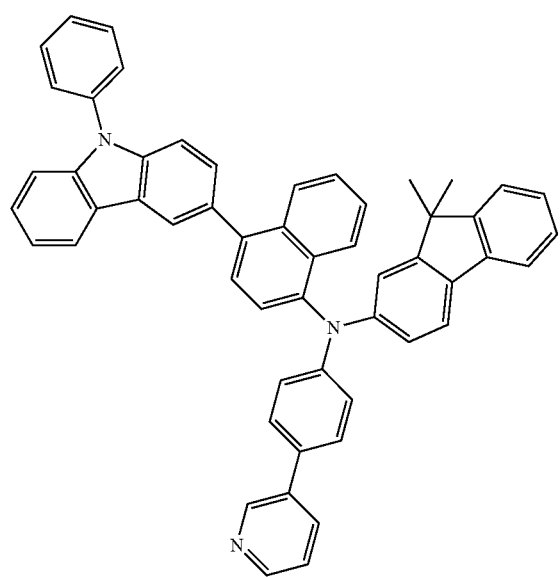
HT11
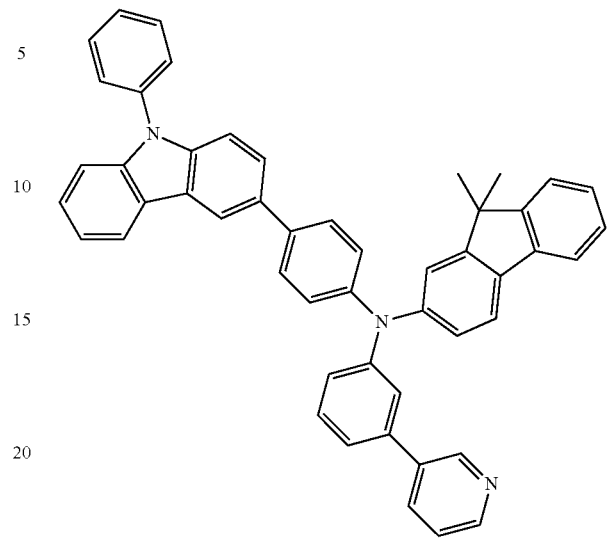
HT12
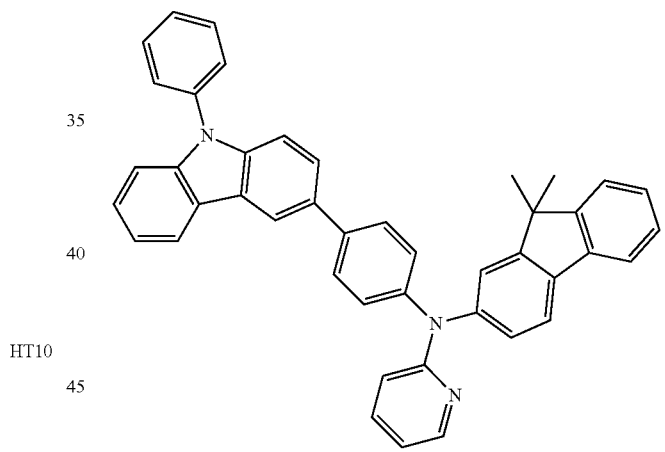
HT13
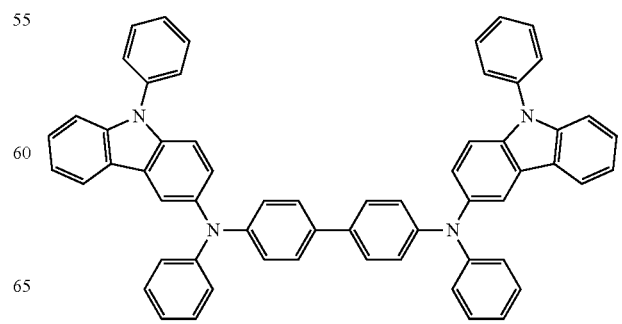

HT14

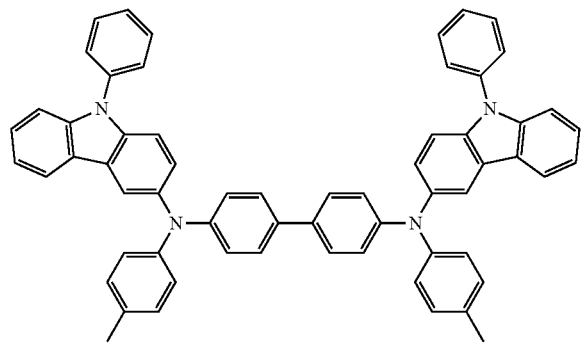

HT15

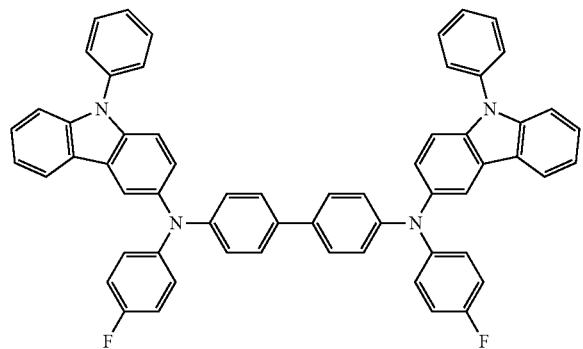

HT16

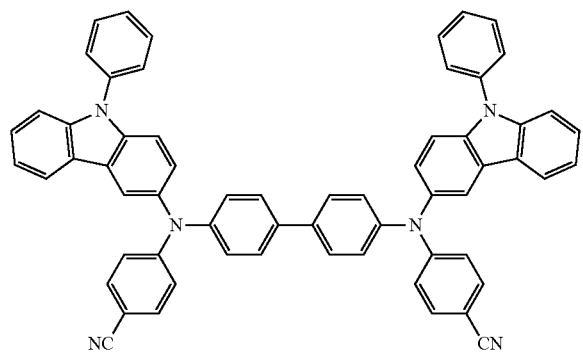

HT17

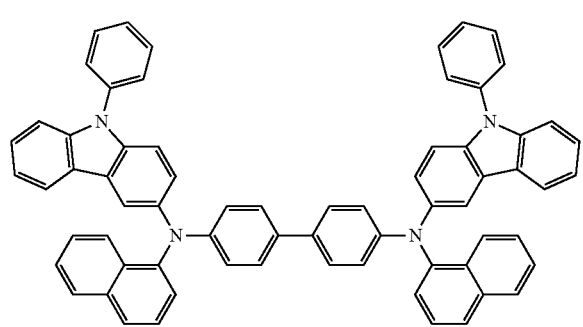

HT18

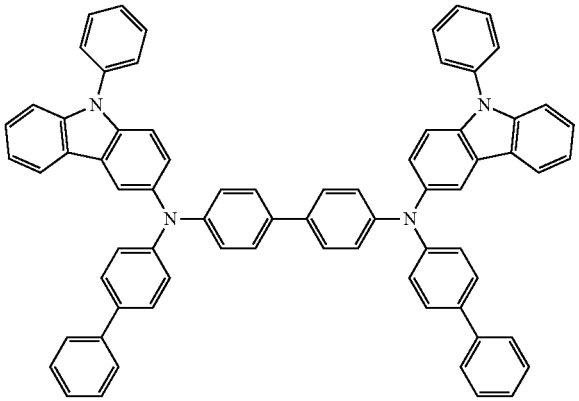

HT19

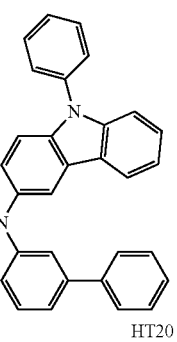

HT20

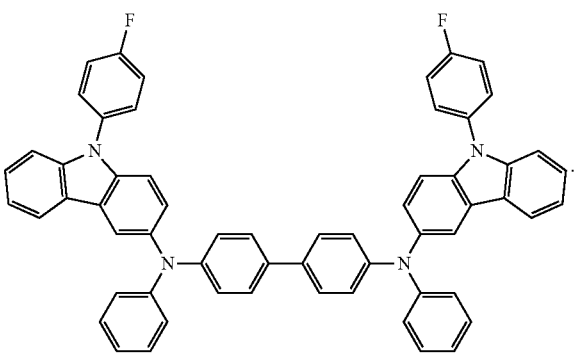

A thickness of the hole transport region may be in a range of about 100 Å to about 10,000 Å, for example, about 100 Å to about 1,000 Å. When the hole transport region includes a hole injection layer and a hole transport layer, the thickness of the hole injection layer may be in a range of about 100 Å to about 10,000 Å, for example, about 100 Å to about 1,000 Å, and the thickness of the hole transport layer may be in a range of about 50 Å to about 2,000 Å, for example, about 100 Å to about 1,500 Å. Maintaining the thicknesses of the hole transport region, the hole injection layer, and the hole transport layer within these ranges may help provide excellent hole transport characteristics without a substantial increase in driving voltage.

The hole transport region may further include, in addition to the mentioned materials above, a charge-generating material to improve conductive properties. The charge-generating material may be homogeneously or non-homogeneously dispersed throughout the hole transport region.

The charge-generating material may be, for example, a p-type dopant. The p-type dopant may be selected from, for example, a quinone derivative, a metal oxide, and a cyano group-containing compound. Examples of the p-type dopant include a quinone derivative, such as tetracyanoquinonedimethane (TCNQ) or 2.3.5.6-tetrafluoro-tetracyano-1,4-benzoquinonedimethane (F4-TCNQ; a metal oxide, such as a tungsten oxide or a molybdenum oxide, and Compound HATCN illustrated below.

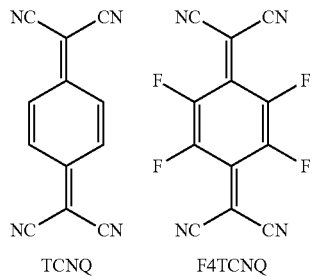

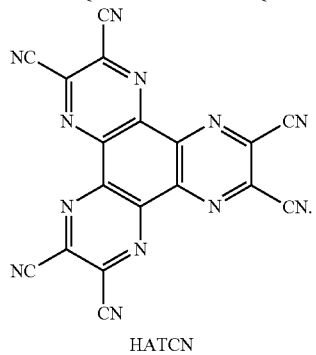

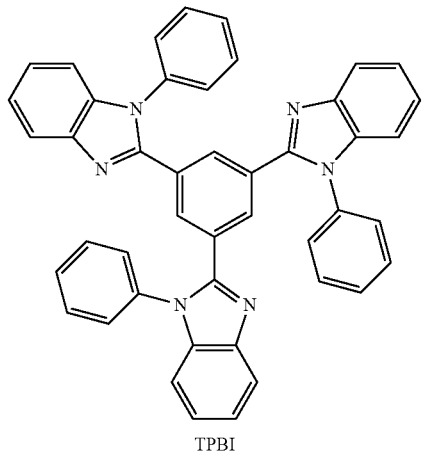

TPBI

Optionally, the hole transport region may further include one or more of a buffer layer (not illustrated) or an electron blocking layer (EBL, not illustrated), in addition to the hole injection layer, the hole transport layer, and the auxiliary layer. Since the buffer layer may compensate for an optical resonance distance according to a wavelength of light emitted from the emission layer, light-emission efficiency of a formed organic light-emitting device may be improved. For use as a material included in the buffer layer, materials that are included in the hole transport region may be used. The electron blocking layer prevents injection of electrons from the electron transport region.

The emission layer is formed on the first electrode or the hole transport region using a various methods, such as vacuum deposition, spin coating, casting, LB deposition, inkjet printing, laser-printing, or LITI. When the emission layer is formed by vacuum deposition or spin coating, deposition and coating conditions for the emission layer may be determined by referring to the deposition and coating conditions for the hole injection layer.

The organic light-emitting device may be a full color organic light-emitting device, and the emission layer may be patterned into a red emission layer, a green emission layer, or a blue emission layer, according to a sub pixel. In an embodiment, the emission layer may have a stacked structure of a red emission layer, a green emission layer, and a blue emission layer, or may include a red-light emission material, a green-light emission material, and a blue-light emission material, which are mixed with each other in a single layer, to emit white light.

The emission layer may include a host and a dopant.

The host may include one or more of TPBi, TBADN, ADN (also known as "DNA"), CBP, CDBP, or TCP:

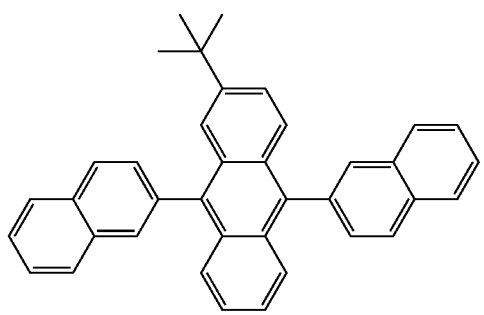

TBADN

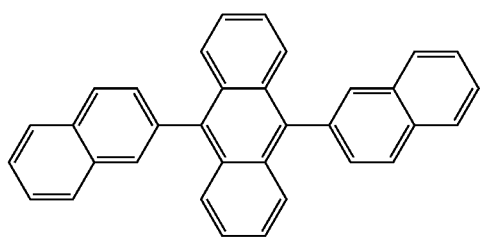

ADN

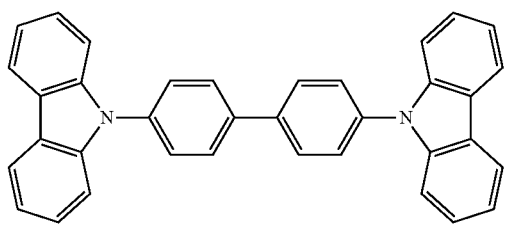

CBP

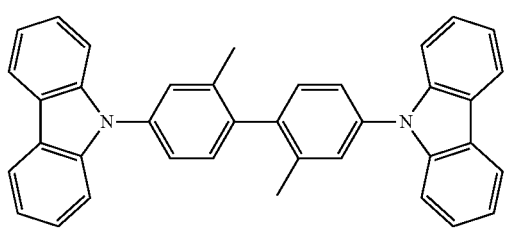

CDBP

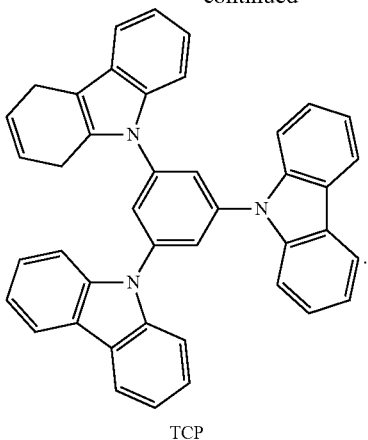

TCP

In an embodiment, the host may further include a compound represented by Formula 301:

$$Ar_{301}\text{-}[(L_{301})_{xb1}\text{-}R_{301}]_{xb2} \qquad <\text{Formula 301}>$$

wherein in Formula 301, $Ar_{301}$ may be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent $C_2$-$C_{60}$ non-aromatic condensed polycyclic group, and —Si($Q_{301}$)($Q_{302}$)($Q_{303}$); wherein $Q_{301}$ to $Q_{303}$ may each independently be selected from a hydrogen, a $C_1$-$C_{60}$ alkyl group, a $C_2$-$C_{60}$ alkenyl group, a $C_6$-$C_{60}$ aryl group, or a $C_2$-$C_{60}$ heteroaryl group;

The descriptions for $L_{301}$ may be the same as defined in connection with $L_{201}$;

$R_{301}$ may be selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

xb1 may be selected from 0, 1, 2, and 3;
xb2 may be selected from 1, 2, 3, and 4;
In some embodiments, in Formula 301,
$L_{301}$ may be selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, or a chrysenyl group;

$R_{301}$ may be selected from, for example, a $C_1$-$C_{20}$ alkyl group and a $C_1$-$C_{10}$ alkoxy group;

a $C_1$-$C_{20}$ alkyl group and a $C_1$-$C_{20}$ alkoxy group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, or a chrysenyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, or a chrysenyl group.

In an embodiment, the host may include a compound represented by Formula 301A:

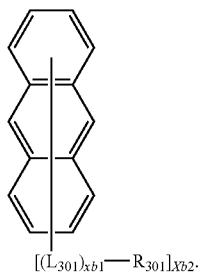

<Formula 301A>

$[(L_{301})_{xb1}\text{---}R_{301}]_{Xb2}.$

The descriptions for Formula 301A may be understood by referring to the descriptions provided herein.

The compound represented by Formula 301 may include, for example, one or more of Compounds H1 to H42 below:

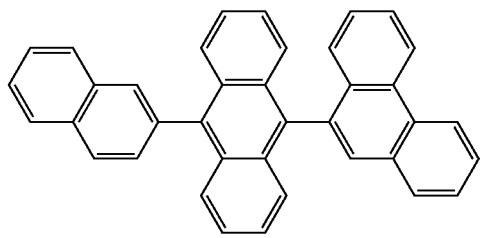
H1

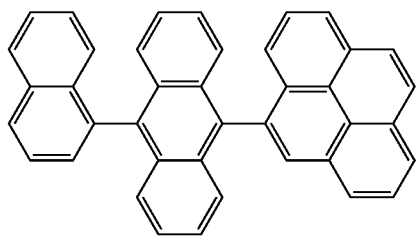
H2

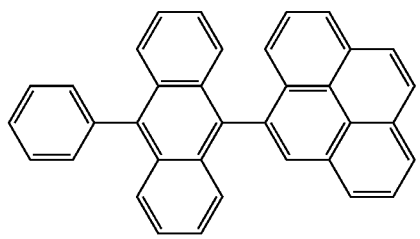
H3

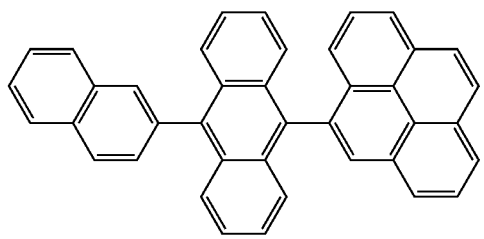
H4

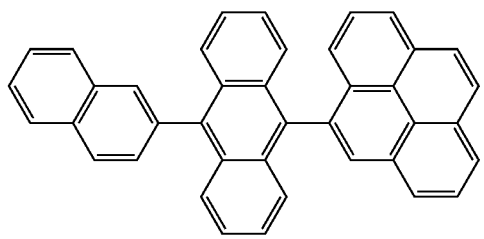
H5

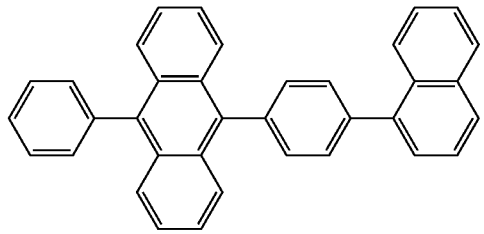
H6

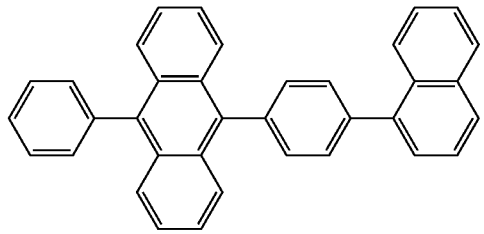
H7

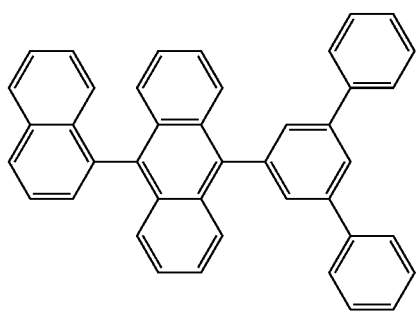
H8

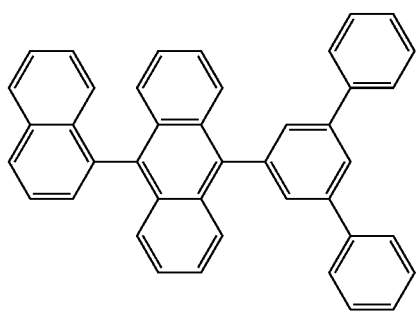
H9

-continued
H10
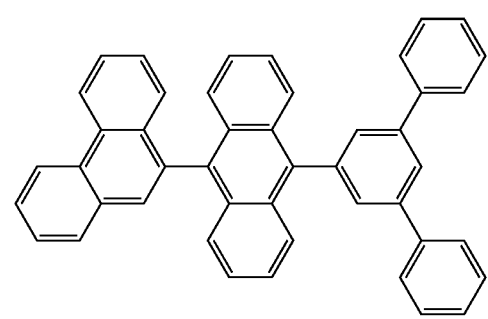
H11
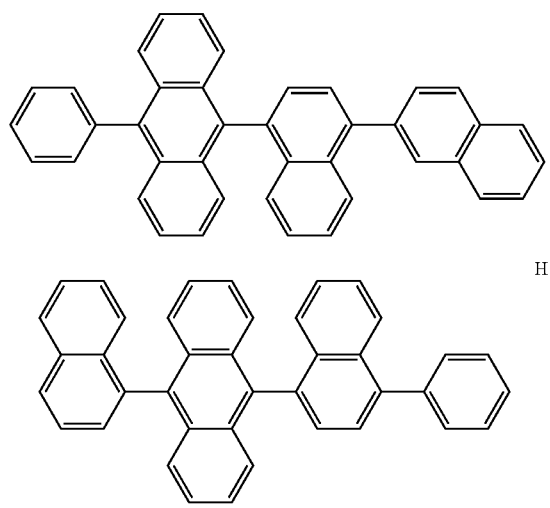
H12
H13
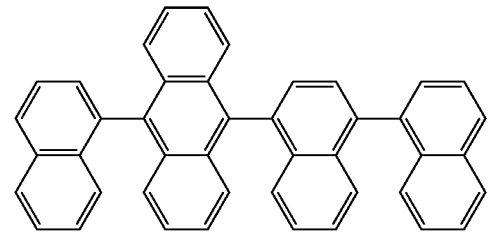
H14
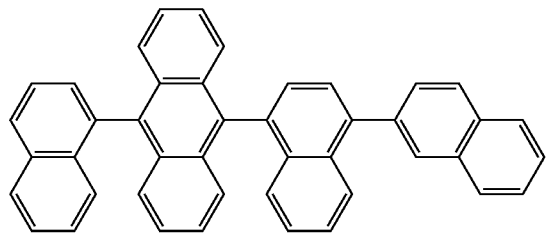
H15
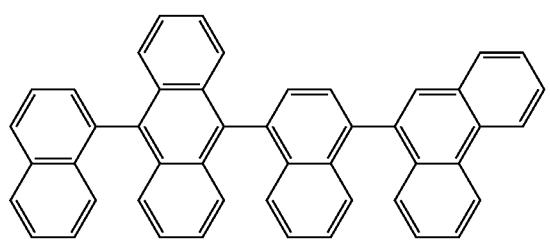
-continued
H16
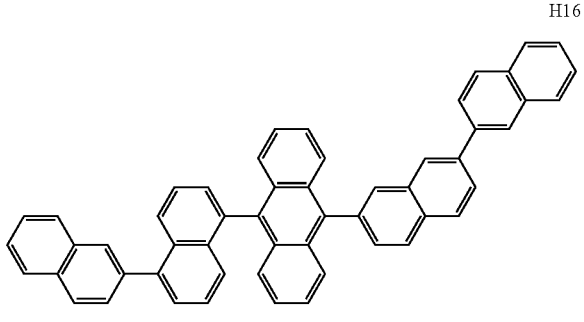
H17
H18
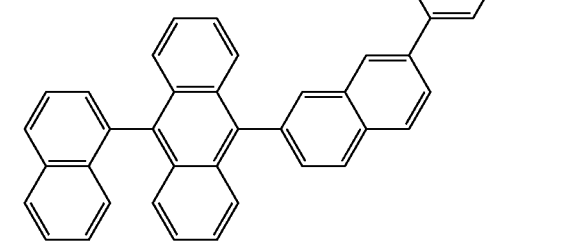
H19
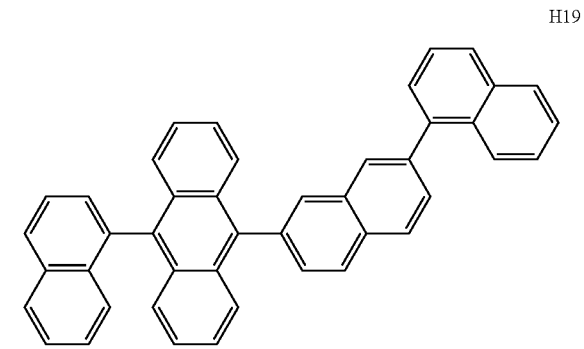

-continued

H20

H21

H22

H23

H24

H25

H26

H27

H28

H29

H30

H31
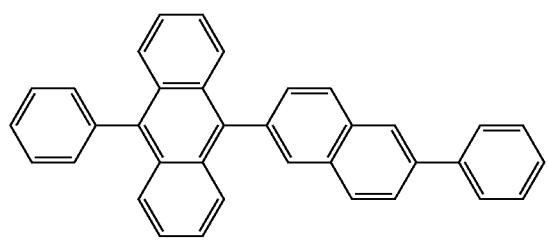
H32
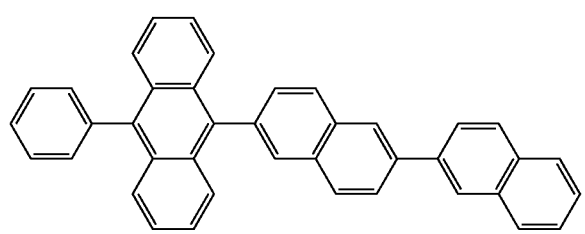
H33
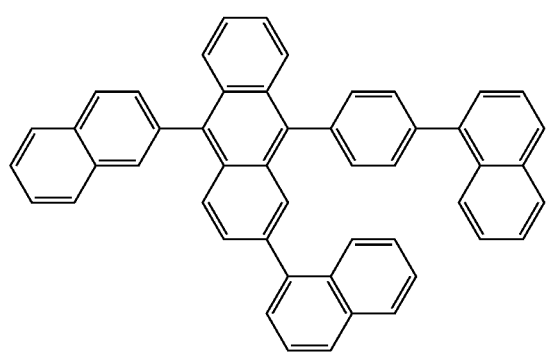
H34
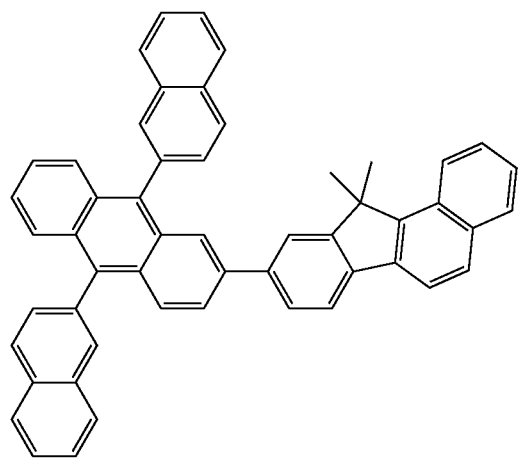
H35
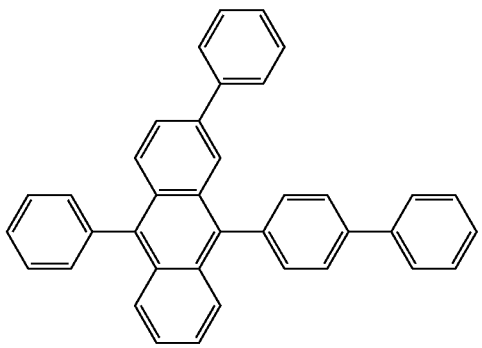
H36
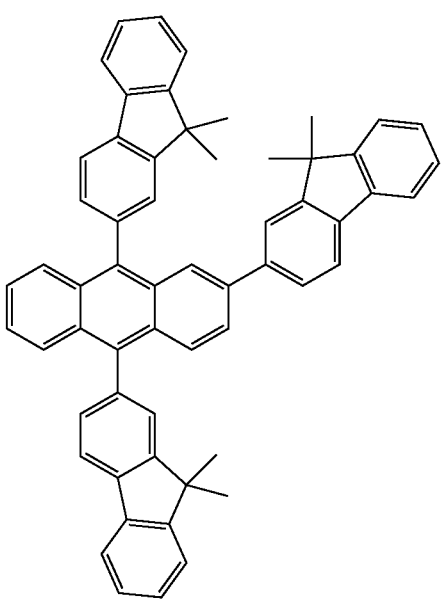
H37
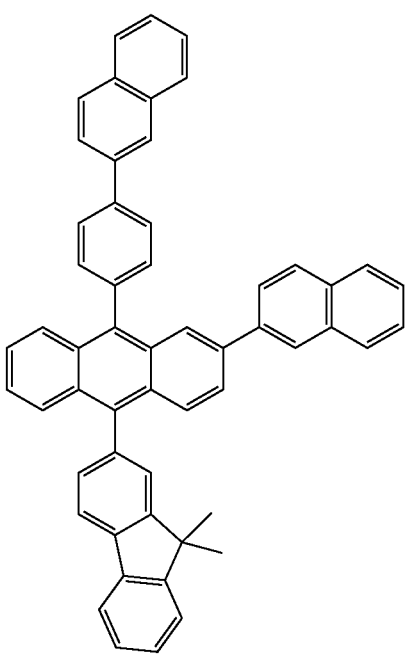

H38
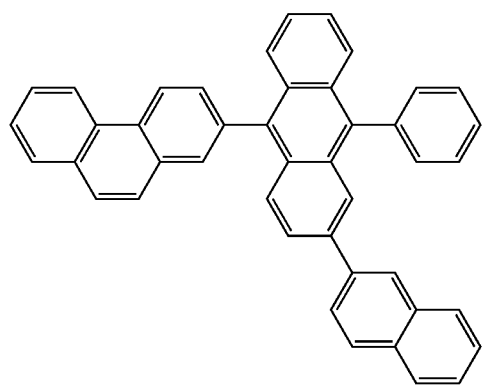
H39
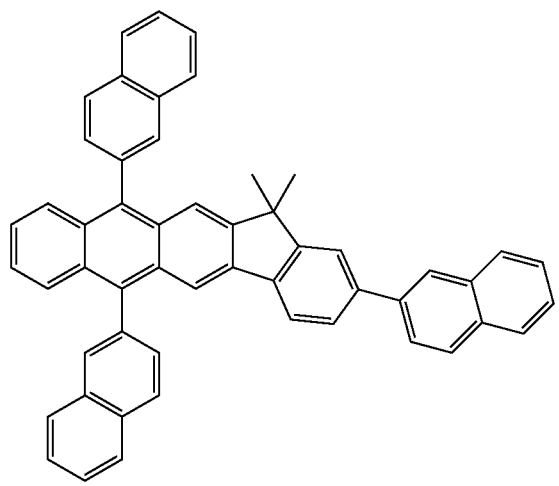
H40
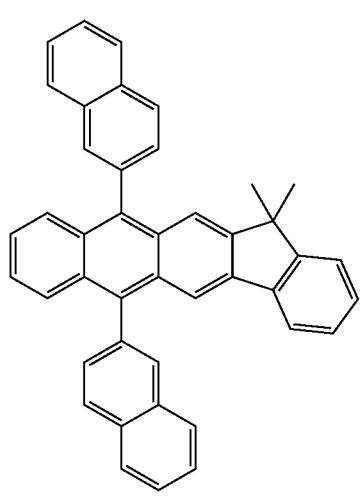
H41
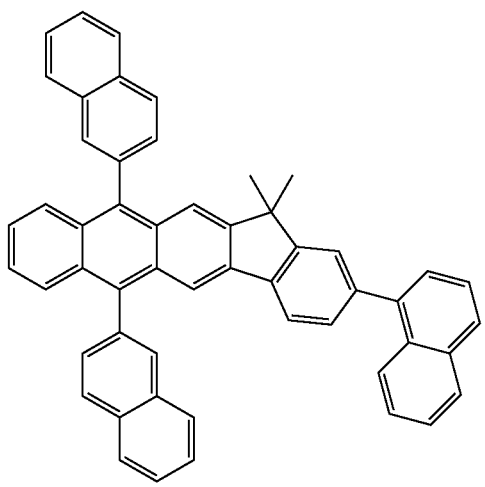
H42
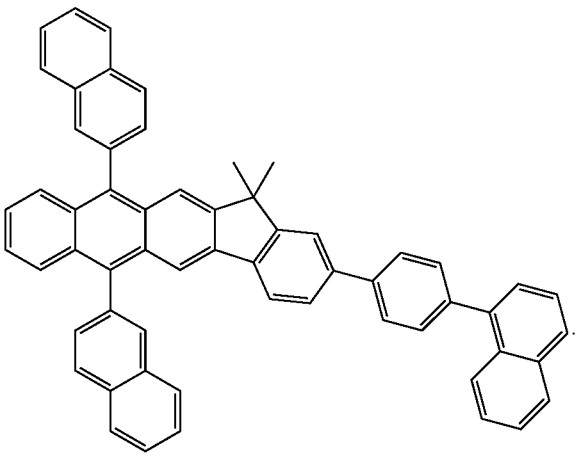
In some embodiments, the host may include, for example, one or more of Compounds H43 to H49 below:
H43
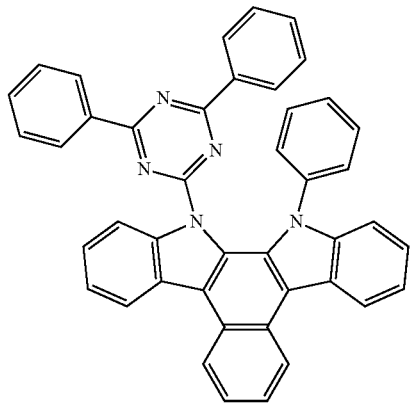

-continued

H44 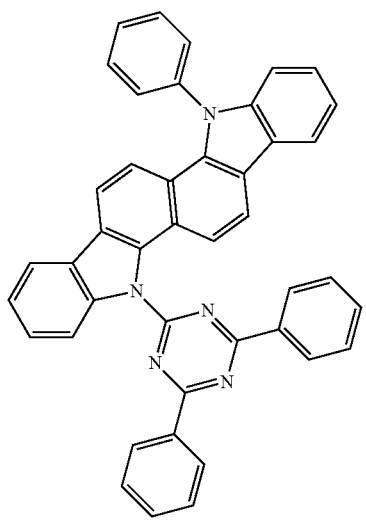

H45 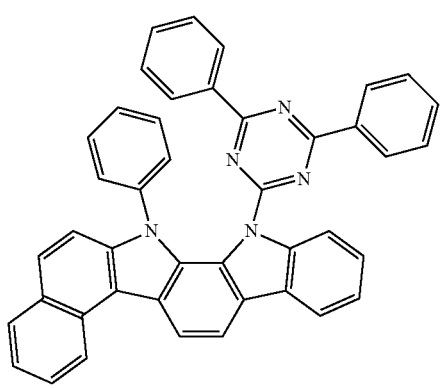

H46 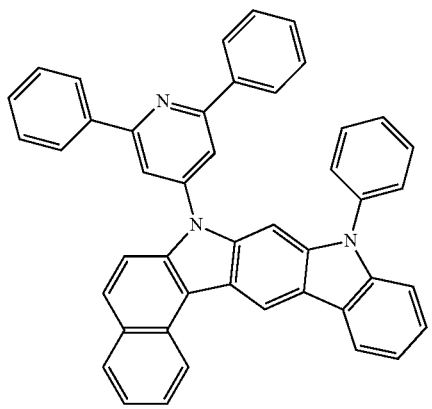

H47 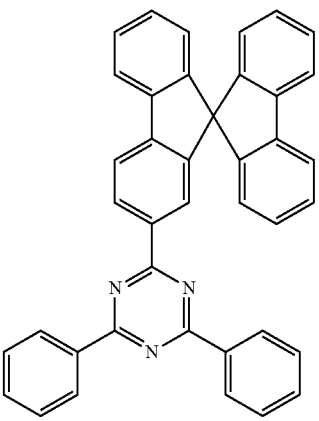

H48 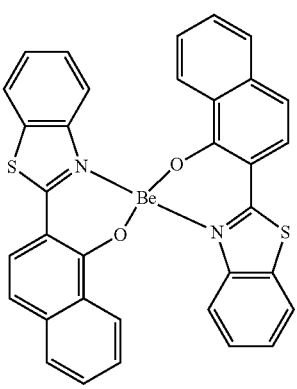

H49

The dopant may be one or more of a fluorescent dopant or a phosphorescent dopant. For example, the phosphorescent dopant may be an organometallic complex including Ir, Pt, Os, Re, Ti, Zr, Hf, or a combination of at least two thereof.

Examples of blue dopant include the compounds below, including $F_2$Irpic (bis[3,5-dilluoro-2-(2-pyridyl)phenyl](picolinato)iridium(III)), $(F_2ppy)_2$Ir(tmd), Ir(dfppz) DPVBi (4,4'-bis(2,2'-diphenylethen-1-yl)biphenyl), DPAVBi (4,4''-bis[4-(diphenylamino)styryl]biphenyl), and TBPe (2,5,8,11-tetra-tert-butyl perylene).

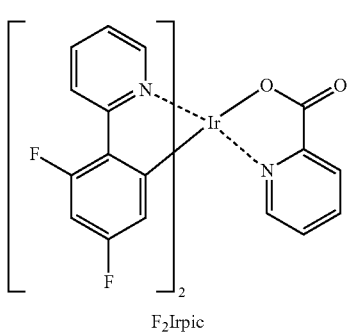
F₂Irpic
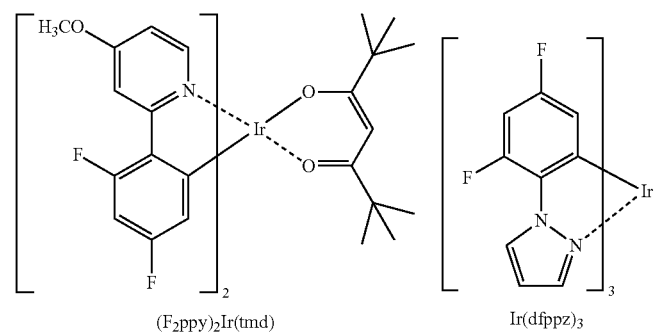
(F₂ppy)₂Ir(tmd)    Ir(dfppz)₃
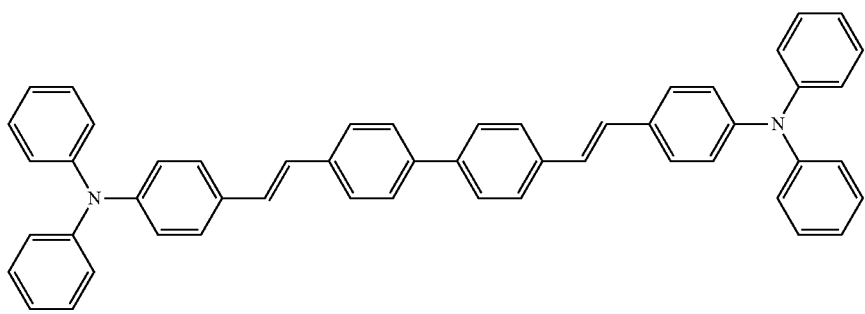
DPAVBi
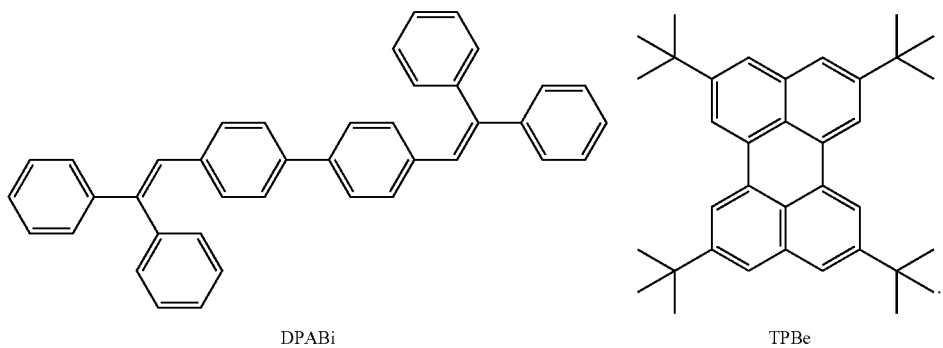
DPABi    TPBe
In an embodiment, the blue dopant may be, for example, one or more of the compounds below.
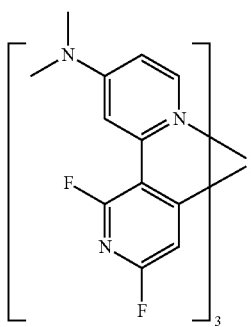
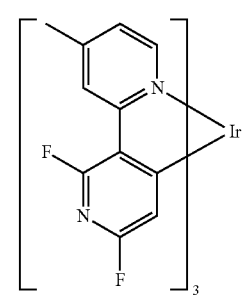
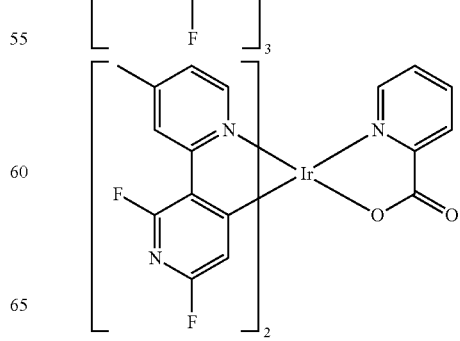
-continued

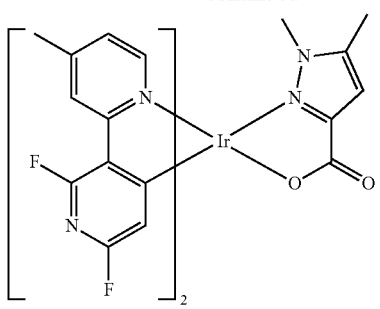

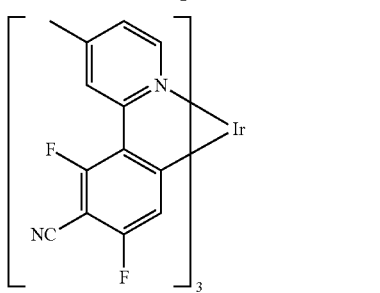

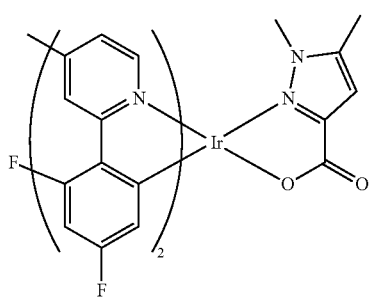

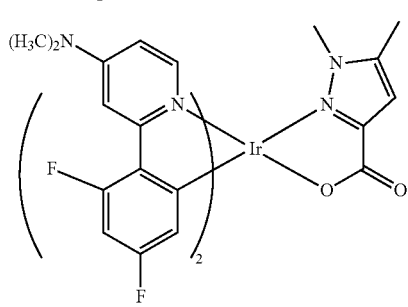

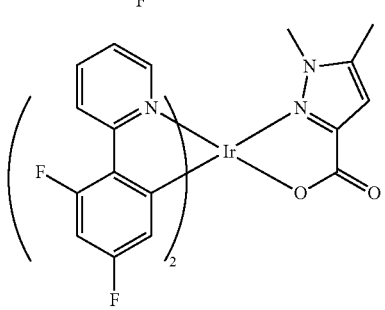

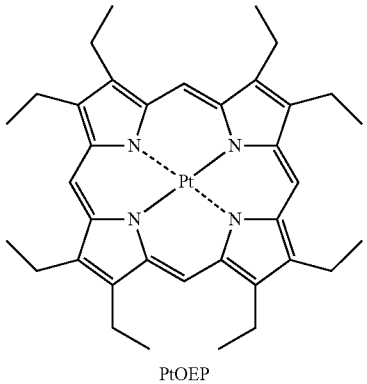

PtOEP

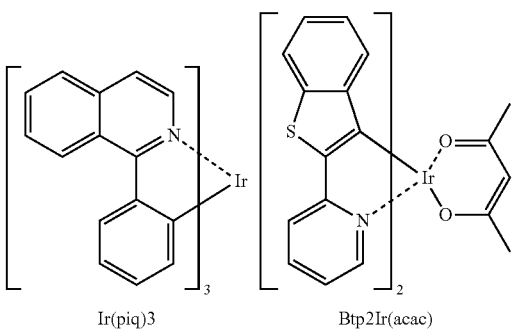

Ir(piq)3      Btp2Ir(acac)

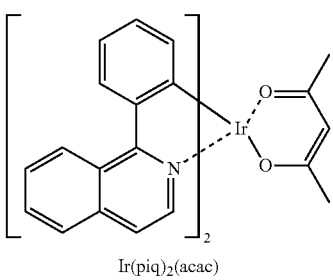

Ir(piq)2(acac)

Examples of red dopant include PtOEP (Pt(II) octaethylporphine), Ir(piq)3 (tris(2-phenylisoquinoline)iridium), Btp2Ir(acac) (bis(2-(2'-benzothienyl)-pyridinato-N,C3') iridium(acetylacetonate)), DCM (4-(dicyanomethylene)-2-methyl-6-[p-(dimethylamino)styryl]-4H-pyran), or DCJTB (4-(dicyanomethylene)-2-tert-butyl-6-(1,1,7,7-tetramethyljulolidyl-9-enyl)-4H-pyran).

Ir(2-phq)2(acac)      Ir(2-phq)3

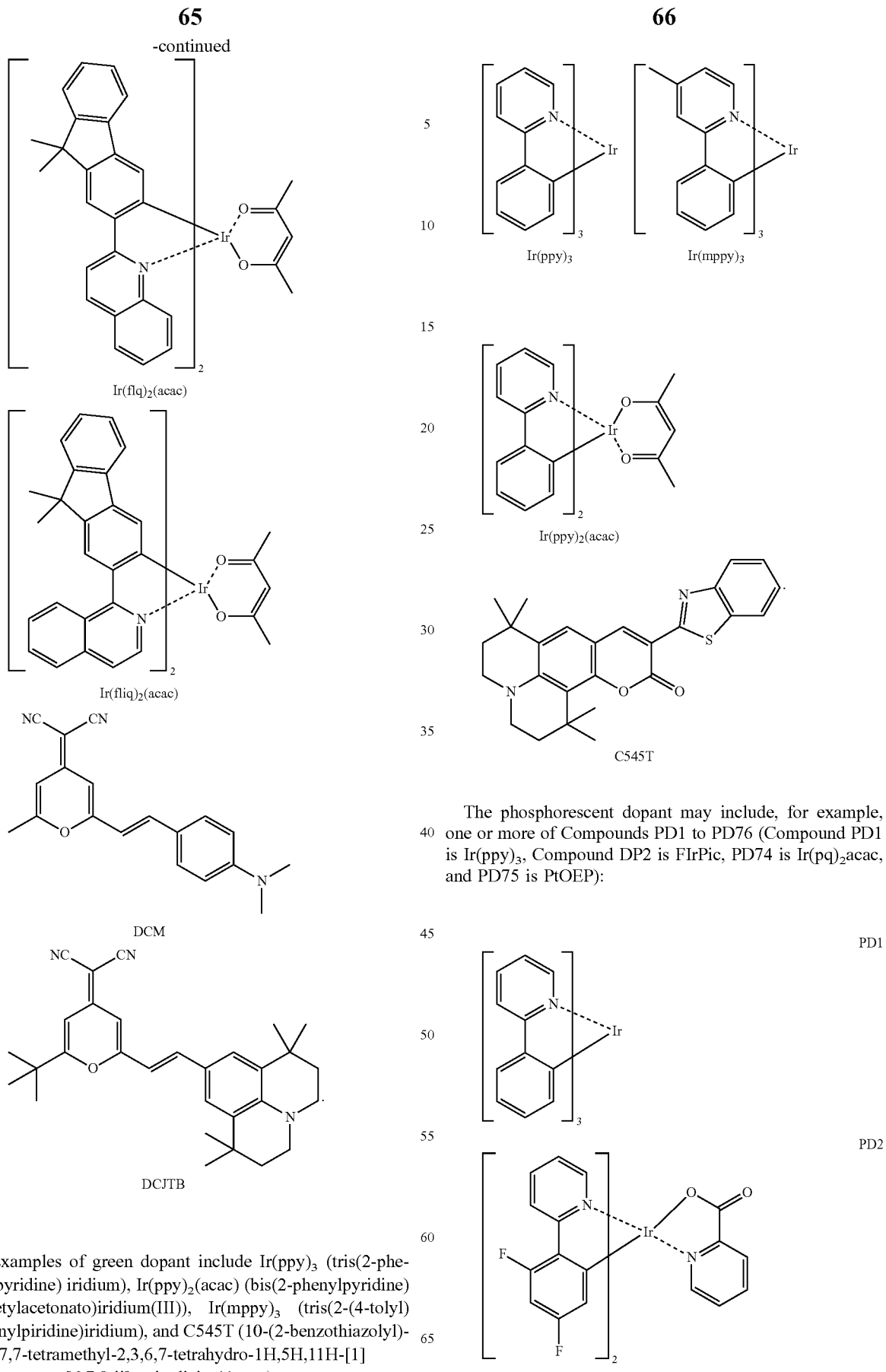

Examples of green dopant include Ir(ppy)₃ (tris(2-phenylpyridine) iridium), Ir(ppy)₂(acac) (bis(2-phenylpyridine)(acetylacetonato)iridium(III)), Ir(mppy)₃ (tris(2-(4-tolyl)phenylpiridine)iridium), and C545T (10-(2-benzothiazolyl)-1,1,7,7-tetramethyl-2,3,6,7-tetrahydro-1H,5H,11H-[1]benzopyrano[6,7,8-ij]-quinolizin-11-one).

The phosphorescent dopant may include, for example, one or more of Compounds PD1 to PD76 (Compound PD1 is Ir(ppy)₃, Compound DP2 is FIrPic, PD74 is Ir(pq)₂acac, and PD75 is PtOEP):

PD3
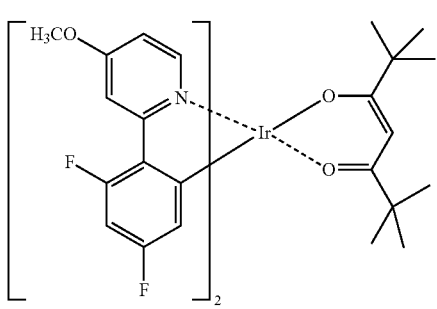
PD8
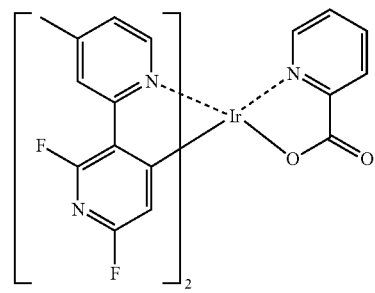
PD4
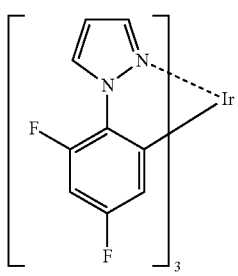
PD9
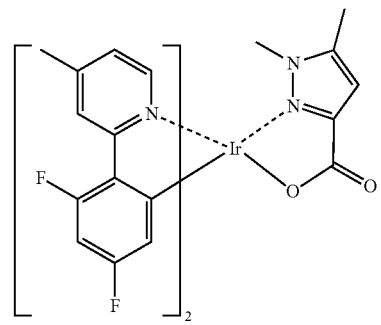
PD5
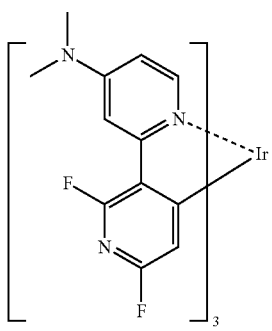
PD10
PD6
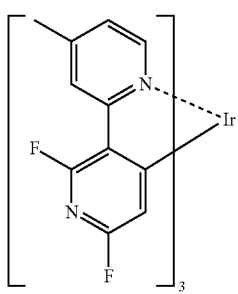
PD11
PD7
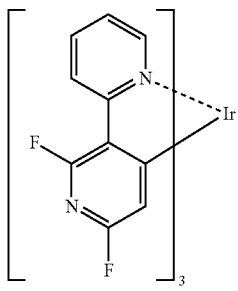
PD12
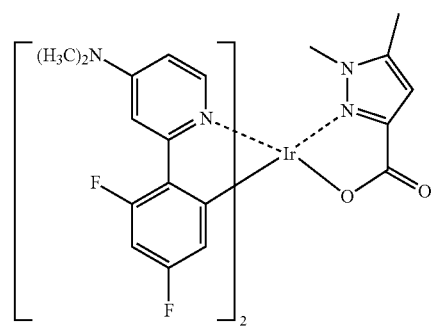

PD13 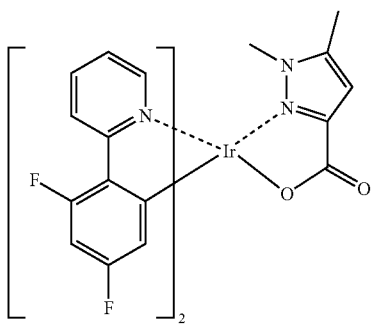
PD14 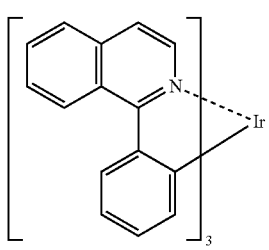
PD15 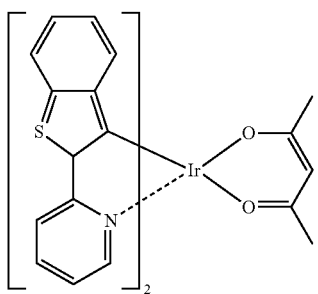
PD16 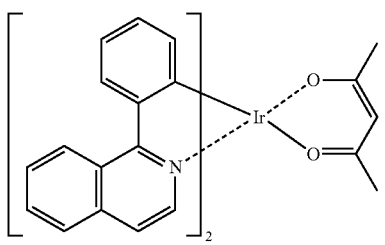
PD17 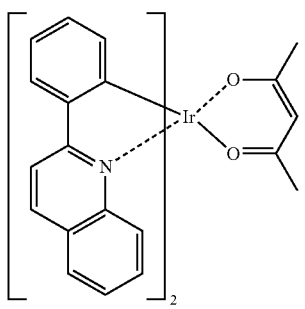
PD18 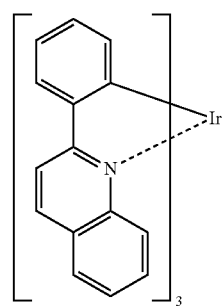
PD19 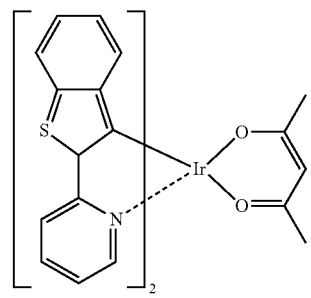
PD20 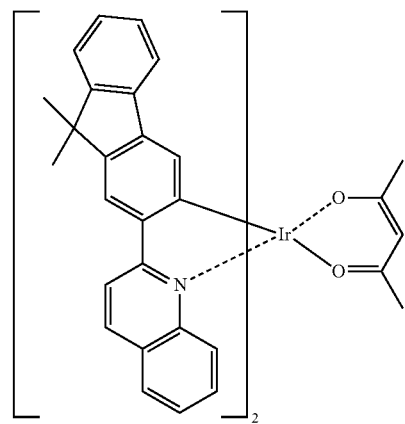
PD21 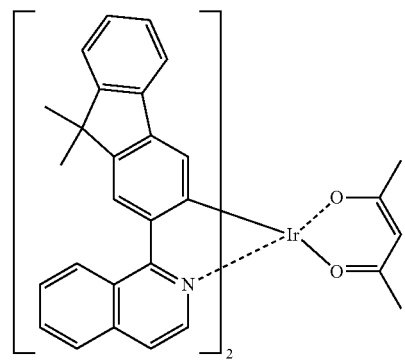
PD22 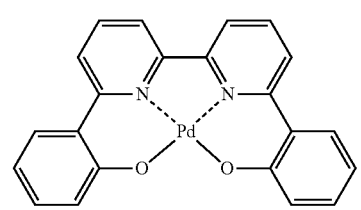

PD23 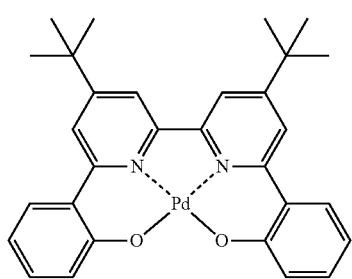
PD24 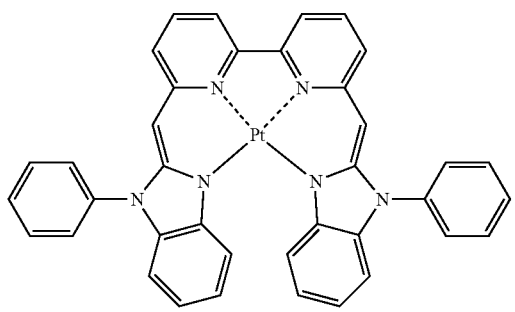
PD25 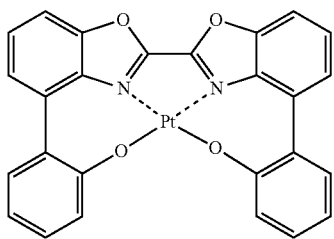
PD26 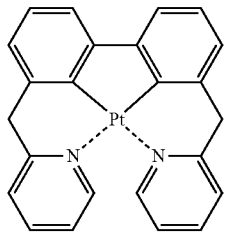
PD27 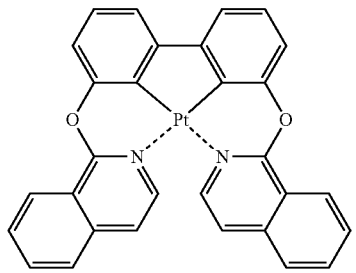
PD28 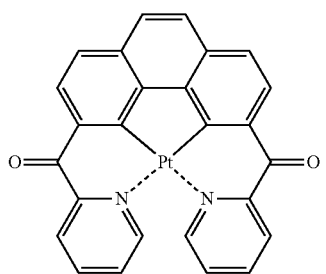
PD29 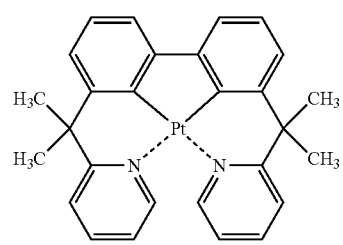
PD30 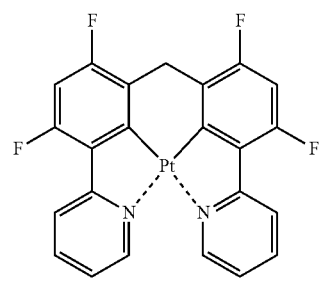
PD31 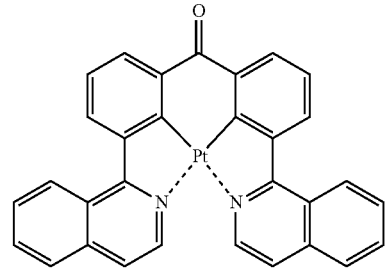
PD32 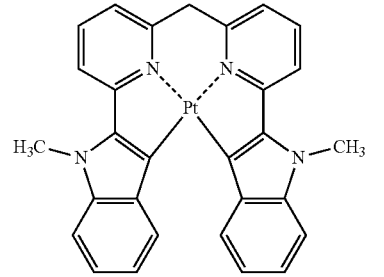
PD33 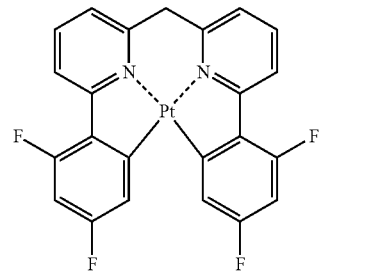
PD34 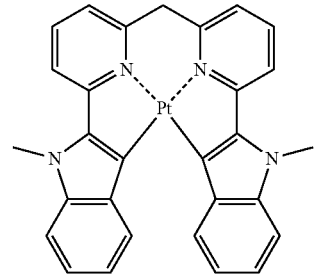

-continued
PD35
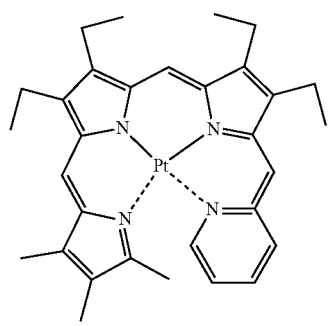
PD36
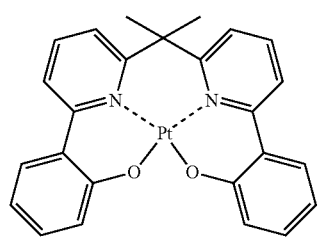
PD37
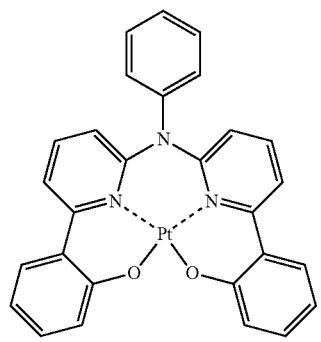
PD38
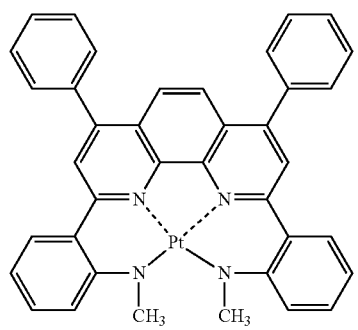
PD39
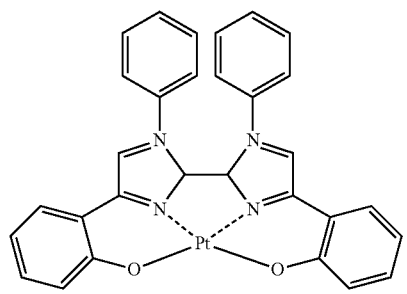
-continued
PD40
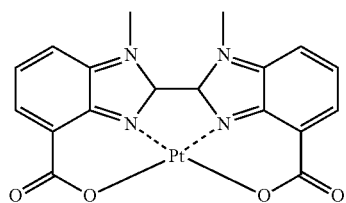
PD41
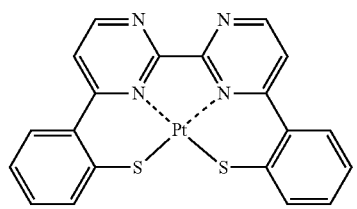
PD42
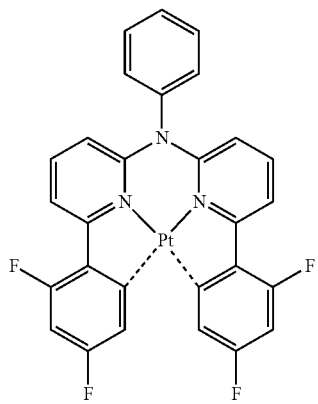
PD43
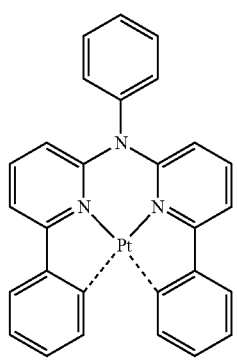
PD44
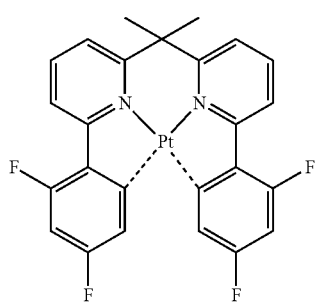

PD45 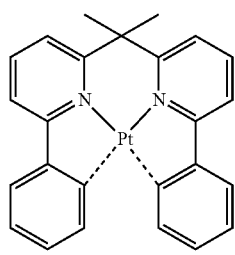
PD46 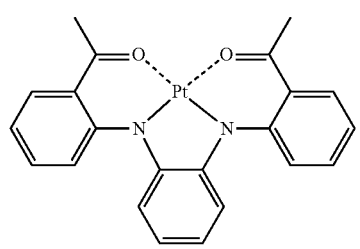
PD47 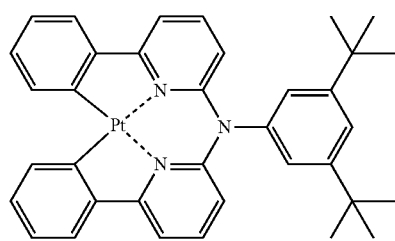
PD48 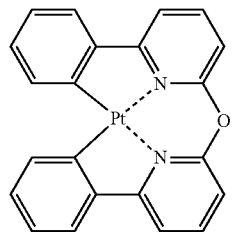
PD49 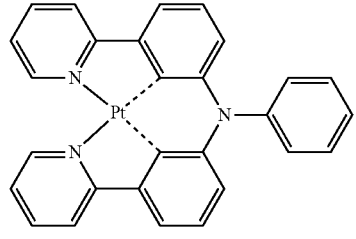
PD50 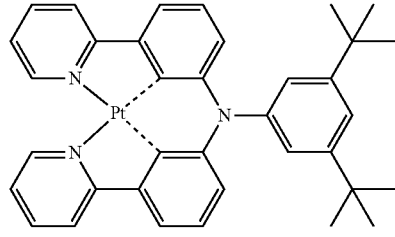
PD51 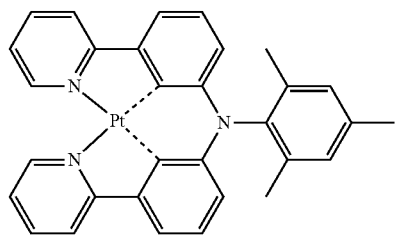
PD52 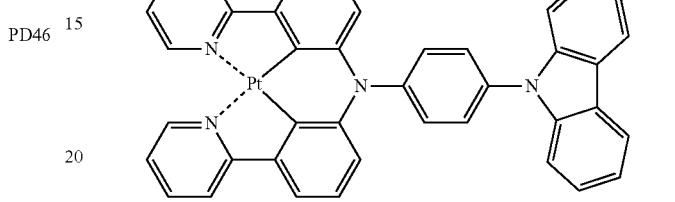
PD53 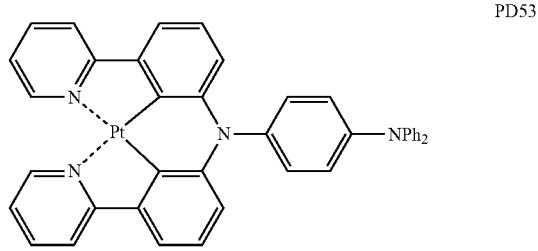
PD54 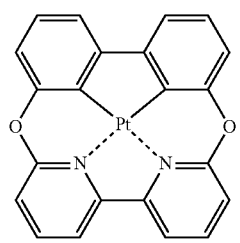
PD55 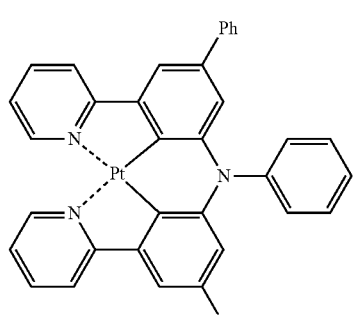
PD56 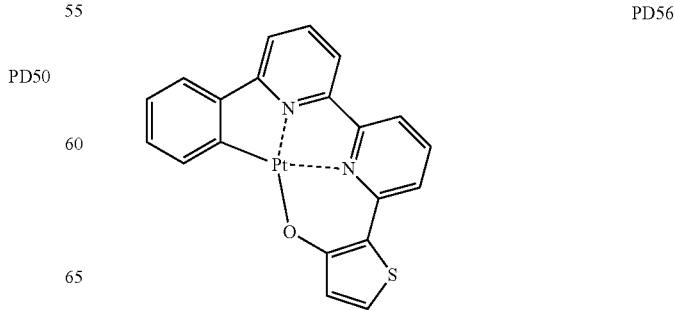

PD57 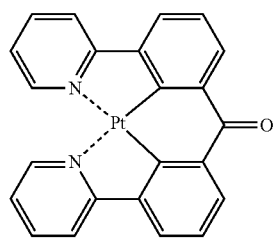
PD58 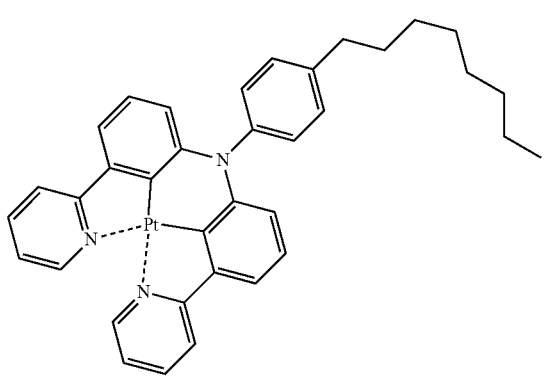
PD59 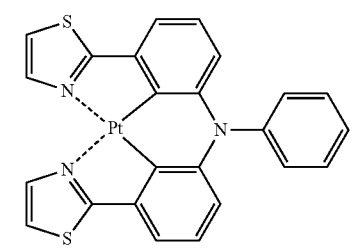
PD60 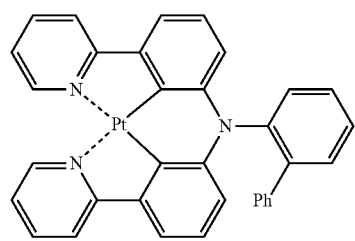
PD61 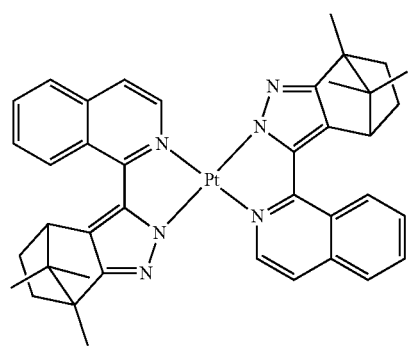
PD62 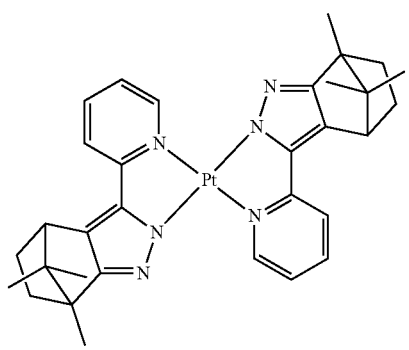
PD63 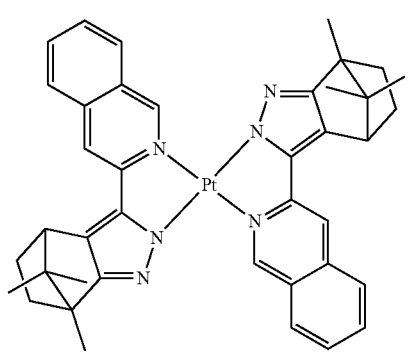
PD64 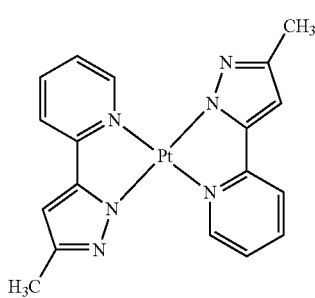
PD65 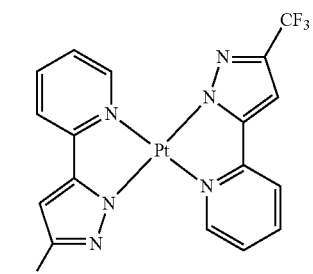
PD66 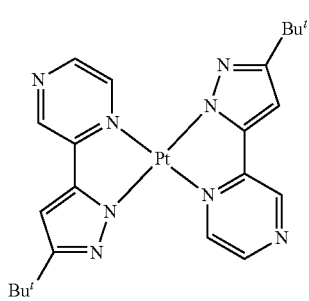

-continued
PD67 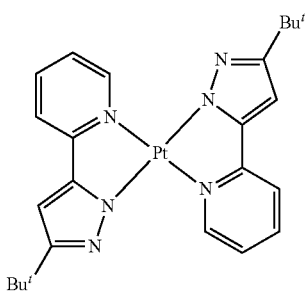
PD68 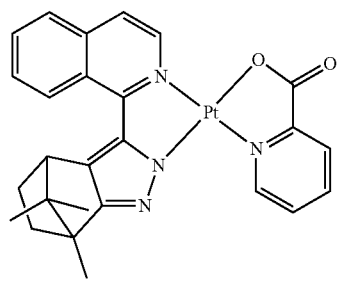
PD69 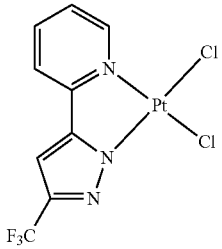
PD70 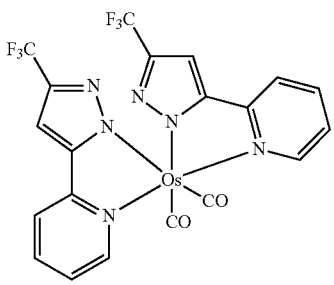
PD71 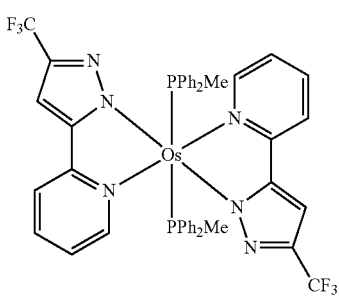
-continued
PD72 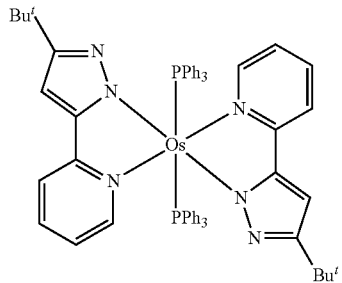
PD73 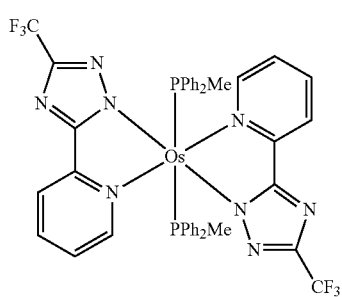
PD74 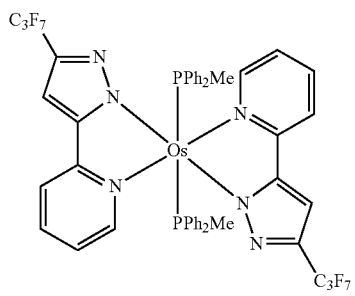
PD75 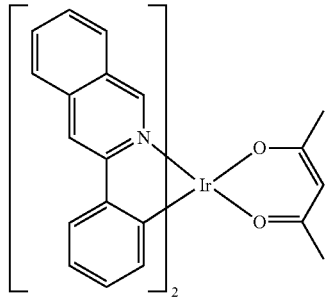
PD76 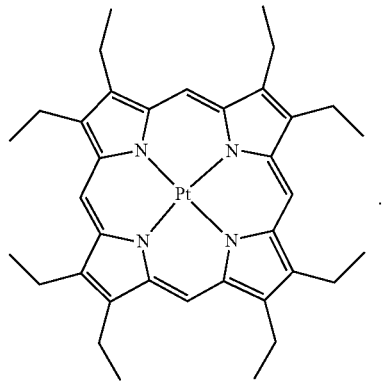

An amount of the dopant in the emission layer may be, for example, in a range of about 0.01 to about 15 parts by weight based on 100 parts by weight of the host.

A thickness of the emission layer may be in a range of about 100 Å to about 1,000 Å, for example, about 200 Å to about 600 Å. Maintaining the thickness of the emission layer within this range may help provide excellent light-emission characteristics without a substantial increase in driving voltage.

An electron transport region may be present between the emission layer and the second electrode. The electron transport region may include one or more of, for example, a hole blocking layer (HBL), an electron transport layer (ETL), an electron injection layer (EIL), or an electron injection transport layer (EIHL). For example, the electron transport region may have a structure of, for example, an electron transport layer, an electron transport layer/an electron injection layer, or a structure of a hole blocking layer/an electron transport layer/an electron injection layer, wherein layers of each structure are sequentially stacked from the emission layer in the stated order. The organic light-emitting device of FIG. 1 includes an electron transport layer and an electron injection layer between the emission layer and the second electrode.

Optionally, when the emission layer includes a phosphorescent dopant, a hole blocking layer may be formed to prevent diffusion of triplet excitons or holes into the electron transport layer.

The electron transport region may include a hole blocking layer, and the hole blocking layer may be formed on the emission layer using various methods, such as vacuum deposition, spin coating, casting, a LB method, ink-jet printing, laser-printing, or LITI. When the hole blocking layer is formed by vacuum deposition or spin coating, deposition and coating conditions for the hole blocking layer may be determined by referring to the deposition and coating conditions for the hole injection layer.

The hole blocking layer may include, for example, one or more of BCP or Bphen.

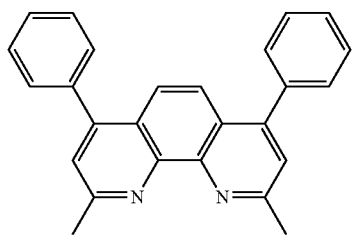

BCP

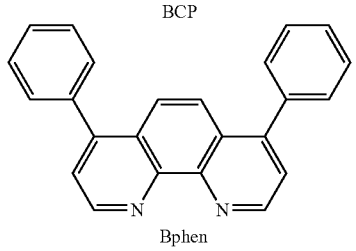

Bphen

A thickness of the hole blocking layer may be in a range of about 20 Å to about 1,000 Å, for example, about 30 Å to about 300 Å. Maintaining the thickness of the hole blocking layer within this range may help provide excellent hole blocking characteristics without a substantial increase in driving voltage.

The electron transport layer may be formed on the emission layer or the hole blocking layer using various methods, such as vacuum deposition, spin coating, casting, a LB method, ink-jet printing, laser-printing, or LITI. When the electron transport layer is formed using vacuum deposition or spin coating, vacuum deposition and coating conditions for the electron transport layer may be determined by referring to the vacuum deposition and coating conditions for the hole injection layer.

The electron transport layer may include one or more of BCP, Bphen, Alq$_3$, BAlq, TAZ, or NTAZ.

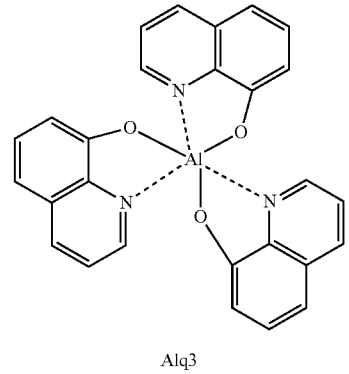

Alq3

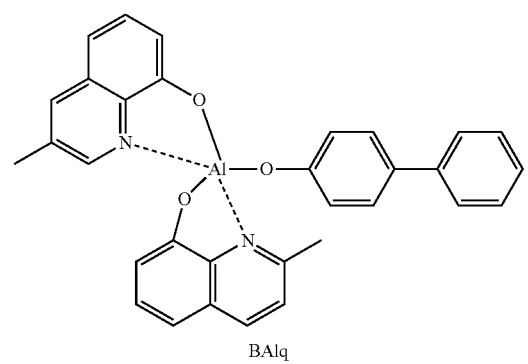

BAlq

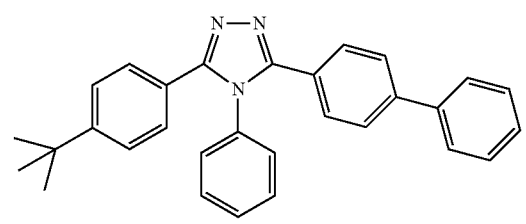

TAZ

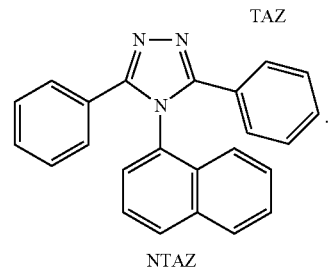

NTAZ

In an embodiment, the electron transport layer may include one or more compounds represented by Formula 601 below:

$$Ar_{601}\text{-}[L_{601}]_{xe1}\text{-}E_{601}]_{xe2} \qquad \text{<Formula 601>}$$

wherein in Formula 601,

The descriptions for $Ar_{601}$ may be the same as defined in connection with $Ar_{301}$ herein;

The descriptions for $L_{601}$ may be the same as defined in connection with $L_{201}$ herein;

$E_{601}$ may be selected from a pyrrolyl group, a thiophenyl group, a furanyl group, a imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenylgroup, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{10}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, or a dibenzocarbazolyl group;

xe1 may be selected from 0, 1, 2, and 3; and xe2 may be selected from 1, 2, 3, and 4.

In an embodiment, the electron transport layer may include one or more compounds represented by Formula 602 below:

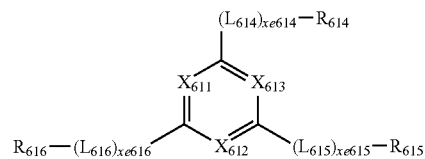

<Formula 602> wherein in Formula 602, $X_{611}$ may be N or C-$(L_{611})xe_{611}$-$R_{611}$;

$X_{612}$ may be N or C-$(L_{612})xe_{612}$-$R_{612}$;

$X_{613}$ may be N or C-$(L_{613})xe_{613}$-$R_{613}$; and one or more of $X_{611}$ to $X_{613}$ may be N;

The descriptions for $L_{611}$ to $L_{616}$ may be the same as defined in connection with $L_{201}$ herein;

$R_{611}$ to $R_{616}$ may each independently be selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

$xe_{611}$ to $xe_{616}$ may each independently be selected from 0, 1, 2, and 3.
The compound represented by Formula 601 and the compound represented by Formula 602 may each independently include one of Compounds ET1 to ET15 illustrated below:
ET1
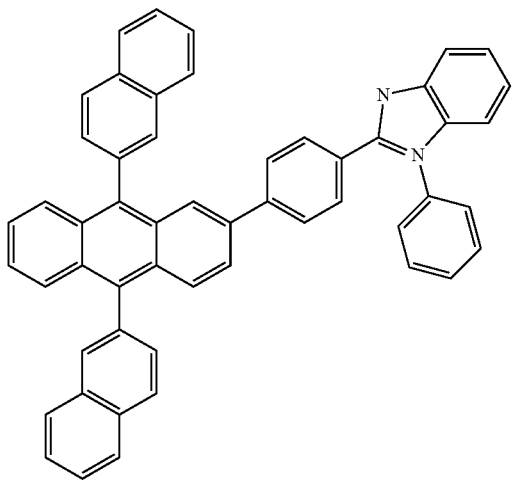
ET2
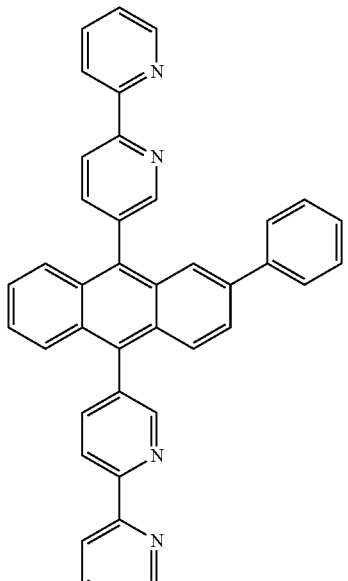
ET4
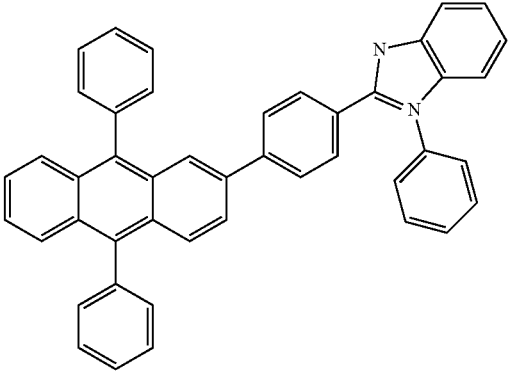
ET5
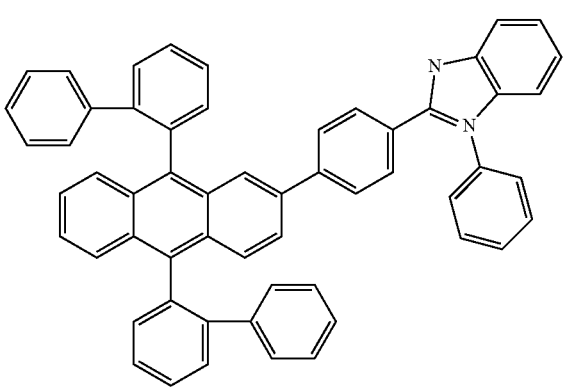
ET6
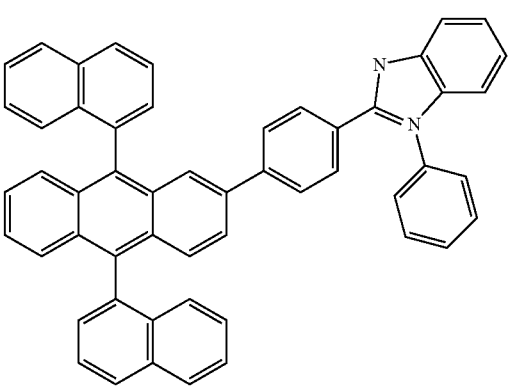

ET7
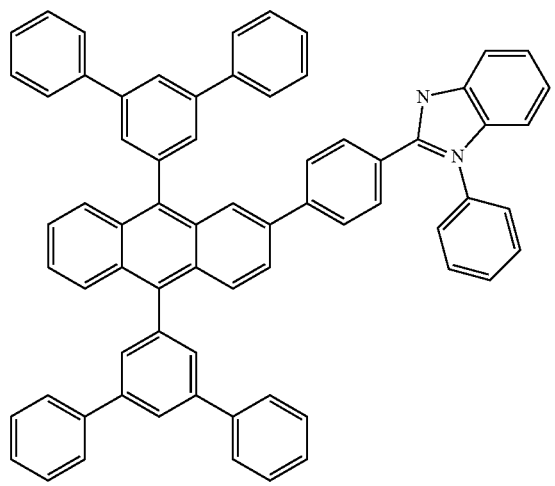
ET8
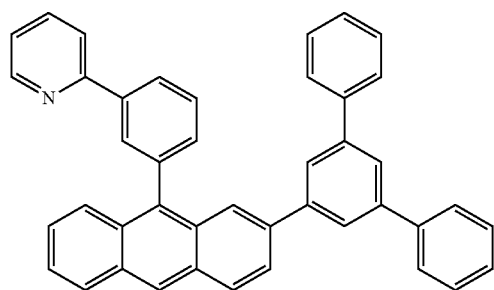
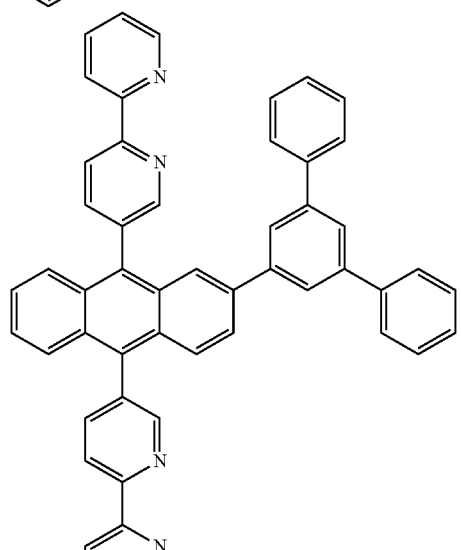
ET10
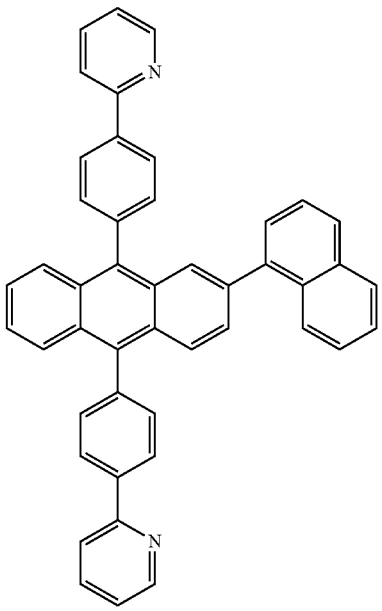
ET11
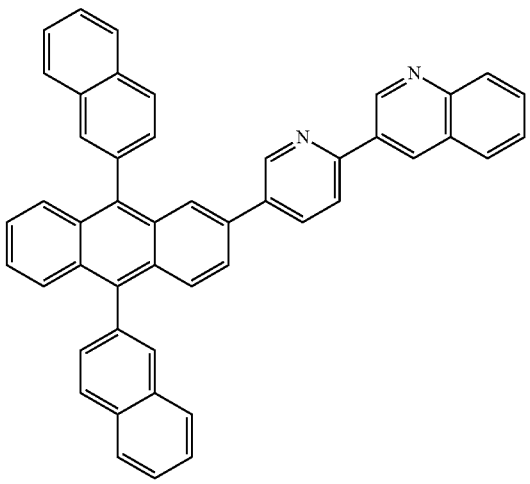
ET12
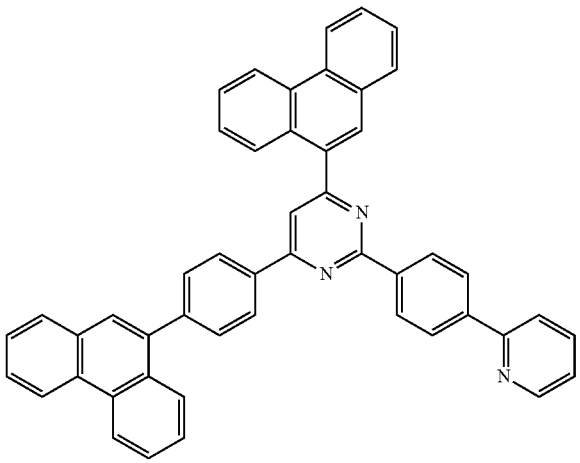

ET13

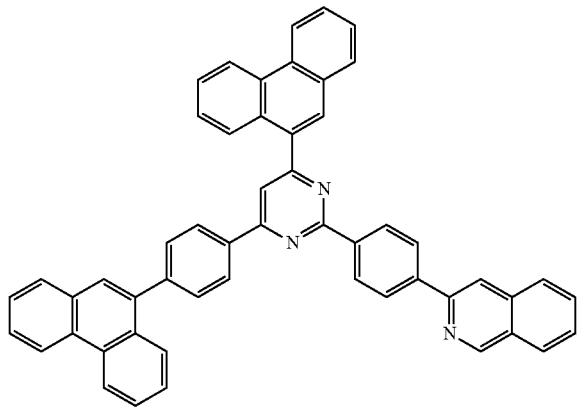

ET14

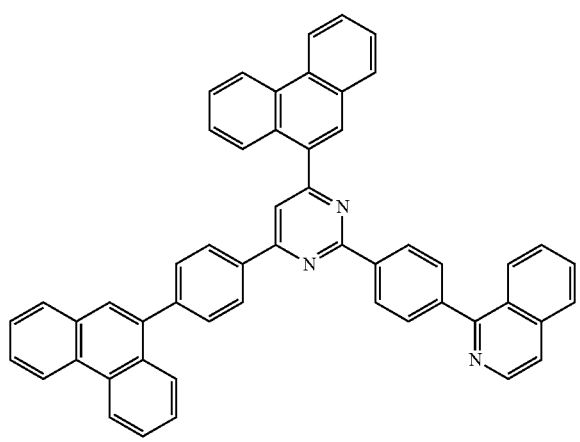

ET15

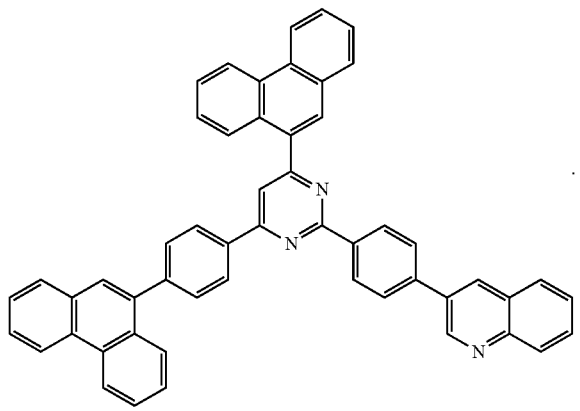

A thickness of the electron transport layer may be in a range of about 100 Å to about 1.000 Å, for example, about 150 Å to about 500 Å. Maintaining the thickness of the electron transport layer within this range may help provide excellent electron transport characteristics without a substantial increase in driving voltage.

The electron transport layer may further include a metal-containing material in addition to the materials described above.

The metal-containing material may include a Li complex. For example, the Li complex may include lithium quinolate (LiQ) or LiBTz (lithium[2-(2-hydroxyphenyl)benzothiazole]).

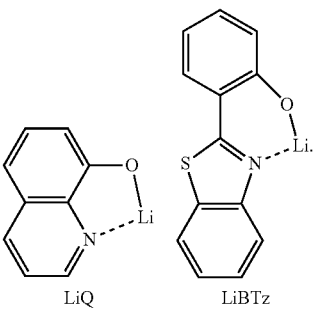

LiQ LiBTz

The electron injection layer may facilitate injection of electrons from the second electrode.

The electron injection layer may be formed on the electron transport layer using various methods, such as vacuum deposition, spin coating, casting, a LB method, ink-jet printing, laser-printing, or LITI. When the electron injection layer is formed by vacuum deposition or spin coating, vacuum deposition and coating conditions for the electron injection layer may be determined by referring to the vacuum deposition and coating conditions for the hole injection layer.

For example, the electron injection layer may include one or more of LiF, NaCl, CsF, $Li_2O$, BaO, or LiQ.

A thickness of the electron injection layer may be in a range of about 1 Å to about 100 Å, for example, about 3 Å to about 90 Å. Maintaining the thickness of the electron injection layer within this range may help provide excellent electron injection characteristics without a substantial increase in driving voltage.

As described above, the second electrode may be disposed on the electron injection layer. The second electrode may be a cathode that is an electron injection electrode, and in this regard, a material for forming the second electrode may be a material having a low work function, and such a material may be a metal, an alloy, an electrically conductive compound, or a mixture thereof. Detailed examples of the second electrode are such as lithium (Li), magnesium (Mg), aluminum (Al), aluminum-lithium (Al—Li), calcium (Ca), magnesium-indium (Mg—In), or magnesium-silver (Mg—Ag). In some embodiments, the material for forming the second electrode may be ITO or IZO. The second electrode may be a reflective electrode, a semi-transmissive electrode, or a transmissive electrode.

Hereinbefore, an exemplary organic light-emitting device has been described with reference to FIG. 1.

An alkyl group used herein refers to a linear or branched aliphatic hydrocarbon monovalent group, and detailed examples thereof are a methyl group, an ethyl group, a propyl group, an isobutyl group, a sec-butyl group, a tert-butyl group, a pentyl group, an iso-amyl group, and a hexyl group. An alkylene group used herein refers to a divalent group having the same structure as the alkyl group.

An alkoxy group used herein refers to a monovalent group represented by —$OA_{101}$ (wherein $A_{101}$ is the $C_1$-$C_{60}$ alkyl group), and detailed examples thereof are such as a methoxy group, an ethoxy group, or an isopropyloxy group.

An alkenyl group used herein refers to a structure formed by substituting at least one carbon double bond in the middle or terminal of the alkyl group, and detailed examples thereof are such as an ethenyl group, a propenyl group, or a butenyl group. An alkenylene group used herein refers to a divalent group having the same structure as the alkenyl group.

An alkynyl group used herein refers to a structure formed by substituting at least one carbon triple bond in the middle or terminal of the alkyl group, and detailed examples thereof are such as an ethynyl group or a propynyl group. An alkynylene group used herein refers to a divalent group having the same structure as the alkynyl group.

A cycloalkyl group used herein refers to a monovalent monocyclic saturated hydrocarbon group, and detailed examples thereof are such as a cyclopropyl group, a cyclobutyl group, a cyclopentyl group, a cyclohexyl group, or a cycloheptyl group. A cycloalkylene group used herein refers to a divalent group having the same structure as a $C_3$-$C_{10}$ cycloalkyl group.

A heterocycloalkyl group used herein refers to a monovalent monocyclic group including at least one hetero atom selected from N, O, P, and S as a ring-forming atom, and detailed examples thereof are such as a tetrahydrofuranyl group or a tetrahydrothiophenyl group. A heterocycloalkylene group used herein refers to a divalent group having the same structure as the heterocycloalkyl group.

A cycloalkenyl group used herein refers to a monovalent monocyclic group including at least one double bond in the ring thereof and having no aromacity, and detailed examples thereof are such as a cyclopentenyl group, a cyclohexenyl group, or a cycloheptenyl group. A cycloalkenylene group used herein refers to a divalent group having the same structure as the cycloalkenyl group.

A heterocycloalkenyl group used herein refers to a monovalent monocyclic group including at least one hetero atom selected from N, O, P, and S as a ring-forming atom and at least one double bond in the ring thereof. Detailed examples of the heterocycloalkenyl group are such as a 2,3-hydrofuranyl group or 2,3-hydrothiophenyl group. A hetetocycloalkenylene group used herein refers to a divalent group having the same structure as the heterocycloalkenyl group.

An aryl group used herein refers to a monovalent group having a carbocyclic aromatic system, and an arylene group refers to a divalent group having a carbocyclic aromatic system. Detailed examples of the aryl group are such as a phenyl group, a naphthyl group, an anthracenyl group, a phenanthrenyl group, a pyrenyl group, or a chrysenyl group. When each of the aryl group and the arylene group includes two or more rings, a plurality of the rings may be fused to each other.

A heteroaryl group used herein refers to a monovalent group having a carbocyclic aromatic system having at least one hetero atom selected from N, O, P, and S as a ring-forming atom. A heteroarylene group used herein refers to a divalent group having a carbocyclic aromatic system having at least one hetero atom selected from N, O, P, and S as a ring-forming atom. Detailed examples of the heteroaryl group are such as a pyridinyl group, a pyrimidinyl group, a pyrazinyl group, a pyridazinyl group, a triazinyl group, a quinolinyl group, or an isoquinolinyl group. When each of the heteroaryl group and the heteroarylene group includes two or more rings, a plurality of the rings may be fused to each other.

An aryloxy group used herein refers to a group represented by —$OA_{102}$ (wherein $A_{102}$ is the aryl group), and an arylthio group refers to a group represented by —$SA_{103}$ (wherein $A_{103}$ is the aryl group).

A monovalent non-aromatic condensed polycyclic group used herein refers to a monovalent group including two or more rings condensed to each other and the whole molecule thereof has non-aromaticity. The monovalent non-aromatic condensed polycyclic group may include i) only C or ii) a hetero atom selected from N, O, P, and S, in addition to C, as a ring-forming atom. Detailed examples of the non-aromatic condensed polycyclic group are such as a heptalenyl group or a triquinacenyl group. A divalent non-aromatic condensed polycyclic group used herein refers to a divalent group having the same structure as the monovalent non-aromatic condensed polycyclic group.

As used herein, $C_m$-$C_n$ (wherein m<n) indicates that the number of carbons of a group ranges from m to n. For example, a $C_1$-$C_{10}$ alkyl group refers to an alkyl group including 1 to 10 carbon atoms, and a $C_6$-$C_{30}$ aryl group refers to an aryl group including 6 to 30 carbon atoms.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

A Corning 15 $\Omega/cm^2$ (1,200 Å) ITO glass substrate was cleaned by sonication with isopropyl alcohol and pure water for 5 minutes each, and then cleaned by exposure to ultra-violet rays and ozone for 30 minutes to form an anode. m-MTDATA was vacuum-deposited on the ITO glass substrate to form a hole injection layer having a thickness of 600 Å, and then NPB was vacuum-deposited on the hole injection layer to form a hole transport layer having a thickness of 300 Å. Compound 1 and Compound 2 were vacuum-deposited on the hole transport layer at a weight ratio of 5:5 to form an auxiliary layer having a thickness of about 100 Å. 95 wt % of ADN as a host and 5 wt % of Compound D1 as a blue dopant were deposited on the auxiliary layer to form an emission layer having a thickness of 200 Å. ET1 was vacuum-deposited on the emission layer to form an electron transport layer having a thickness of 300 Å. LiF was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

Example 2

An organic light-emitting device was manufactured in the same manner as in Example 1, except that Compound 3 instead of Compound 2 was used to form the auxiliary layer.

Comparative Example

An organic light-emitting device was manufactured in the same manner as in Example 1, except that NPB instead of Compound 1 and Compound 2 was used to form the auxiliary layer.

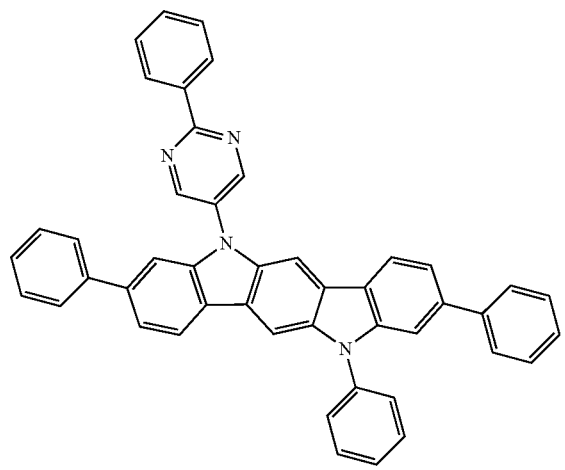

1

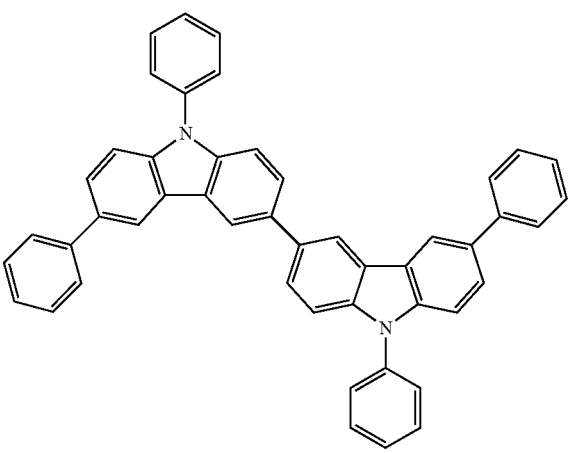

2

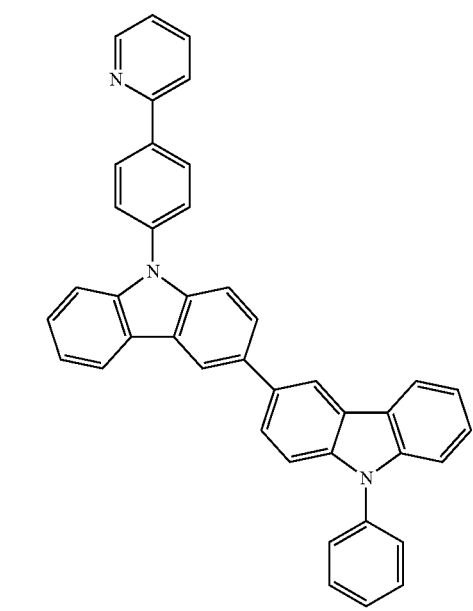

3

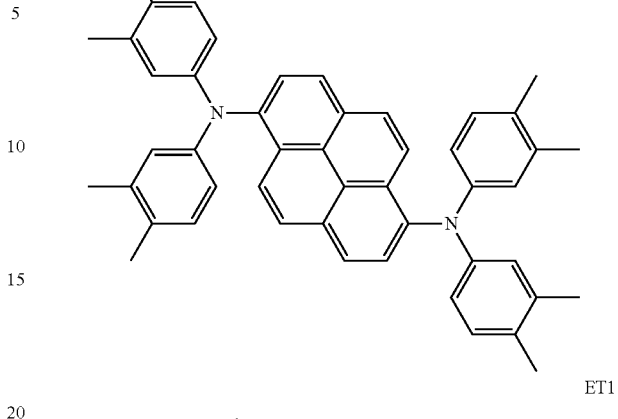

D1

ET1

Data Measurement

The driving voltages, current efficiencies, and lifetimes of the organic light-emitting devices of Examples 1, 2, and Comparative Example were measured and the results are shown in Table 1. In measuring lifetimes of the devices, the amount of time until the luminance of each device decreased to 90% of an initial luminance of 100 cd/m² was determined. The current efficiencies and lifetimes of the organic light-emitting devices of Examples 1 and 2 are represented as relative to the organic light-emitting device of Comparative Example.

TABLE 1

| | Auxiliary layer | Driving voltage [V] | Current efficiency | Lifetime |
|---|---|---|---|---|
| Example 1 | Compound 1: Compound 2 | 4.7 | 1.2 | 1.2 |
| Example 2 | Compound 1: Compound 3 | 4.85 | 1.35 | 1.05 |
| Comparative Example | NPB | 4.8 | 1 | 1 |

As can be seen from the data of Table 1, the organic light-emitting devices of Examples 1 and 2 had improved current efficiencies and improved lifetimes as compared to the organic light-emitting device of Comparative Example.

By way of summation and review, an organic light-emitting device may have a structure that includes an organic emission layer between an anode and a cathode. When voltage is applied to the device, holes from the anode and electrons from the cathodes may be injected into the organic emission layer. The injected holes and electrons may induce exchange of electrons between adjacent molecules in the organic emission layer, and may migrate towards opposite electrodes. The electrons and holes may recombine in certain molecules, and molecular excitons in a high-energy excited state may be generated. The molecular excitons may return to a low-energy ground state, and the molecular excitons may emit light of a certain color.

Holes and charges injected into the organic emission layer may be balanced, and the organic light-emitting device may have improved efficiency and improved lifetime characteristics.

As described above, according to one or more of the above exemplary embodiments, an organic light-emitting device may include a hole transport region including the compound represented by Formula 1 and the compound represented by Formula 2, and may have improved efficiency and lifetime characteristics.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light-emitting device, comprising:
a first electrode;
a second electrode facing the first electrode;
an emission layer between the first electrode and the second electrode;
a hole transport region between the first electrode and the emission layer; and
an electron transport region between the second electrode and the emission layer,
the hole transport region including a compound represented by Formula 1 below and a compound represented by Formula 2 below:

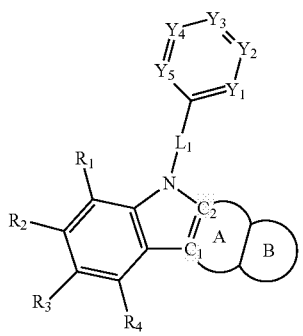

<Formula 1>

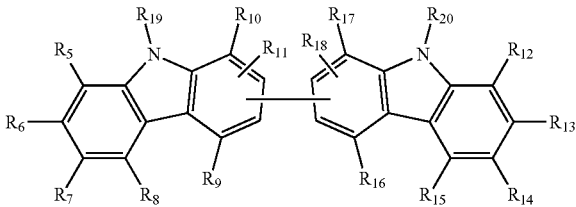

<Formula 2> wherein in Formula 1,
$Y_1$ to $Y_5$ are each independently a nitrogen (N) atom or —$CR_{21}$, and each $R_{21}$ is the same or different from each other;
$C_1$ and $C_2$ are each a carbon (C) atom:
Ring A is an aromatic ring represented by Formula 1a below, and Ring B is an aromatic ring represented by Formula 1b below and condensed with Ring A;

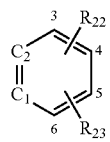

<Formula 1a>

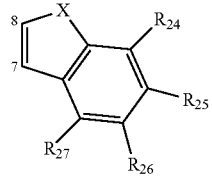

<Formula 1b> wherein the bond between 7 and 8 in Ring B represented by Formula 1b is condensed with the bond between 3 and 4, the bond between 4 and 5, or the bond between 5 and 6 in Ring A represented by Formula 1a,
X in Formula 1b is selected from —$CR_{28}R_{29}$, —$NR_{30}$, and an —O— atom,
wherein in Formula 1, Formula 2, Formula 1a, and Formula 1b,
$L_1$ and $L_2$ are each independently selected from a direct bond, a $C_6$-$C_{40}$ arylene group, and a $C_2$-$C_{40}$ heteroarylene group; and a $C_6$-$C_{40}$ arylene group and a $C_2$-$C_{40}$ heteroarylene group, each substituted with one or more of a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;
$R_1$ to $R_{30}$ are each independently selected from a hydrogen, a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, and a $C_6$-$C_{40}$ arylthio group;

a $C_1$-$C_{40}$ alkyl group, a $C_2$-$C_{40}$ alkenyl group, a $C_2$-$C_{40}$ alkynyl group, and a $C_1$-$C_{40}$ alkoxy group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, and $C_6$-$C_{40}$ arylthio group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group, wherein respective portions of $R_1$ to $R_4$ may be bound to one other so as to be condensed to the ring to which the substituents $R_1$ to $R_4$ are attached.

2. The organic light-emitting device as claimed in claim 1, wherein the hole transport region includes an auxiliary layer, and the auxiliary layer includes a compound represented by Formula 1 and a compound represented by Formula 2.

3. The organic light-emitting device as claimed in claim 2, wherein the hole transport region further includes one or more of a hole transport layer, a hole injection layer, or a hole injection transport layer.

4. The organic light-emitting device as claimed in claim 1, wherein the electron transport region includes one or more of a hole blocking layer, an electron transport layer, an electron injection layer, or an electron injection transport layer.

5. The organic light-emitting device as claimed in claim 1, wherein $L_1$ and $L_2$ are each independently selected from a direct bond, a phenylene group, a pentalenylene group, an indenylene group, a naphthylene group, an azulenylene group, an indacenylene group, an acenaphthylene group, a phenalenylene group, a fluorenylene group, a phenanthrenylene group, an anthrylene group, a fluoranthenylene group, a pyrenylene group, a naphthacenylene group, a chrysenylene group, a triphenylenylene group, a pyrrolylene group, an imidazolylene group, a pyrazolylene group, a pyridylene group, a pyrazinylene group, a pyrimidinylene group, a pyridazinylene group, an isoindolylene group, an indolylene group, an indazolylene group, a purinylene group, a quinolylene group, a quinazolinylene group, a carbazolylene group, a dibenzofuranylene group, and a dibenzothiophenylene group; and a phenylene group, a pentalenylene group, an indenylene group, a naphthylene group, an azulenylene group, an indacenylene group, an acenaphthylene group, a biphenylene group, a phenalenylene group, a fluorenylene group, a phenanthrenylene group, an anthrylene group, a fluoranthenylene group, a pyrenylene group, a benzofluorenylene group, a naphthacenylene group, a chrysenylene group, a triphenylenyl group, a pyrrolylene group, an imidazolylene group, a pyrazolylene group, a pyridylene group, a pyrazinylene group, a pyrimidinylene group, a pyridazinylene group, an isoindolylene group, an indolylene group, an indazolylene group, a purinylene group, a quinolylene group, a carbazolylene group, a dibenzofuranylene group, and a dibenzothiophenylene group, each substituted with one or more of a deuterium, a halogen atom, a hydroxyl group, a cyano group, an amino group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

6. The organic light-emitting device as claimed in claim 1, wherein $L_1$ and $L_2$ are each independently selected from a direct bond, a phenylene group, a naphthylene group, a fluorenylene group, and a pyridylene group; and a phenylene group, a naphthylene group, a fluorenylene group, and a pyridylene group, each substituted with one or more of a methyl group, an ethyl group, a butyl group, a phenyl group, or a carbazolyl group.

7. The organic light-emitting device as claimed in claim 1, wherein $L_1$ and $L_2$ are each independently selected from a direct bond and groups represented by Formulae 3A and 3B:

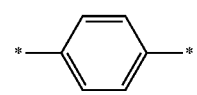

3A

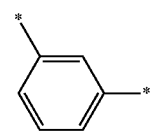

3B wherein * indicates a binding site.

8. The organic light-emitting device as claimed in claim 1, wherein $R_1$ to $R_{30}$ are each independently selected from a hydrogen, a methyl group, an ethyl group, a propyl group, a butyl group, a pentyl group, a hexyl group, a methoxy group, an ethoxy group, a propoxy group, a butoxy group, a pentoxy group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, an indolyl group, an isoindolyl group, an indolizinyl group, a benzofuryl group, an isobenzofuryl group, an indazolyl group, a benzimidazolyl group, a quinolyl group, an isoquinolyl group, a quinazolinyl group, a carbazolyl group, a benzocarbazolyl group, and a pyridoindolyl group; and a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, an indolyl group, an isoindolyl group, an indolizinyl group, a benzofuryl group, an isobenzofuryl group, an indazolyl group, a benzimidazolyl group, a quinolyl group, an isoquinolyl group, a quinazolinyl group, a carbazolyl group, a benzocarbazolyl group, and a pyridoindolyl group, each substituted with one or more of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

9. The organic light-emitting device as claimed in claim 1, wherein
$R_1$ to $R_{30}$ are each independently selected from a hydrogen atom, a methyl group, a phenyl group, a pyridyl group, a pyrimidinyl group, a pyrazinyl group, a pyridazinyl group, a triazinyl group, a quinazolinyl group; and
a phenyl group, a pyridyl group, a pyrimidinyl group, a pyrazinyl group, a pyridazinyl group, a triazinyl group, and a quinazolinyl group, each substituted with one or more of a methyl group, an ethyl group, a butyl group, a phenyl group, a biphenyl group, a pyridyl group, a quinolyl group, or a carbazolyl group.

10. The organic light-emitting device as claimed in claim 1, wherein
$R_1$ to $R_{30}$ are each independently selected from a hydrogen atom and groups represented by Formulae 4A to 4F below:

<4A>

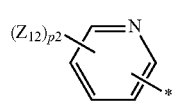
<4B>

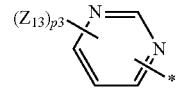
<4C>

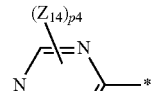
<4D>

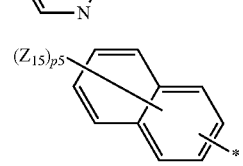
<4E>

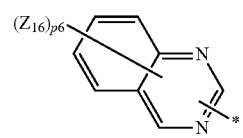
<4F> wherein in Formulae 4A to 4F, $Z_{11}$ to $Z_{16}$ are each independently selected from a deuterium atom, a halogen atom, a $C_1$-$C_{20}$ alkyl group, a $C_1$-$C_{20}$ alkoxy group, a $C_6$-$C_{40}$ aryl group, and a $C_2$-$C_{40}$ heteroaryl group;

a $C_1$-$C_{20}$ alkyl group and a $C_1$-$C_{20}$ alkoxy group, each substituted with one or more of a deuterium atom or a halogen atom; and a $C_6$-$C_{40}$ aryl group and a $C_2$-$C_{40}$ heteroaryl group, each substituted with one or more of a deuterium atom, a halogen atom, a $C_1$-$C_{20}$ alkyl group, a $C_1$-$C_{20}$ alkoxy group, a $C_6$-$C_{20}$ aryl group, or a $C_2$-$C_{20}$ heteroaryl group;

p1 is an integer selected from 1 to 5, p2 is an integer selected from 1 to 4, p3 is an integer selected from 1 to 3, p4 is an integer selected from 1 to 2, p5 is an integer selected from 1 to 6, p6 is an integer selected from 1 to 5, and

* indicates a binding site.

11. The organic light-emitting device as claimed in claim 10, wherein
$Z_{11}$ to $Z_{16}$ are each independently selected from groups represented by Formulae 5A to 5D:

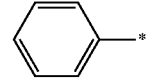
<5A>

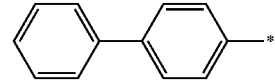
<5B>

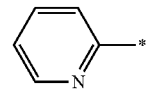
<5C>

-continued

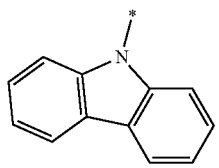
<5D> wherein in Formulae 5A to 5D, * indicates a binding site.

12. The organic light-emitting device as claimed in claim 1, wherein
R₁ to R₃₀ are each independently selected from groups represented by Formulae 6A to 6L below:

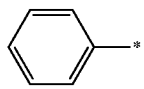
<6A>

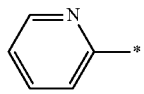
<6B>

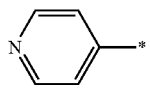
<6C>

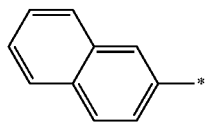
<6D>

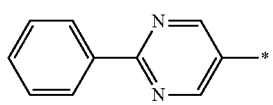
<6E>

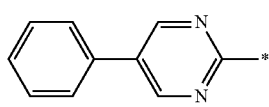
<6F>

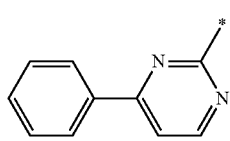
<6G>

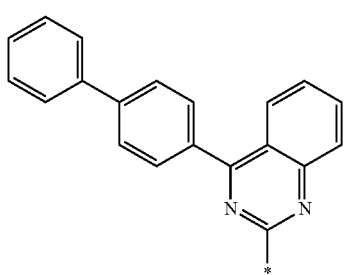
<6H>

-continued

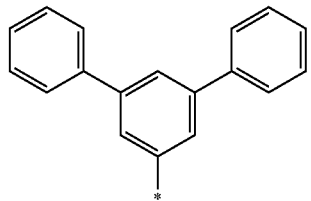
<6I>

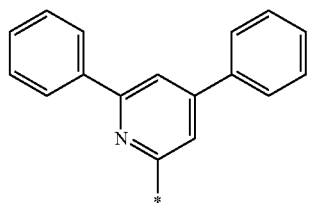
<6J>

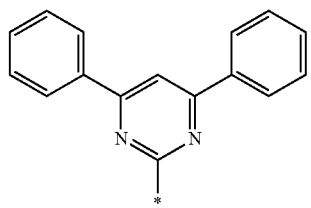
<6K>

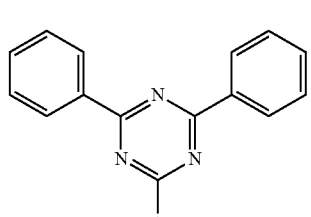
<6L>

13. The organic light-emitting device as claimed in claim 1, wherein
R₁ to R₁₀, R₁₂ to R₁₇, R₁₉ to R₂₁, R₂₄ to R₂₇, and R₃₀ are each independently selected from groups represented by Formulae 6A to 6L below:

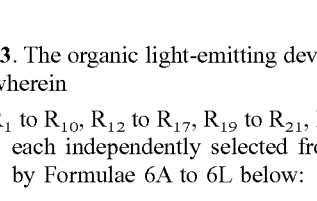
<6A>

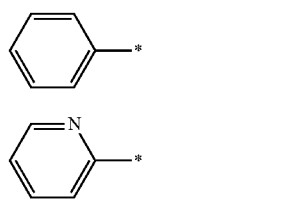
<6B>

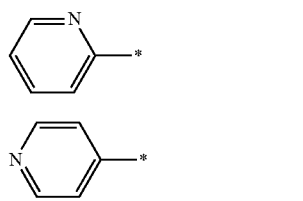
<6C>

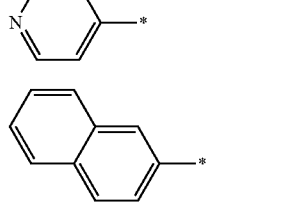
<6D>

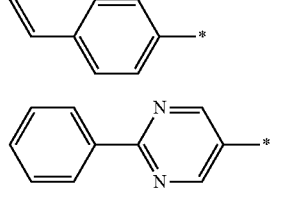
<6E>

<6F>
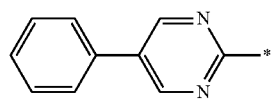
<6G>
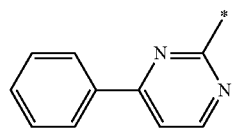
<6H>
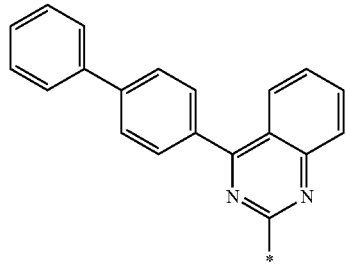
<6I>
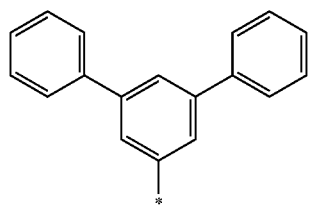
<6J>
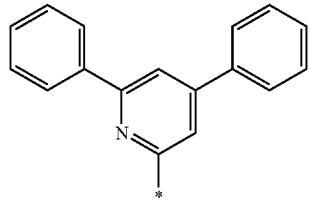
<6K>
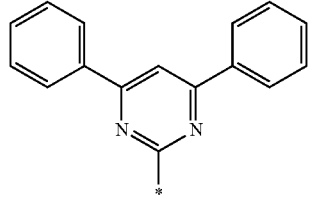
<6L>
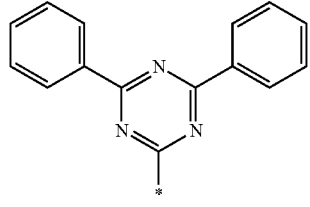
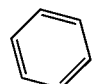
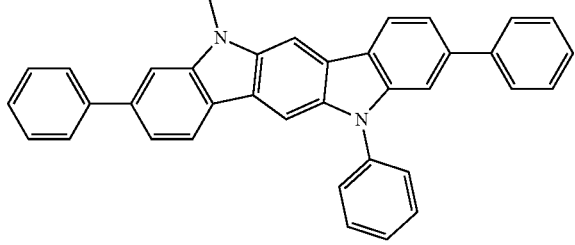
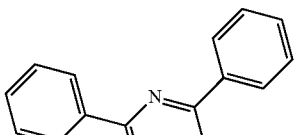
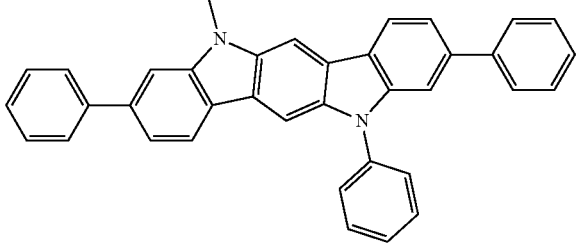
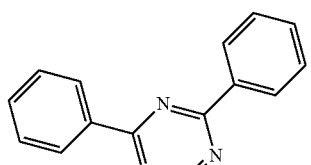
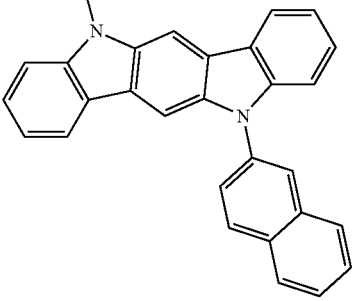
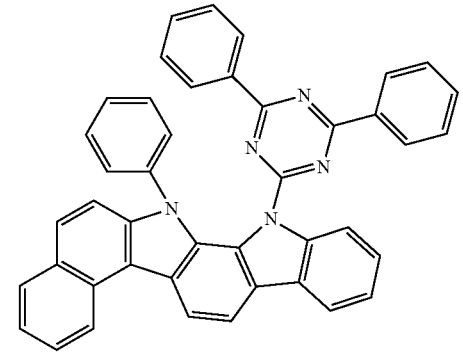
14. The organic light-emitting device as claimed in claim 1, wherein
the compound represented by Formula 1 includes one or more of the compounds below:

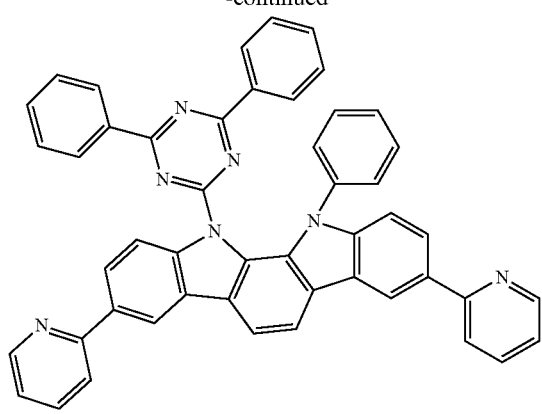
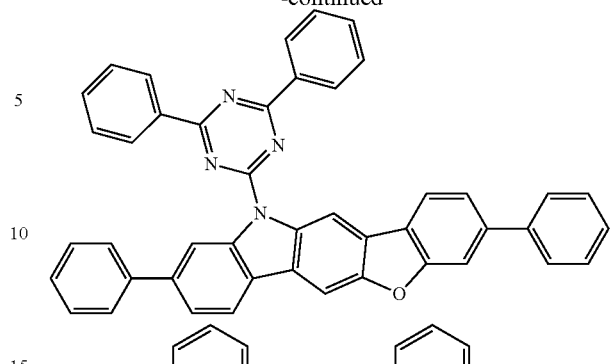
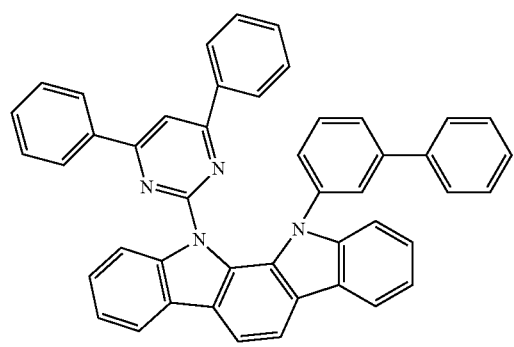
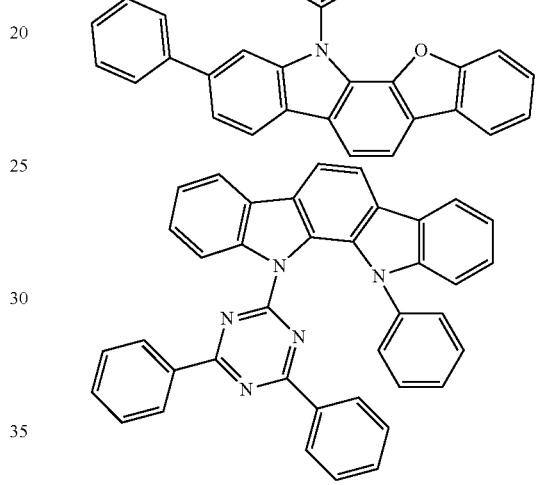
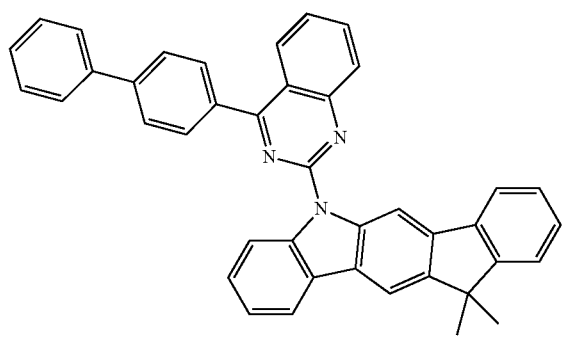
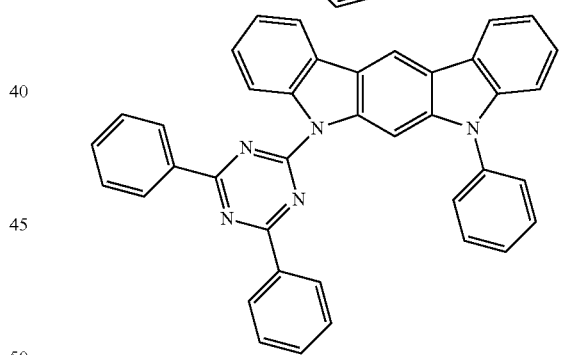
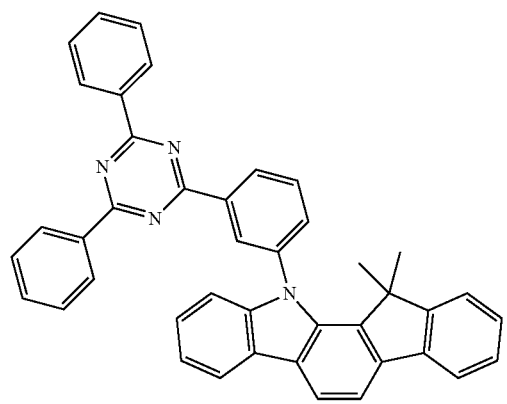
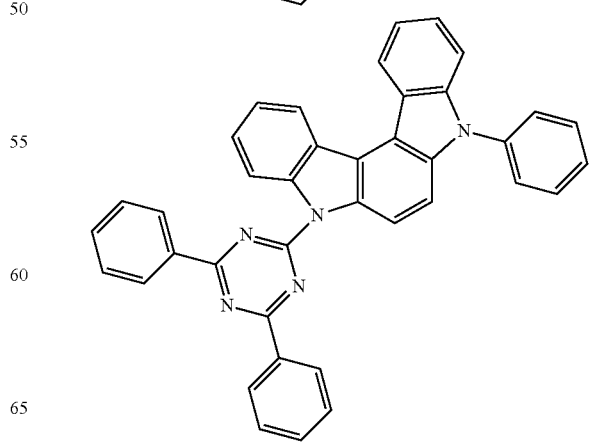

107
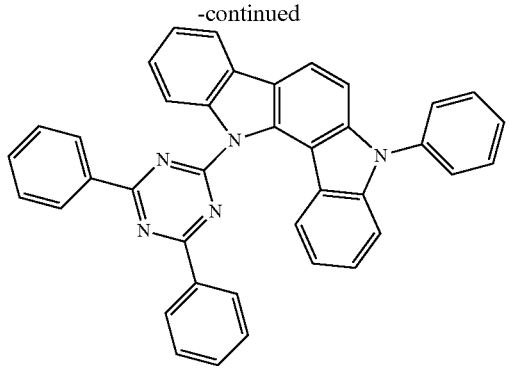
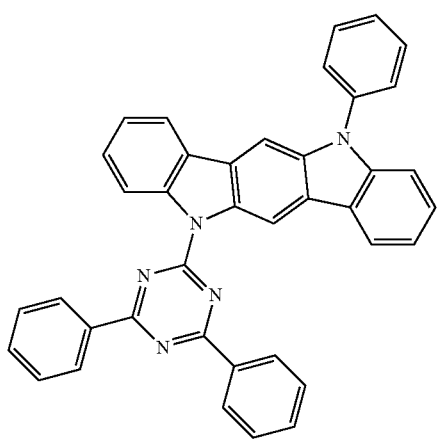
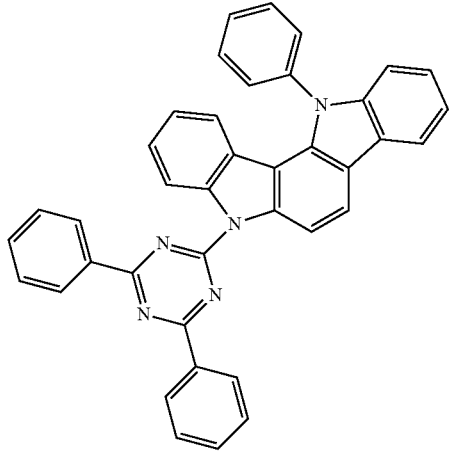
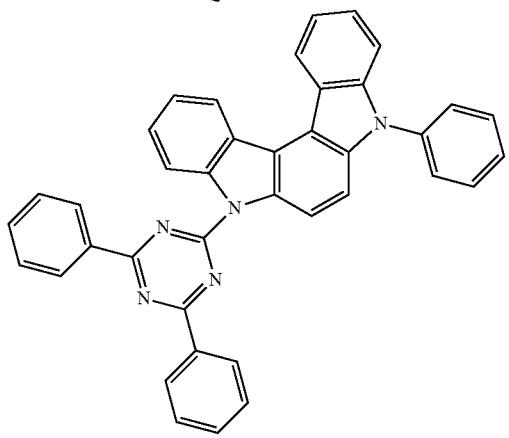
108
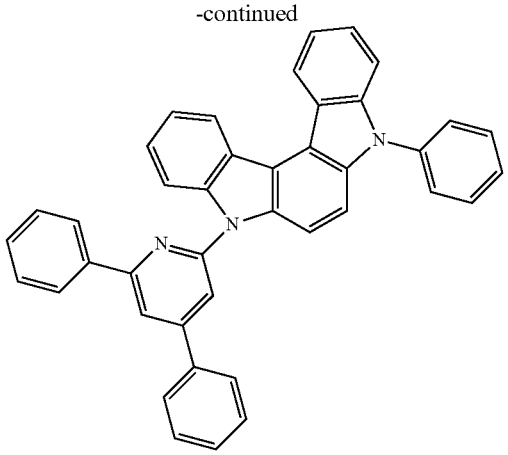
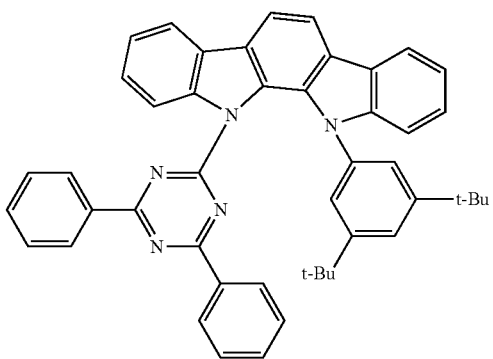
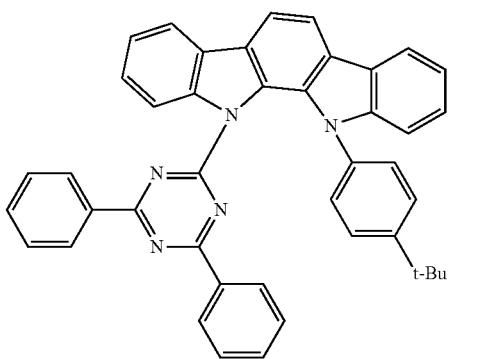
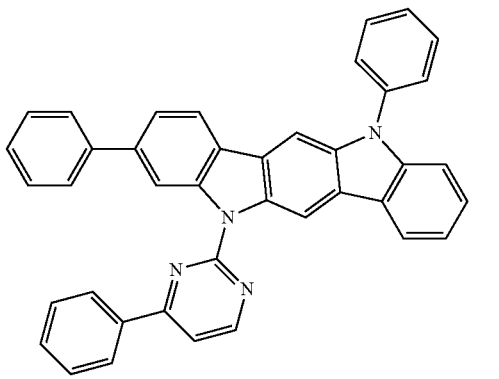

-continued
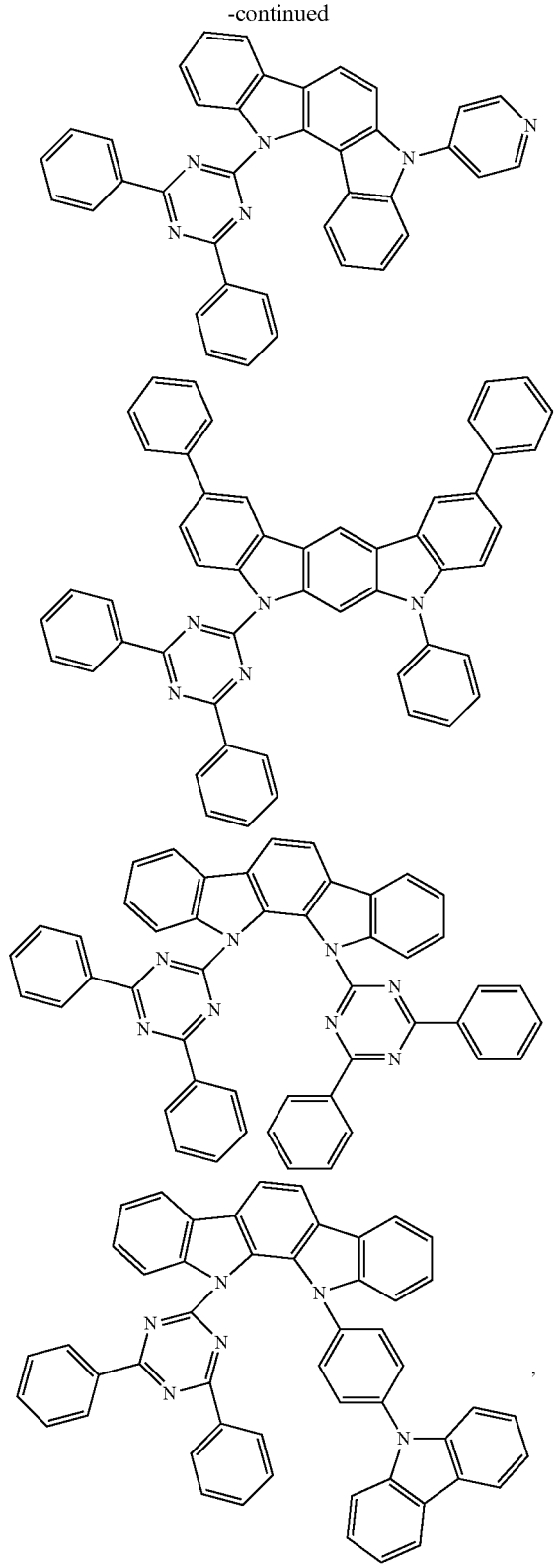
and
the compound represented by Formula 2 includes one or more of the compounds below:
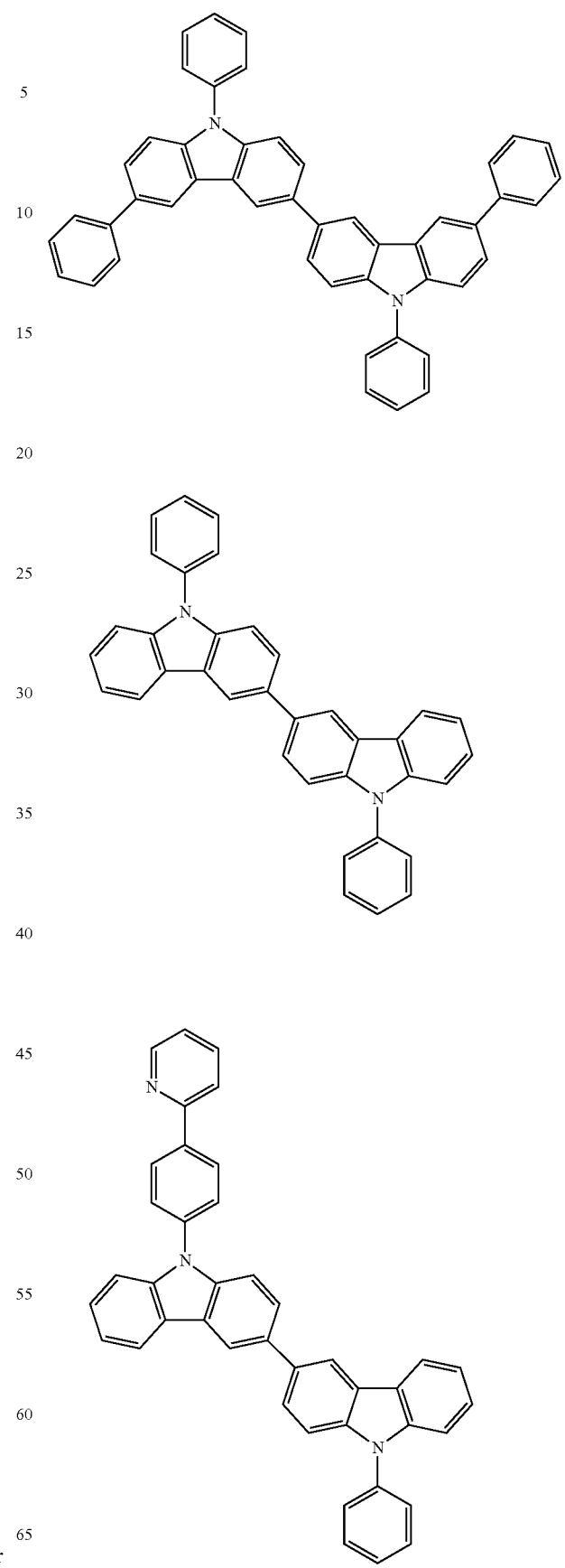

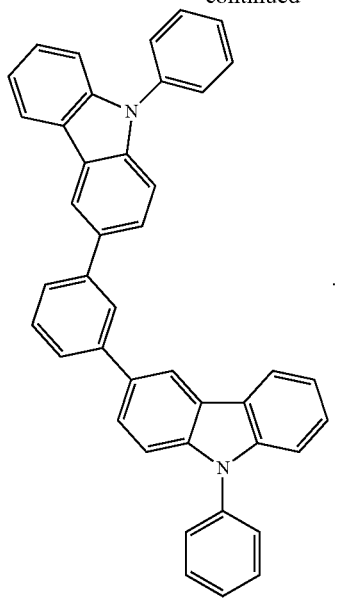

15. The organic light-emitting device as claimed in claim 3, wherein
the hole transport layer includes compounds represented by Formulae 201A-1 and 202A below.

<Formula 201A-1>

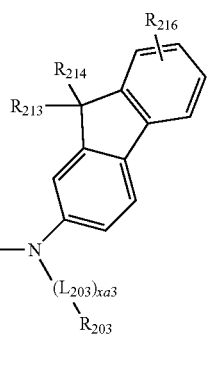

<Formula 202A>

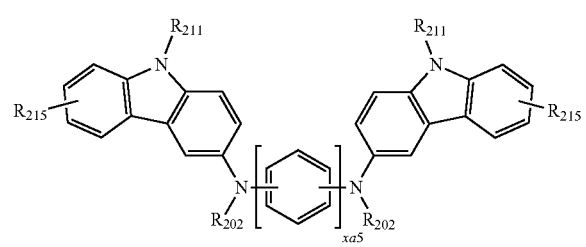

wherein in Formulae 201A-1 and 202A, $L_{203}$ is selected from a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_3$-$C_{10}$ heterocycloalkenylene group, a substituted or unsubstituted $C_6$-$C_{40}$ arylene group, a substituted or unsubstituted $C_2$-$C_{40}$ heteroarylene group, and a substituted or unsubstituted divalent $C_6$-$C_{40}$ non-aromatic condensed polycyclic group, xa3 is selected from 0, 1, 2, and 3, and xa5 is selected from 1, 2, 3, 4, and 5, $R_{202}$ to $R_{204}$, $R_{211}$, and $R_{212}$ are each independently selected from a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_2$-$C_{60}$ heteroaryl group, and a substituted or unsubstituted monovalent $C_6$-$C_{30}$ non-aromatic condensed polycyclic group, and $R_{213}$ to $R_{216}$ are each independently selected from a hydrogen, a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a $C_6$-$C_{60}$ non-aromatic condensed polycyclic group.

16. The organic light-emitting device as claimed in claim 15, wherein
the compound represented by Formula 201A-1 includes one or more of Compounds 309 to 311, and the compound represented by Formula 202A includes one or more of Compounds 301 to 308:

309

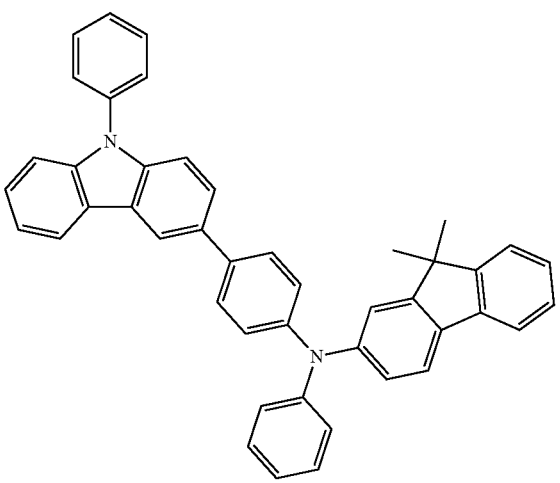

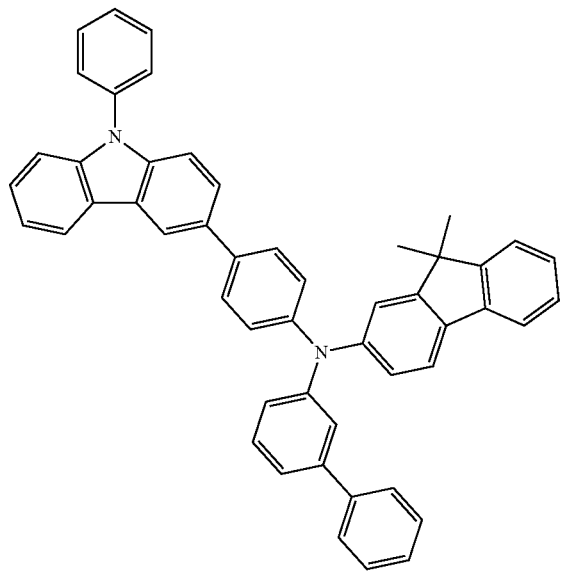
310
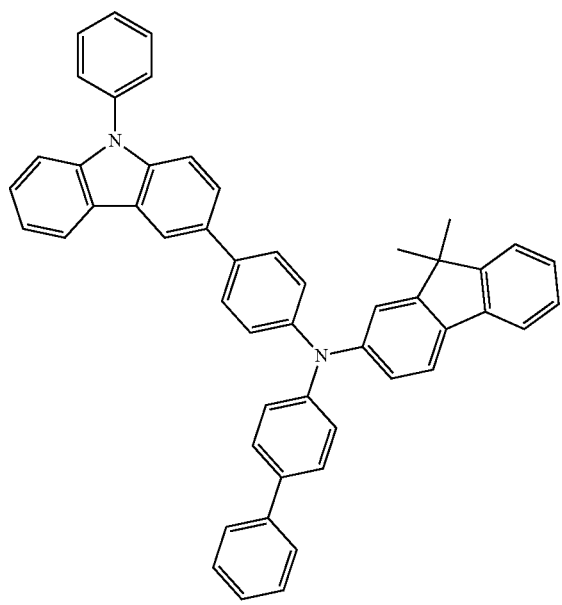
311
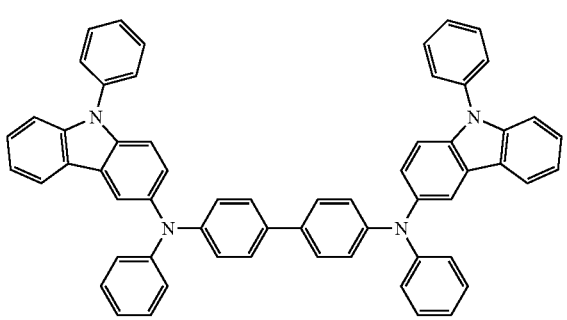
301
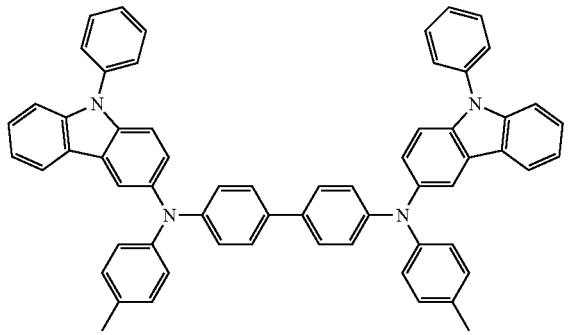
302
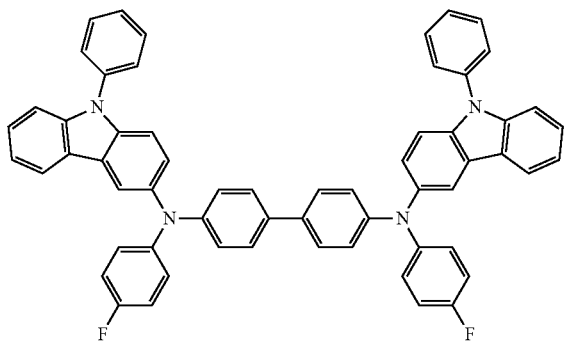
303
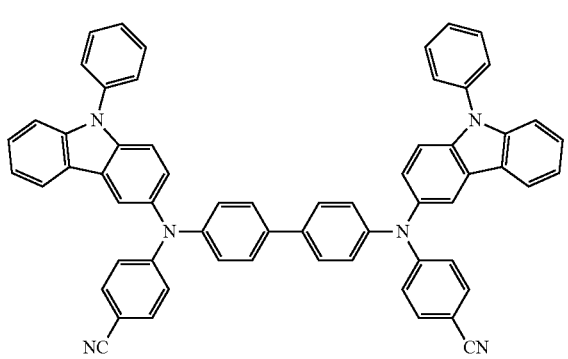
304
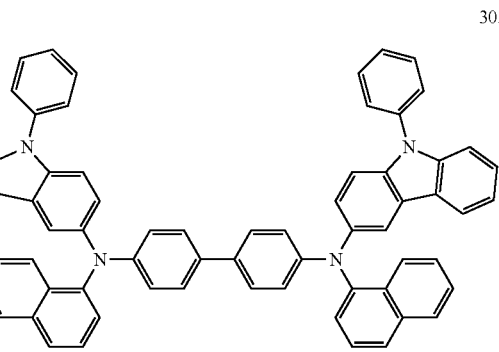
305

306

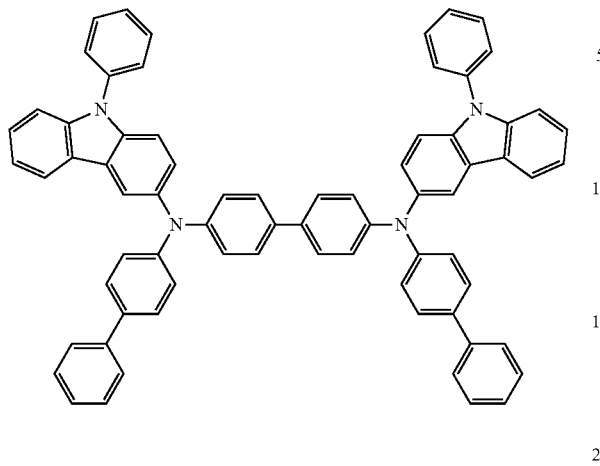

307

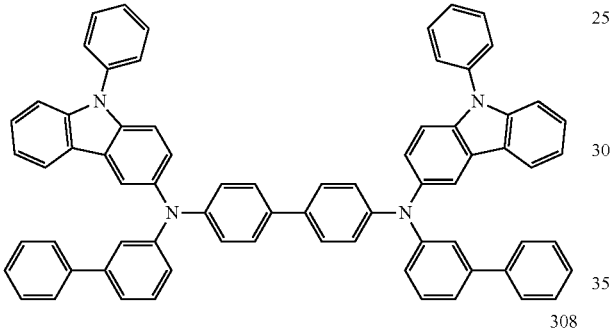

308

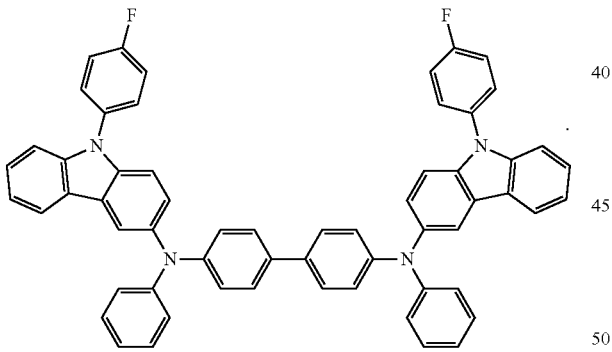

17. An organic light-emitting device, comprising:
a first electrode;
a second electrode facing the first electrode;
an emission layer between the first electrode and the second electrode;
a hole transport region that is between the first electrode and the emission layer and includes one or more of a hole injection layer or a hole transport layer, and includes an auxiliary layer; and
an electron transport region that is between the second electrode and the emission layer, and includes one or more of an electron transport layer or an electron injection layer;

the auxiliary layer including a compound represented by one of Formulae 1-1 to 1-11 below and a compound represented by Formula 2-1 below:

<Formula 1-1>

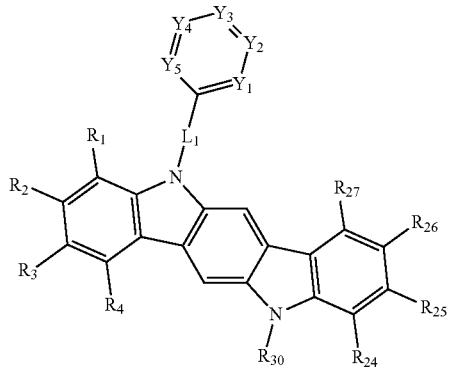

<Formula 1-2>

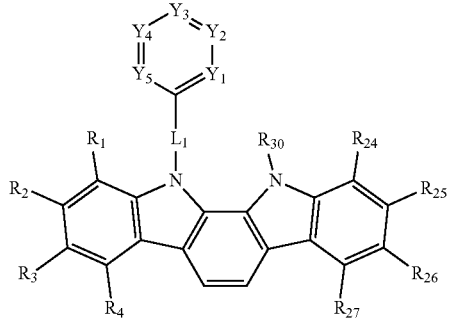

<Formula 1-3>

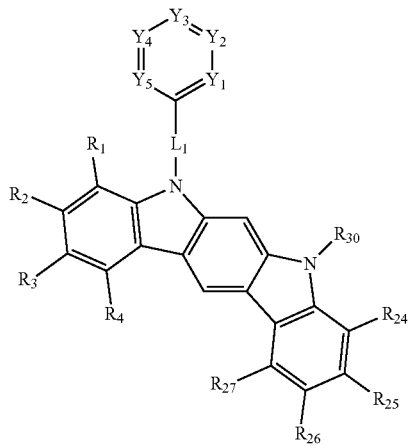

<Formula 1-4>
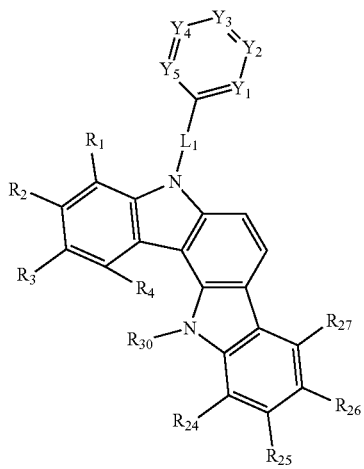
<Formula 1-5>
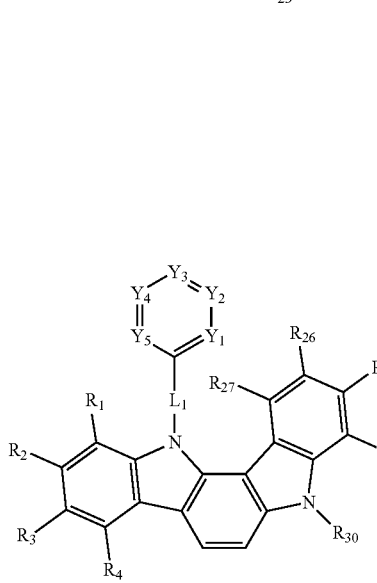
<Formula 1-6>
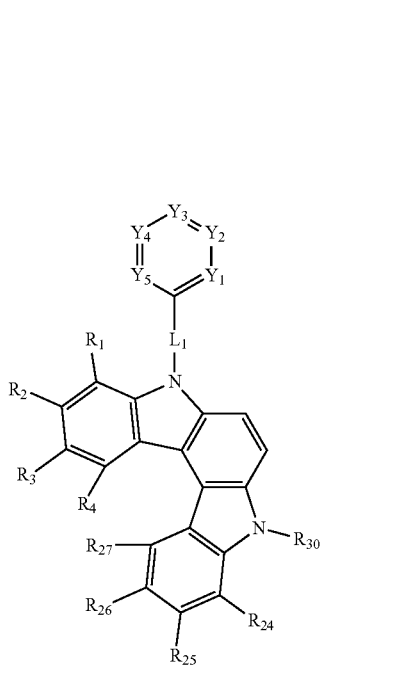
<Formula 1-7>
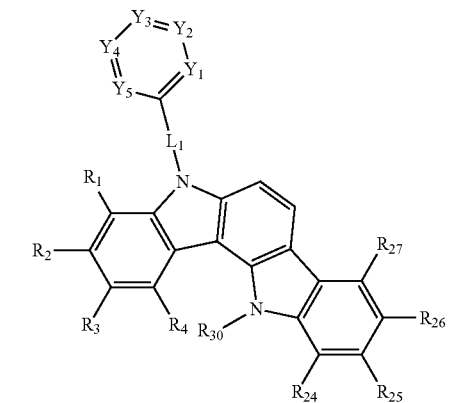
<Formula 1-8>
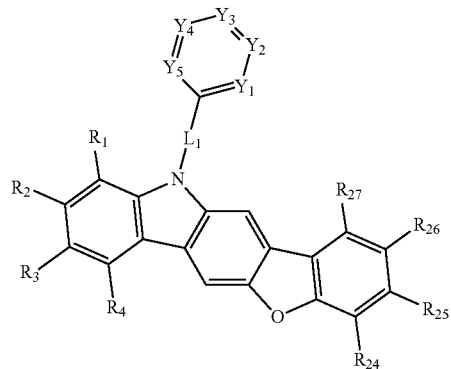
<Formula 1-9>
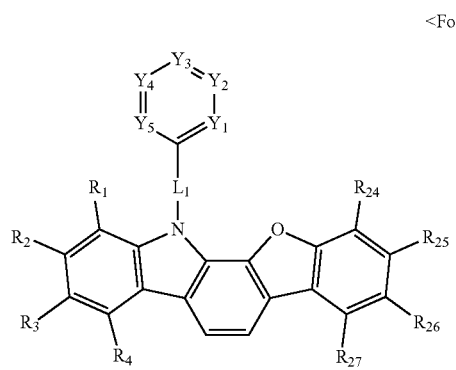
<Formula 1-10>
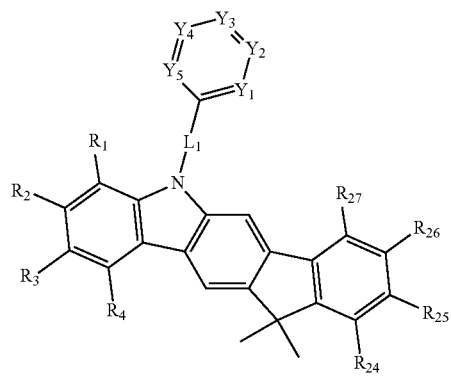

<Formula 1-11>

<Formula 2-1> wherein in Formulae 1-1 to 1-11 and 2-1, $Y_1$ to $Y_5$ are each independently a nitrogen (N) atom or $-CR_{21}$, and each $R_{21}$ is the same or different from each other;

$L_1$ and $L_2$ are selected from a direct bond and a $C_6$-$C_{40}$ arylene group;

$R_1$ to $R_{10}$, $R_{12}$ to $R_{17}$, $R_{19}$ to $R_{21}$, $R_{24}$ to $R_{27}$, and $R_{30}$ are each independently selected from a hydrogen, a $C_6$-$C_{40}$ aryl group, and a $C_2$-$C_{40}$ heteroaryl group; and a $C_6$-$C_{40}$ aryl group and a $C_2$-$C_{40}$ heteroaryl group, each substituted with one or more of a $C_1$-$C_{20}$ alkyl group, a $C_6$-$C_{40}$ aryl group, or a $C_2$-$C_{40}$ heteroaryl group.

18. The organic light-emitting device as claimed in claim 17, wherein $L_1$ and $L_2$ are each independently selected from a direct bond and groups represented by Formulae 3A and 3B:

<3A>

<3B> wherein * indicates a binding site.

19. The organic light-emitting device as claimed in claim 17, wherein $R_1$ to $R_{10}$, $R_{12}$ to $R_{17}$, $R_{19}$ to $R_{21}$, $R_{24}$ to $R_{27}$, and $R_{30}$ are each independently selected from a hydrogen atom and groups represented by Formulae 4A to 4F below:

<4A>

<4B>

<4C>

<4D>

<4E>

<4F>

$Z_{11}$ to $Z_{16}$ are each independently selected from a $C_1$-$C_m$ alkyl group, a $C_6$-$C_{40}$ aryl group, and a $C_2$-$C_{40}$ heteroaryl group;

p1 is an integer selected from 1 to 5, p2 is an integer selected from 1 to 4, p3 is an integer selected from 1 to 3, p4 is an integer selected from 1 to 2, p5 is an integer selected from 1 to 6, p6 is an integer selected from 1 to 5, and

* indicates a binding site.

20. The organic light-emitting device as claimed in claim 19, wherein $Z_{11}$ to $Z_{16}$ are each independently selected from a t-butyl group and groups represented by Formulae 5A to 5D below:

<5A>

<5B>

<5C>

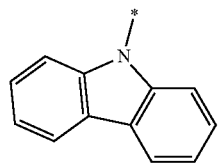
<5D>
wherein in Formulae 5A to 5D, * indicates a binding site.